(12) United States Patent
Flake et al.

(10) Patent No.: US 8,093,911 B2
(45) Date of Patent: Jan. 10, 2012

(54) TIME-OF-FLIGHT MEASUREMENT BASED ON TRANSFER FUNCTION AND SIMULATED EXPONENTIAL STIMULUS

(75) Inventors: Robert H. Flake, Austin, TX (US); John F. Biskup, Ridgecrest, CA (US); Su-liang Liao, Taipei (TW)

(73) Assignee: Board of Regents, The University of Texas, Austin, TX (US)

( * ) Notice: Subject to any disclaimer, the term of this patent is extended or adjusted under 35 U.S.C. 154(b) by 0 days.

(21) Appl. No.: 12/912,392

(22) Filed: Oct. 26, 2010

(65) Prior Publication Data

US 2011/0035170 A1    Feb. 10, 2011

Related U.S. Application Data

(60) Division of application No. 12/055,983, filed on Mar. 26, 2008, now Pat. No. 7,859,271, which is a continuation of application No. 11/010,198, filed on Dec. 10, 2004, now Pat. No. 7,375,602, which is a continuation-in-part of application No. 10/224,541, filed on Aug. 20, 2002, now Pat. No. 6,847,267, which is a continuation-in-part of application No. 09/519,922, filed on Mar. 7, 2000, now Pat. No. 6,441,695.

(51) Int. Cl.
*G01R 27/04* (2006.01)
*G01R 27/28* (2006.01)
(52) U.S. Cl. .......................... 324/637; 324/617; 324/618
(58) Field of Classification Search .................. 324/637, 324/617, 618
See application file for complete search history.

(56) References Cited

U.S. PATENT DOCUMENTS

| 3,668,415 A | 6/1972 | Marilleau |
| 4,176,285 A | 11/1979 | Norris |
| 4,559,602 A | 12/1985 | Bates, Jr. |
| 4,566,084 A | 1/1986 | Laine |

(Continued)

FOREIGN PATENT DOCUMENTS

GB    1455712    11/1976

OTHER PUBLICATIONS

Brillouin, "Wave Propagation and Group Velocity," New York, New York: Academic Press Inc, pp. 96, 1960.

(Continued)

*Primary Examiner* — Jeff Natalini
(74) *Attorney, Agent, or Firm* — Meyertons Hood Kivlin Kowert & Goetzel, P.C.; Jeffrey C. Hood; Mark K. Brightwell

(57) ABSTRACT

Systems and methods are described for transmitting a waveform having a controllable attenuation and propagation velocity. An exemplary method comprises: generating an exponential waveform, the exponential waveform (a) being characterized by the equation $V_{in}=De^{-A_{SD}[x-v_{SD}t]}$, where D is a magnitude, $V_{in}$ is a voltage, t is time, $A_{SD}$ is an attenuation coefficient, and $v_{SD}$ is a propagation velocity; and (b) being truncated at a maximum value. An exemplary apparatus comprises: an exponential waveform generator; an input recorder coupled to an output of the exponential waveform generator; a transmission line under test coupled to the output of the exponential waveform generator; an output recorder coupled to the transmission line under test; an additional transmission line coupled to the transmission line under test; and a termination impedance coupled to the additional transmission line and to a ground.

39 Claims, 57 Drawing Sheets

U.S. PATENT DOCUMENTS

| | | | |
|---|---|---|---|
| 4,630,938 | A | 12/1986 | Piorkowska-Palczewska et al. |
| 4,766,386 | A | 8/1988 | Oliver et al. |
| 5,051,595 | A | 9/1991 | Kern et al. |
| 5,142,224 | A * | 8/1992 | Smith et al. ............... 324/754.23 |
| 5,142,861 | A | 9/1992 | Schlicher et al. |
| 5,209,221 | A | 5/1993 | Riedlinger |
| 5,307,284 | A * | 4/1994 | Brunfeldt et al. ................ 702/76 |
| 5,319,311 | A | 6/1994 | Kawashima et al. |
| 5,321,632 | A | 6/1994 | Otsuji et al. |
| 5,452,222 | A | 9/1995 | Gray et al. |
| 5,461,318 | A | 10/1995 | Borchert et al. |
| 5,512,834 | A | 4/1996 | McEwan |
| 5,641,318 | A | 6/1997 | Vetter |
| 5,650,728 | A | 7/1997 | Rhein et al. |
| 5,677,633 | A | 10/1997 | Moser et al. |
| 5,686,872 | A | 11/1997 | Fried et al. |
| 5,713,665 | A | 2/1998 | Kato et al. |
| 5,726,951 | A | 3/1998 | Birchak et al. |
| 5,857,001 | A | 1/1999 | Preuss et al. |
| 5,877,997 | A | 3/1999 | Fell |
| 6,005,395 | A | 12/1999 | Chan et al. |
| 6,097,755 | A | 8/2000 | Guenther, Jr. et al. |
| 6,137,293 | A | 10/2000 | Wu et al. |
| 6,441,695 | B1 | 8/2002 | Flake |
| 6,531,879 | B1 | 3/2003 | Nero, Jr. |
| 6,614,323 | B2 | 9/2003 | Wagh et al. |
| 6,811,307 | B2 * | 11/2004 | Crowe et al. ................... 374/131 |
| 6,816,242 | B2 | 11/2004 | Qian et al. |
| 6,847,267 | B2 | 1/2005 | Flake et al. |
| 7,200,434 | B2 | 4/2007 | Havel et al. |
| 2003/0020898 | A1 | 1/2003 | Wyar |
| 2007/0204686 | A1 | 9/2007 | Solis |
| 2010/0190456 | A1 * | 7/2010 | Asplund et al. ............... 455/106 |

OTHER PUBLICATIONS

Davidson et al., "Long lossy lines (L.sup.3) and their impact upon large chip performance," IEEE Trans Comp Packag Manufact Technol, 20(4), 1997.

Deutsch et al., "High-speed signal propagation on lossy transmission lines," IBM J Res Develop, 34:601-615, 1990.

Flake et al. "Advances in test technology for high-performance system interconnects," 12.sup.th International Conference, Mixdes 2005, Krakow, Poland Jun. 22-25, 2005.

Flake et al., "Part II (Experiments) signal propagation without distortion on lossy transmission lines having frequency dependent parameters," Proceedings of the 9.sup.th IEEE workshop on signal propagation on interconnects, pp. 51-54, May 10-13, 2005 Garmish-Partenkirchen, Germany.

Flake and Biskup, In: Signal Propagation without Distortion in Dispersive Lossy Media, 11.sup.th IEEE Intl. Conf. Electronics, Circuits and System Proceed., Israel, 2004.

Flake, "Part I (Theory) signal propagation without distortion on lossy transmission lines having frequency dependent parameters," Proceedings of the 9.sup.th IEEE workshop on signal propagation on interconnects, pp. 43-45, May 10-13, 2005 Garmish-Partenkirchen, Germany.

Groudis and Chang, "Coupled lossy transmission line characterization and simulation," IBM J Res Develop, 25:25-41, 1981.

Ismail and Friedmann, "Repeater insertion in tree structured inductive interconnect," IEEE Trans Circuits Syst II, 48:471-481, 2001.

Johns and Martin, "Analog integrated circuit design," In: Analog Integrated Circuit Design, Wiley & Sons, Inc., NY, 317-326, 1997.

Kalluri, In: Electromagnetics of Complex Media, CRC Press, pp. 3-4, 1998.

Pozar, "Microwave engineering," Addison-Wesley, pp. 67-70 and 126-128, 1990.

Proakis, In: Digital Communications, WCB McGraw-Hill, 3.sup.rd Ed., Boston, pp. 167-173, 1995.

Ramo et al. In: Fields and Waves in Modern Radio, John Wiley & Sons, Inc., 2.sup.nd Ed., New York, pp. 23-26, 272-273, 1953.

Razavi and Wooley, "Design techniques for high-speed, high-resolution comparators," IEEE J Solid-state Circuits, 27:1916-1992, 1992.

Sauter, In: Nonlinear Optics, John Wiley & Sons Inc., NY, p. 127, 1996.

Sommerfeld, In: Mechanics of Deformable Bodies Lectures on Theoretical Physics, Academic Press, Inc., NY, vol. II:96-98, 1950.

Szabo and Ostlund, "Introduction to advanced electronic structure theory," In: Modern Quantum Chemistry, Dover Pub, Inc., Mineola, pp. 142-145, 1989.

Weber, In: Linear Transient Analysis, Wiley, NY, vol. II:273, 1954.

Wheeler and Crummett, "The vibrating string controversy," AM J Phys, 55(1):33-37, 1987.

Robert Flake and John Biskup; "Part II (Experiments) Signal Propagation without Distortion on Lossy Transmission Lines Having Frequency Dependent Parameters", Proceedings of the 9th IEEE Workshop on Signal Propagation on Interconnects, May 2005, 4 pages.

S.J. Wang, I. Lopez, S.L. Liao, and Robert H. Flake; "Advances in Test Technology for Metal Cables"; Central Texas IEEE Communication/Signal Processing Society, May 19, 2005; 44 pages.

Eric Bogatin; "Exponentially Increasing Waveforms' Special Property"; PCBDesign007; Aug. 5, 2009; 2 pages.

U.S. Appl. No. 60/773,546, entitled "Time Domain Reflectometry Method for Well Depth Calculation", by Vladimir Hernandez Solis, filed on Feb. 15, 2006; 14 pages.

Hiroshi Naruse and Mitsuhiro Tateda; "Optimum Temporal Pulse Shape of Launched Light for Optical Time Domain Reflectometry Type Sensors Using Brillouin Backscattering", Optical Review vol. 8, No. 2, Mar. 2001, pp. 126-132.

Alexandre Fellay; "Extreme Temperature Sensing Using Brillouin Scattering in Optical Fibers", Doctoral Thesis; Ecole Polytechnique Fédérale de Lausanne, 2003, 184 pages.

Kipp Schoen; "High Resolution TDR Measurements Using the PSPL Model 4020 and Model 4022 9 ps TDR Source Enhancement Modules" by Kipp Schoen of Picosecond Pulse Labs (PSPL), Boulder CO, May 2004; 7 pages.

Tim J. Sobering; "Bandwidth and Risetime"; SDE Consulting, May 1999; 4 pages.

* cited by examiner

FIG. 71A
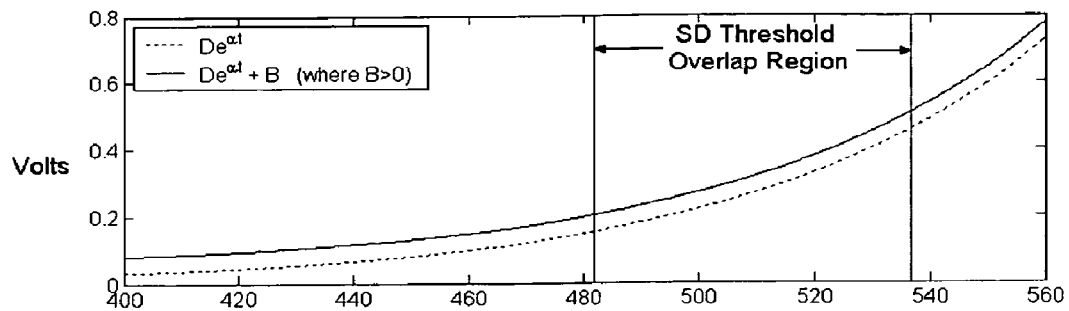
FIG. 71B
FIG. 72A
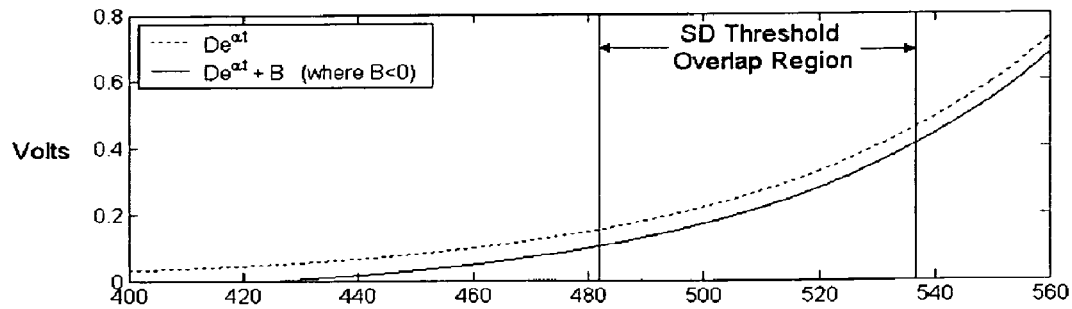
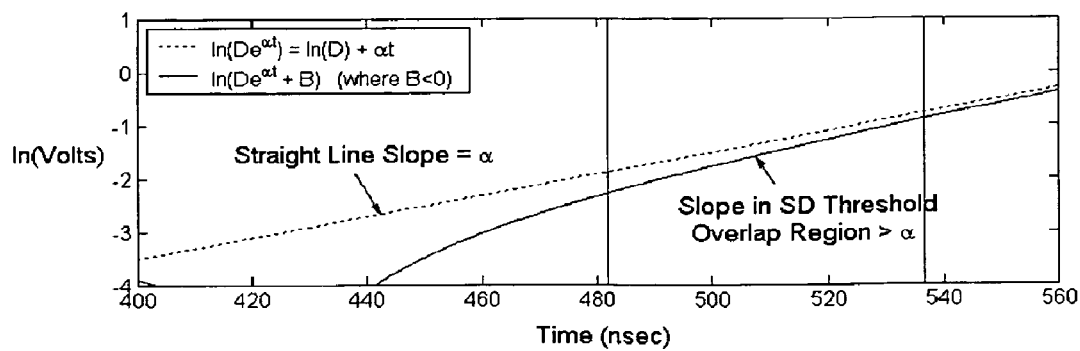
FIG. 72B

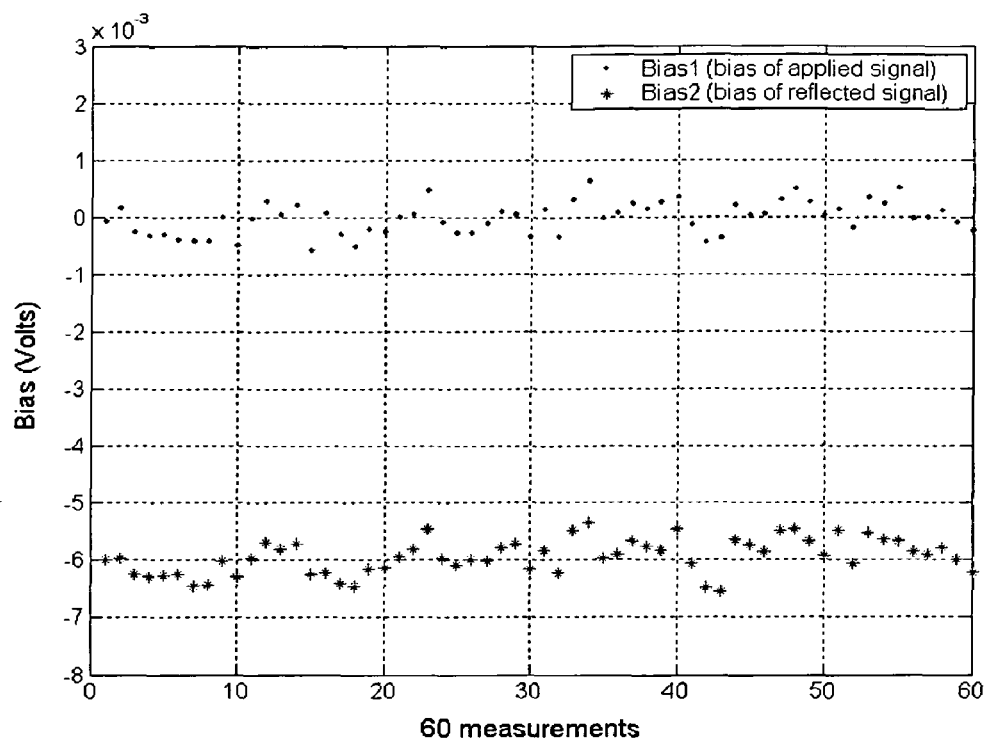
FIG. 73
FIG. 74A
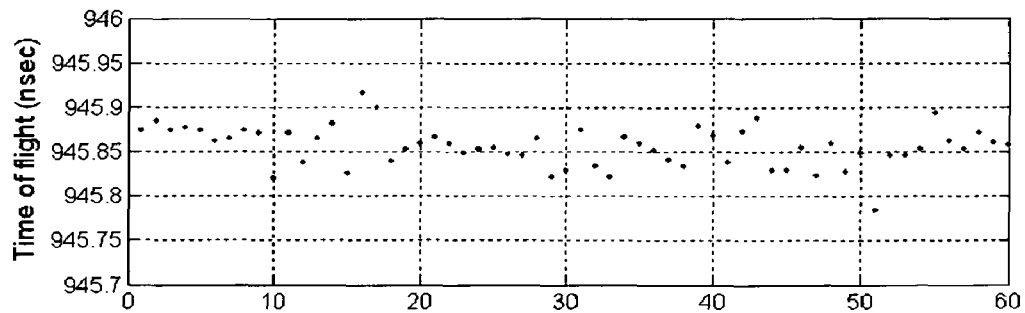
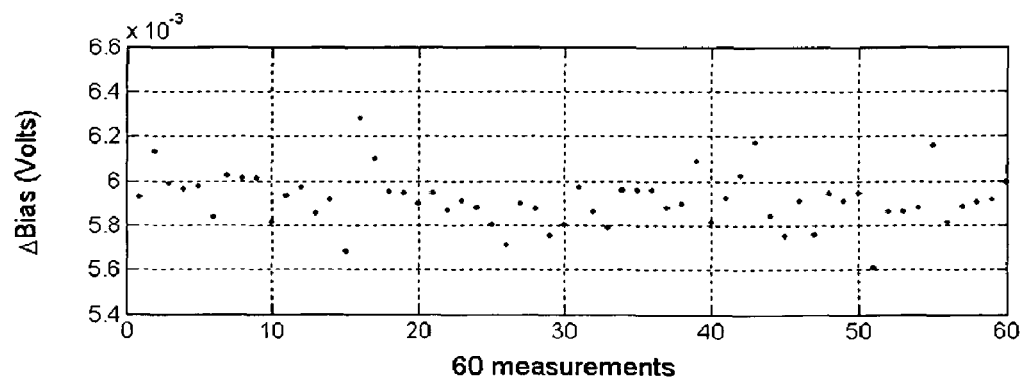
FIG. 74B

TIME-OF-FLIGHT MEASUREMENT BASED ON TRANSFER FUNCTION AND SIMULATED EXPONENTIAL STIMULUS

CROSS-REFERENCES TO RELATED APPLICATIONS

This application is a divisional of U.S. patent application Ser. No. 12/055,983, filed on Mar. 26, 2008 now U.S. Pat. No. 7,859,271, which is continuation of U.S. patent application Ser. No. 11/010,198, filed on Dec. 10, 2004, now U.S. Pat. No. 7,375,602, which is a continuation-in-part of U.S. patent application Ser. No. 10/224,541 filed Aug. 20, 2002, now U.S. Pat. No. 6,847,267, which is a continuation-in-part of U.S. patent application Ser. No. 09/519,922, filed Mar. 7, 2000, now U.S. Pat. No. 6,441,695. Each of the above related applications is hereby incorporated by reference in its entirety.

BACKGROUND OF THE INVENTION

1. Field of the Invention

The invention relates generally to the field of signal transmission. More particularly, a representative embodiment of the invention relates to transmission line testing and communication.

2. Discussion of the Related Art

Transmission lines, with their characteristic loss of signal as well as inherent time delay, may create problems in designing systems that employ a plurality of signals, which may be subject to delay and distortion. Typical signals used to generate inputs to transmission lines generally exhibit delay or propagation times that are not easily determinable. The propagation velocity of these waves is also variable with displacement along the transmission line.

A Time Domain Reflectometer (TDR) is a test instrument used to find faults in transmission lines and to empirically estimate transmission line lengths and other parameters characterizing the line, such as: inductance per unit length, capacitance per unit length, resistance per unit length and conductance per unit length.

An important measurement in TDR test technology is the time-of-flight (TOF) of a test pulse generated by the instrument and applied to the line. The time-of-flight may be measured by timing the passage of the pulse detected at two locations along the line. Along with a value of the propagation speed of the pulse, time-of-flight measurements can allow one to obtain the distance between measurement points or, in the case of a reflected wave, the distance from the pulse launch point to the location of the impedance change causing the pulse to be reflected and returned.

A fundamental limitation in TDR technology is the poor accuracy of TOF measurements in lossy, dispersive transmission lines. The relatively high TDR accuracy of TOF values obtainable in short low loss, low dispersion transmissions lines is possible only because the propagating test pulses keep their shape and amplitude in tact over the distances they travel during TOF measurements. By contrast, in dispersive, lossy long transmission lines the test pulses used in the art change shape, amplitude, and speed as they travel.

Further, it is difficult to provide high-speed communications in a lossy, frequency dependent transmission media. It would be advantageous to have a method to increase data transmission rates in such transmission lines.

Until now, the requirements of providing a method and/or apparatus for accurately measuring times-of-flight, estimating line lengths and other parameters characterizing lossy, dispersive transmission lines, and providing high-speed communications via such transmission media have not been met. What is needed is a solution that addresses these requirements.

SUMMARY OF THE INVENTION

Shortcomings are reduced or eliminated by the techniques disclosed here. In one respect, the disclosure involves a method for transmitting an exponential waveform. The exponential waveform, which can be characterized by the equation $V_{SD}=De^{-A_{SD}[x-v_{SD}t]}$ and can be truncated at a maximum value and can have an essentially constant shape during transmission on a transmission line.

In another respect, the disclosure involves transmitting a waveform including a speedy delivery signal envelope modulated with a sinusoidal signal on a media. The waveform can be characterize by the equation $V(z,s)=B(s)e^{-z\gamma(s)}$ and having a substantially constant shape during transmission on the media. In some embodiments, an exponential waveform can include a truncated speedy delivery signal envelope modulated with a sinusoidal carrier signal, in which the media can be a resistance-capacitance-inductance transmission line. In other embodiments, an electromagnetic plane waveform can include a truncated speedy delivery signal envelope modulated with a sinusoidal electromagnetic plane wave on a media, such as a dispersive plasma media.

In other respects, the disclosure involves a method for determining a temperature of a media. The method includes generating an exponential waveform on the media and determining the delay of the exponential waveform. The delay can be characterized by the equation $$\delta_{SD} = \left(\frac{1}{\alpha}\right) \cdot \sqrt{\frac{\overline{L}(\alpha, T)\overline{C}(\alpha, T)\alpha^2 + (\overline{G}(\alpha, T)\overline{L}(\alpha, T) + }{\overline{R}(\alpha, T)\overline{C}(\alpha, T))\alpha + \overline{R}(\alpha, T)\overline{G}(\alpha, T)}}$$

where the temperature is proportional to the length of travel of the exponential waveform on the media.

In another respect, a method is provided for measuring a temperature of a media. The method includes generating a speedy delivery (SD) signal on a media and determining the delay of the SD signal characterized by the equation $\Delta_{SD}=1(T)\cdot\sqrt{L(T)C(T)}\cdot\sqrt{1+\tau/(L(T)/R(T))}$. The method also includes determining the temperature of the media which can be proportional to the delay.

In yet another respect, the disclosure involves a method for reducing interconnect delays. A signal is generated on an interconnect and the delay of the signal can be characterized by a line model and the equation $\delta_{SD}=\sqrt{LC}\sqrt{1+\tau/(L/R)}$. In one embodiment, the method includes reducing the delay by decreasing $\tau$. In another embodiment, the method includes inserting a repeater on the interconnect.

In other respects, the disclosure involves a method including steps for generating an exponential waveform having an essentially constant shape during transmission on a media at a first location. A plurality of exponentials can be encoded on a leading edge of the exponential waveform, where the encoded exponential waveform is transmitted to a second location. The method also includes decoding the encoded exponential waveform at the second location.

The disclosure also involves a method for determining a length of an interconnect for a desired delay. A signal can be generated and a length of the interconnect can be characterized by the equation $$l = \frac{\Delta_{SD}}{\sqrt{LC} \cdot \sqrt{1 + \frac{\tau}{\frac{L}{R}}}},$$

where L is the inductance per unit length of the interconnect, R resistance per unit length of the interconnect, C is the capacitance per unit length of the interconnect, and $\Delta_{SD}$ is the desired delay.

A thermometer is also presented. The thermometer includes a signal generator configured to generate a truncated exponential waveform characterized by the equation $V_{SD} = De^{-A_{SD}[x - v_{SD}t]}$, where D is a magnitude, $V_{SD}$ is a voltage, t is time, $A_{SD}$ is an attenuation coefficient, $v_{SD}$ is a propagation velocity, and t is time. The thermometer also includes a processor coupled to the signal generator. The processor is configured to determine a temperature of the media, where the temperature of the media being proportional to the delay of the waveform.

In another respect, the present disclosure includes a time domain reflectometer. The time domain reflectometer includes a signal generator configured to generate a truncated exponential waveform on a media. Using the generated truncated exponential media, the time domain reflectometer is configured to determine the length of the media. In another embodiment, the time domain reflectometer is configured to detect the locations of possible faults.

These, and other, embodiments of the invention will be better appreciated and understood when considered in conjunction with the following description and the accompanying drawings. It should be understood, however, that the following description, while indicating various embodiments of the invention and numerous specific details thereof, is given by way of illustration and not of limitation. Many substitutions, modifications, additions and/or rearrangements may be made within the scope of the invention without departing from the spirit thereof, and the invention includes all such substitutions, modifications, additions and/or rearrangements.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore nonlimiting, embodiments illustrated in the drawings, wherein like reference numerals (if they occur in more than one view) designate the same or similar elements. The invention may be better understood by reference to one or more of these drawings in combination with the description presented herein. It should be noted that the features illustrated in the drawings are not necessarily drawn to scale.

representing an embodiment of the invention.

Figure 44:
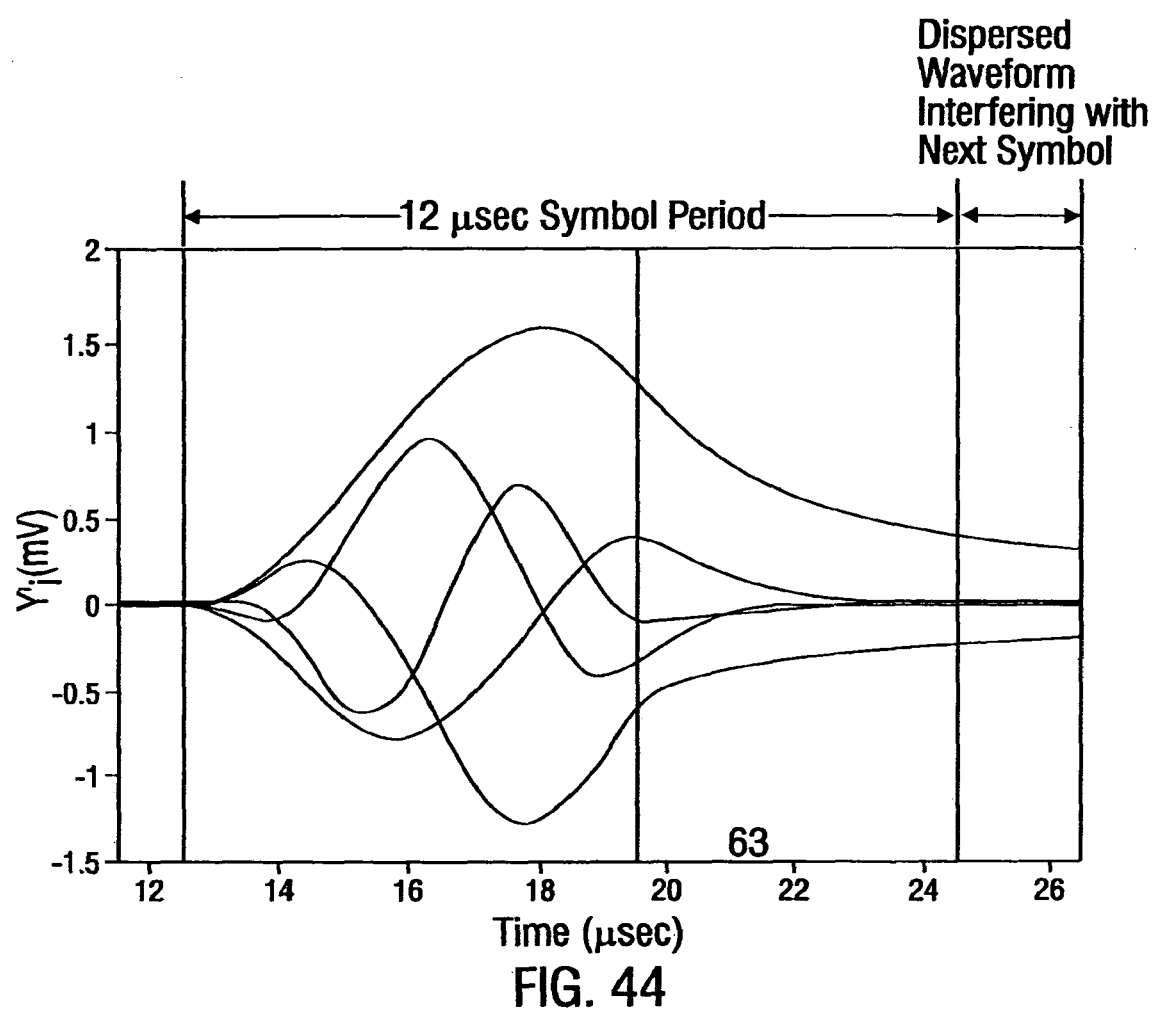

FIG. 44 is a graph of dispersed waveforms Y' at the receiver at 8000 ft, representing an embodiment of the invention.

Figure 45:
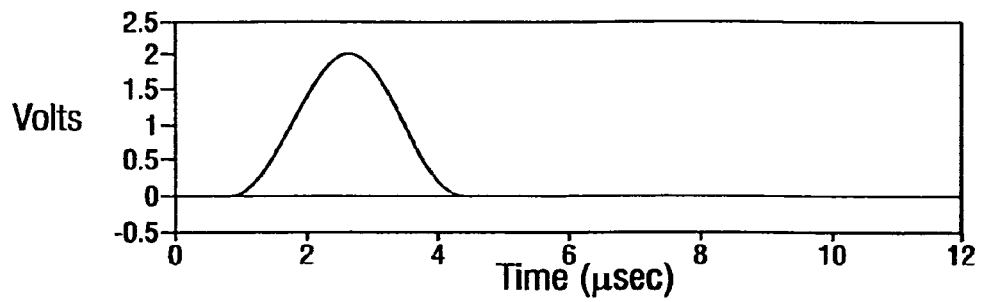
Figure 45:
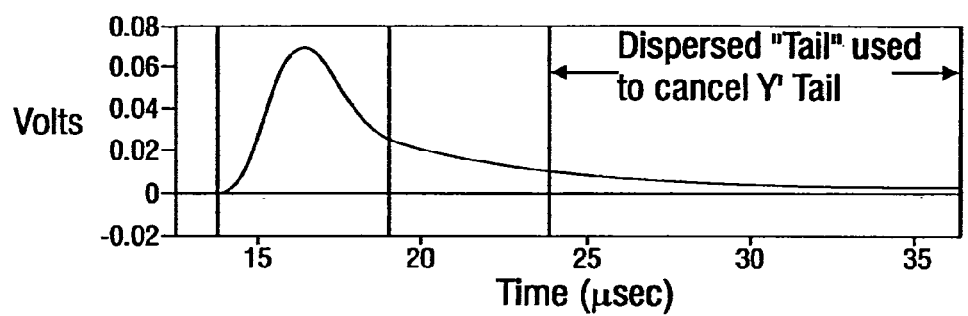

FIG. 45 is a graph of a compensating Pulse C, at Input and at 8000 ft, representing an embodiment of the invention.

Figure 46:
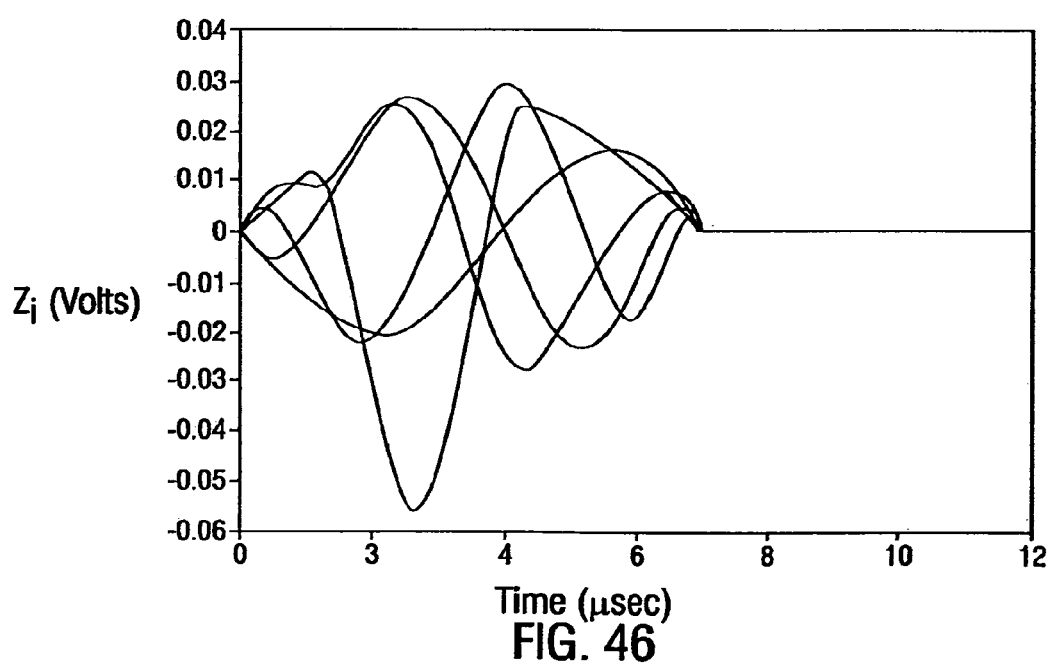

FIG. 46 is a graph of component functions at input with compensating pulses, $Z = Y' + b \cdot C$, representing an embodiment of the invention.

Figure 47:
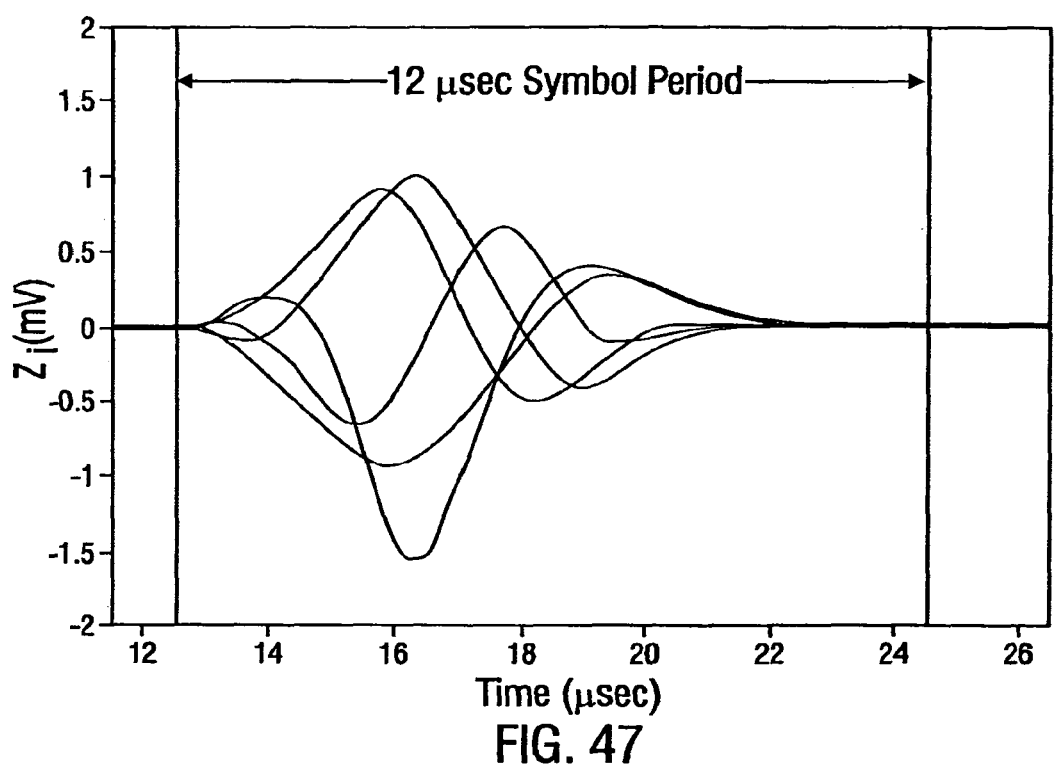

FIG. 47 is a graph of component functions Z at 8 kft, representing an embodiment of the invention.

Figure 48:
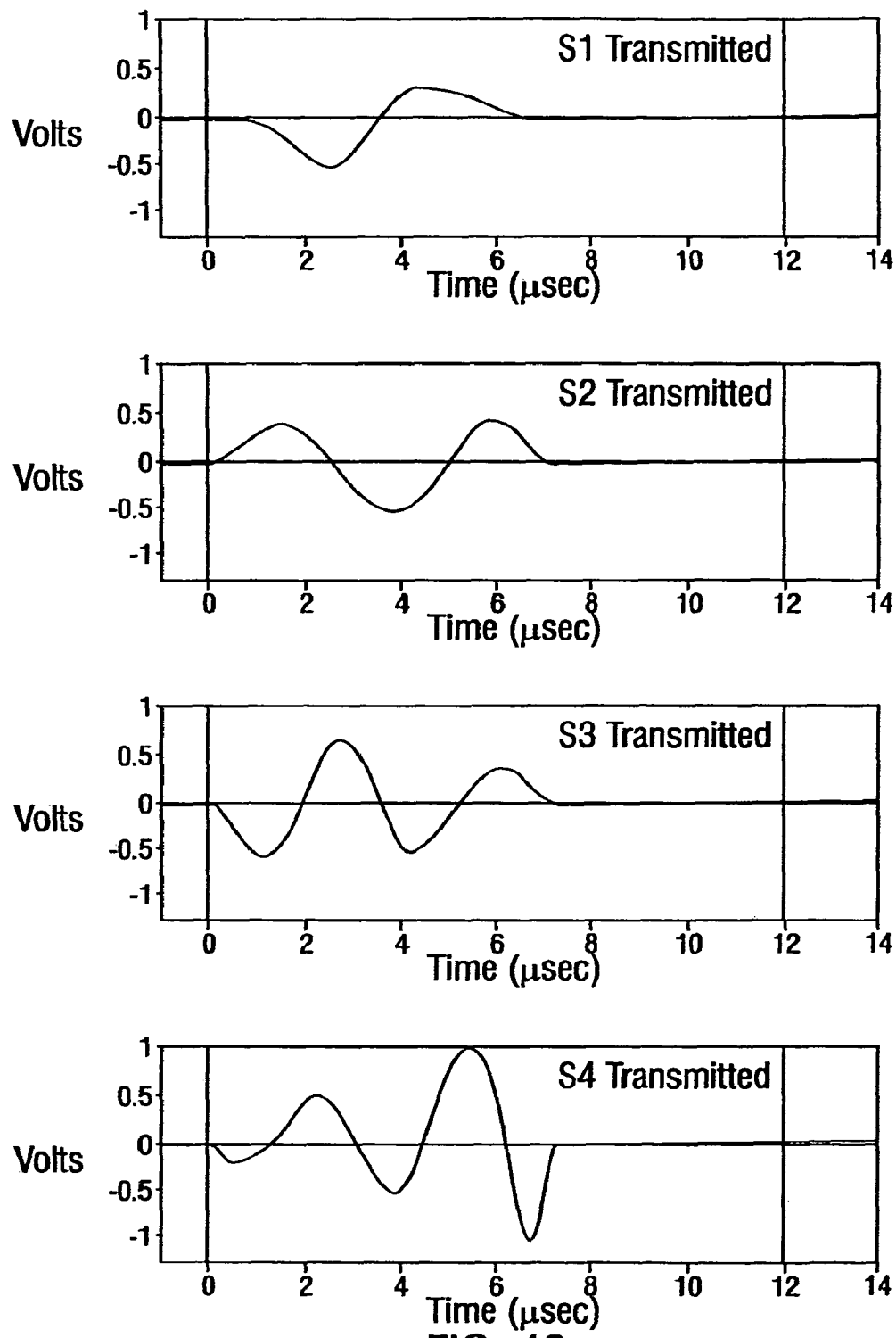

FIG. 48 is a graph of linear independent waveforms, S, transmitted to generate orthogonal waveforms at 8 kft, representing an embodiment of the invention.

Figure 49:
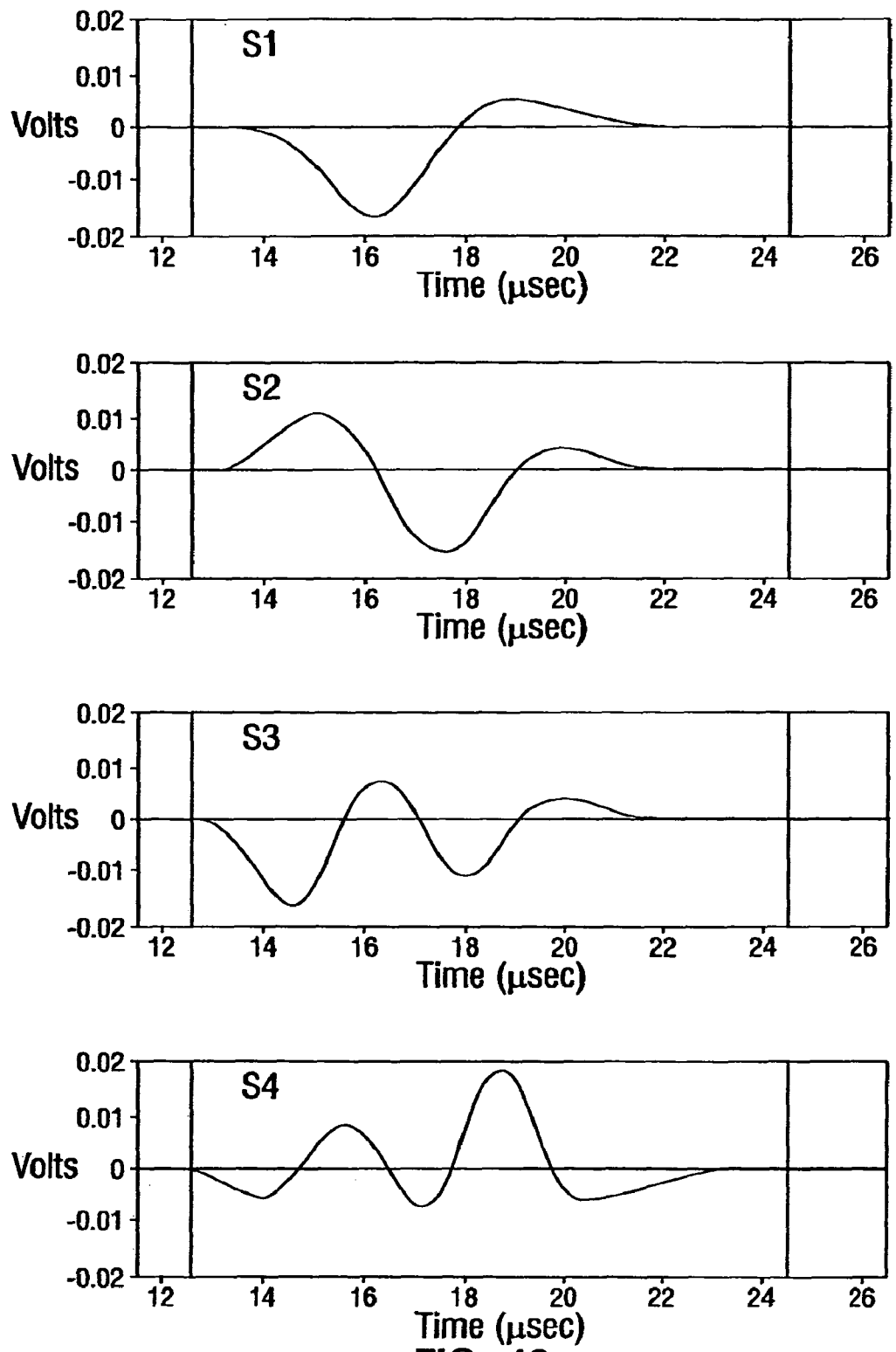

FIG. 49 is a graph of orthogonal waveforms, S, received at 8 kft, representing an embodiment of the invention.

Figure 50:
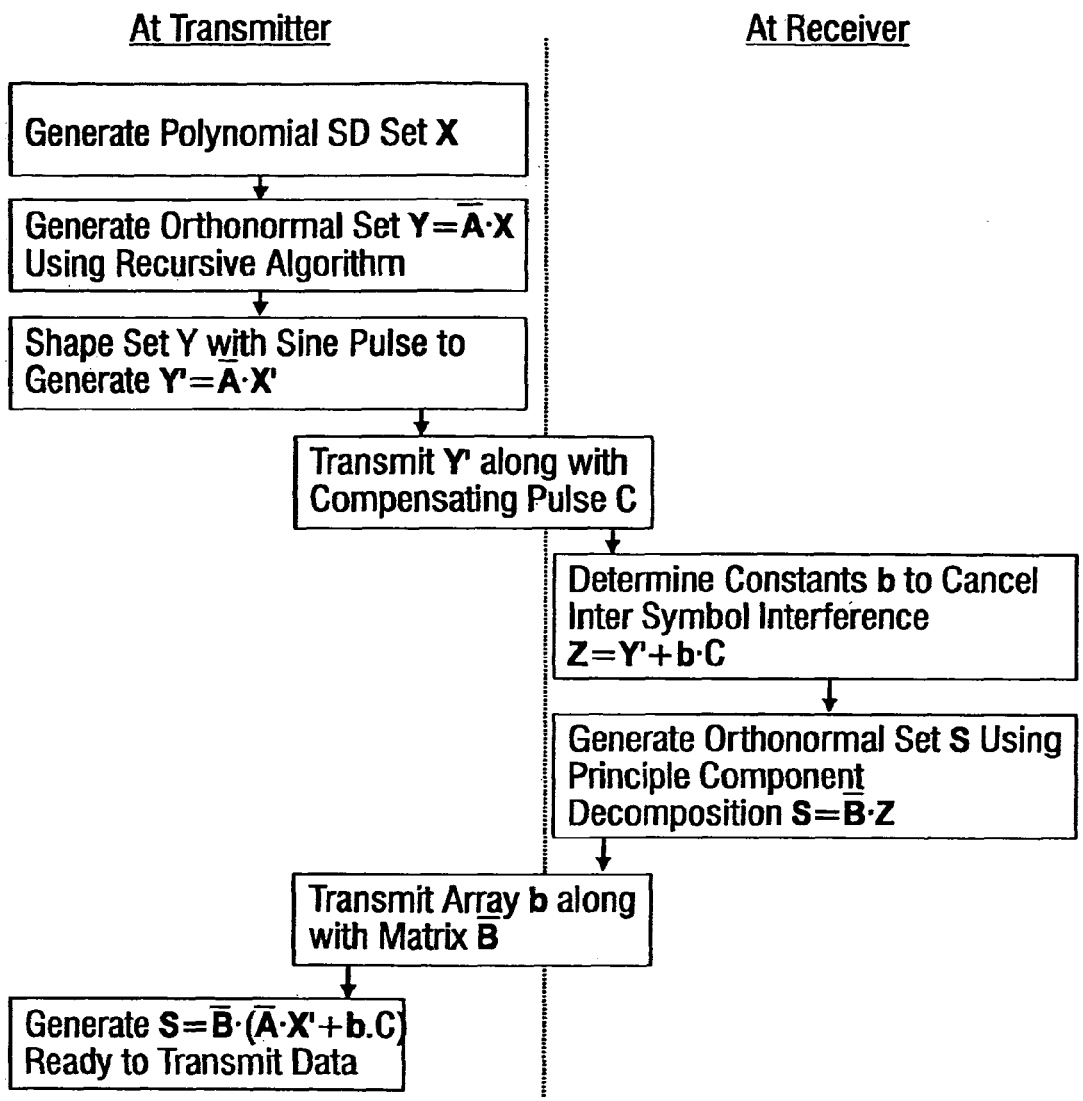

FIG. 50 is a flow diagram of an orthonormal set, S, generation algorithm, representing an embodiment of the invention.

Figure 51:
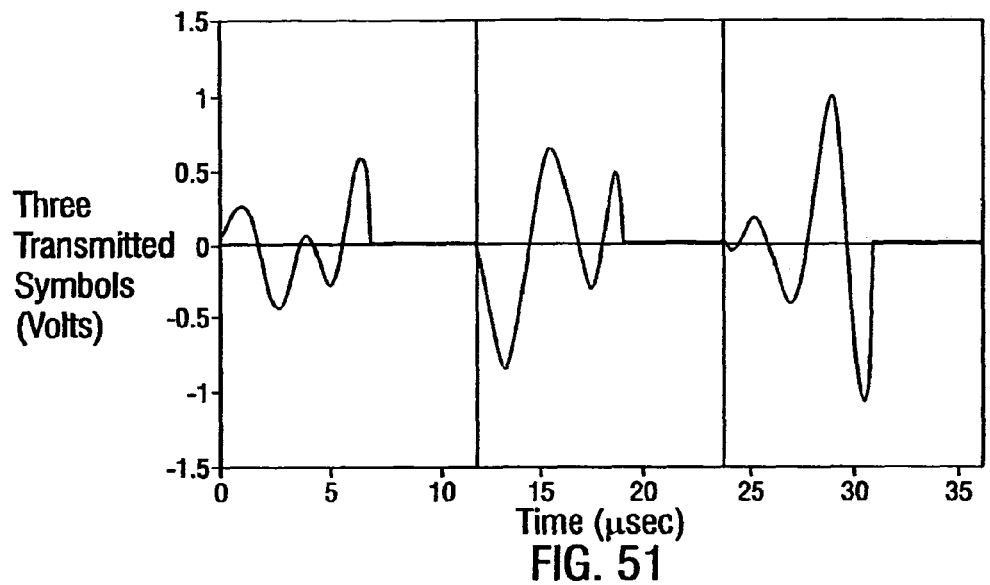

FIG. 51 is a graph of three successive transmitted symbols, Q, with five bits encoded on each of four orthonormal pulses of S, representing an embodiment of the invention.

Figure 52:
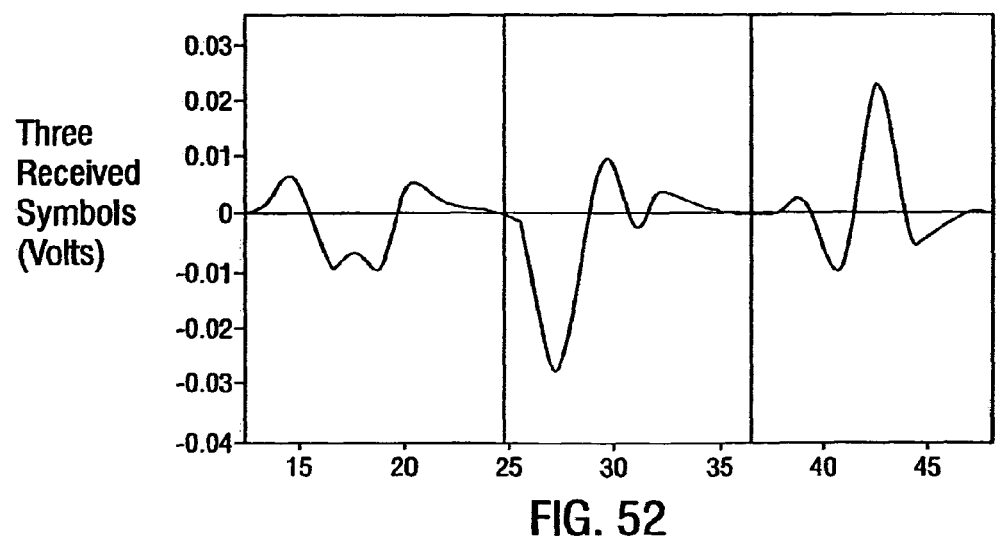

FIG. 52 is a graph of three successive symbols, Q, at the input to the receiver at 8 kft with five bits encoded on each of four orthonormal pulses of S, representing an embodiment of the invention.

Figure 53:
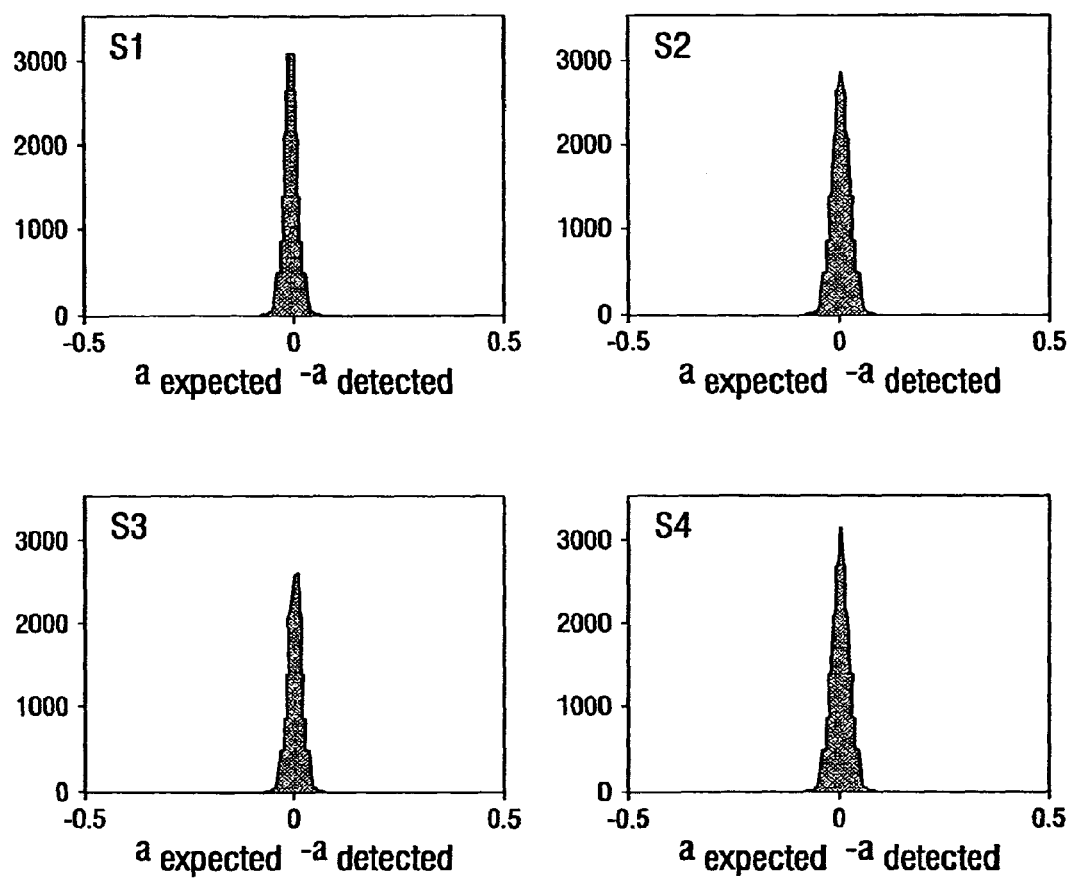

FIG. 53 is a graph of histogram of signal error, $a_{expected} - a_{detected}$ for one second, or $1.67 \times 10^6$ bits, of data transmitted with −140 dBm AWGN present, representing an embodiment of the invention.

Figure 54:
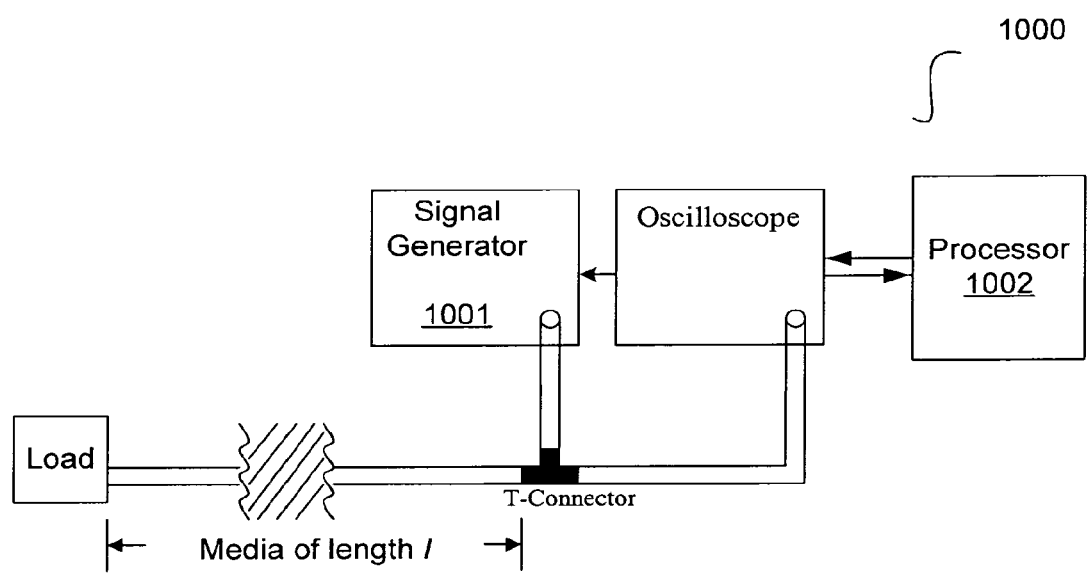

FIG. 54 is a block diagram of an apparatus, representing an embodiment of the invention.

Figure 55:
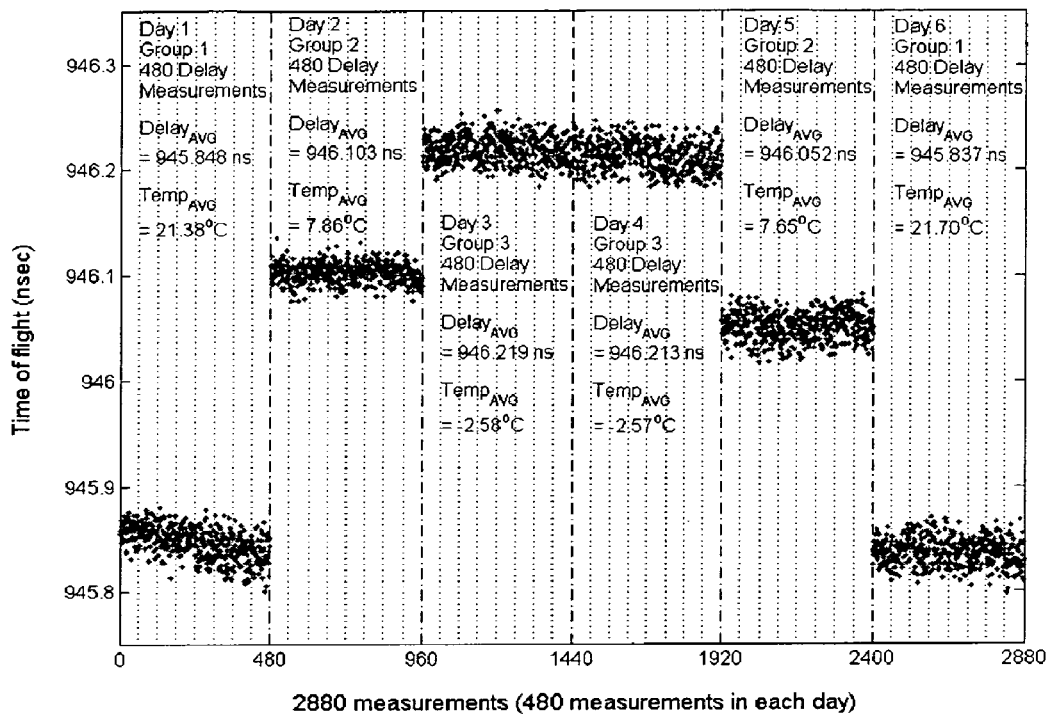

FIG. 55 is a graph of signal delay measurements of a media at different temperatures, representing an embodiment of the invention.

Figure 56:
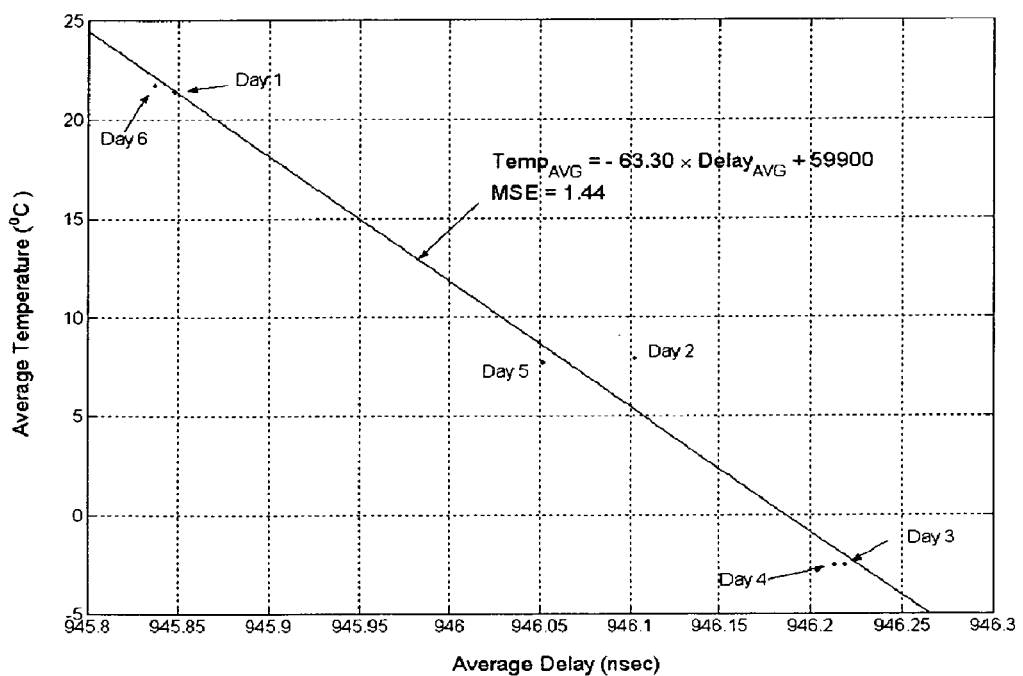

FIG. 56 is a graph of average temperatures versus average signal delays, representing an embodiment of the invention.

Figure 57:
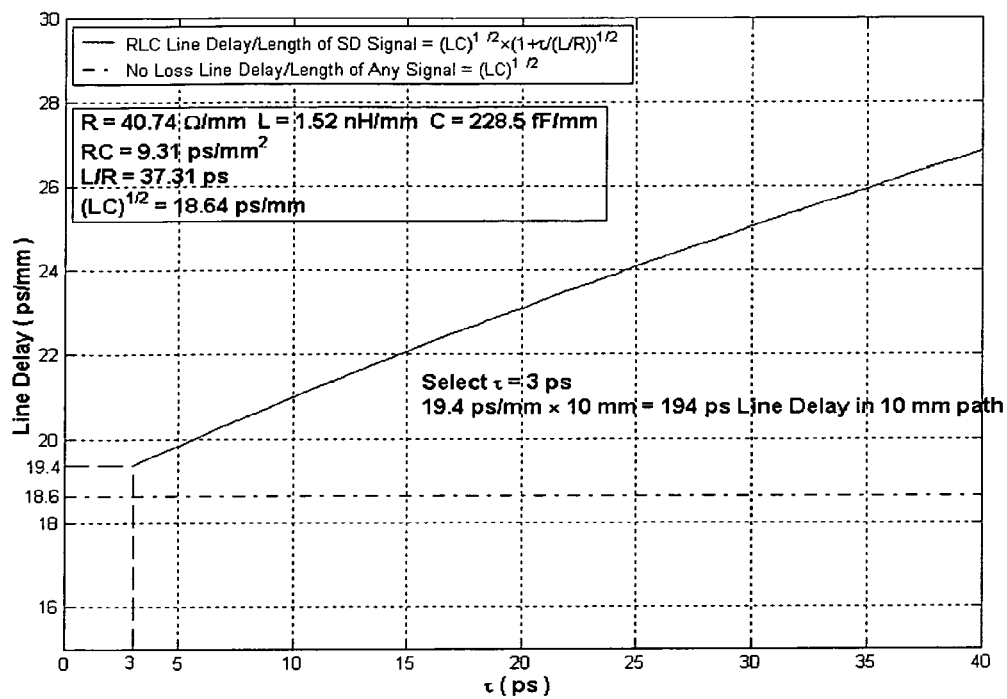

FIG. 57 is a graph of line delays versus a signal waveform parameter, representing an embodiment of the invention.

Figure 58:
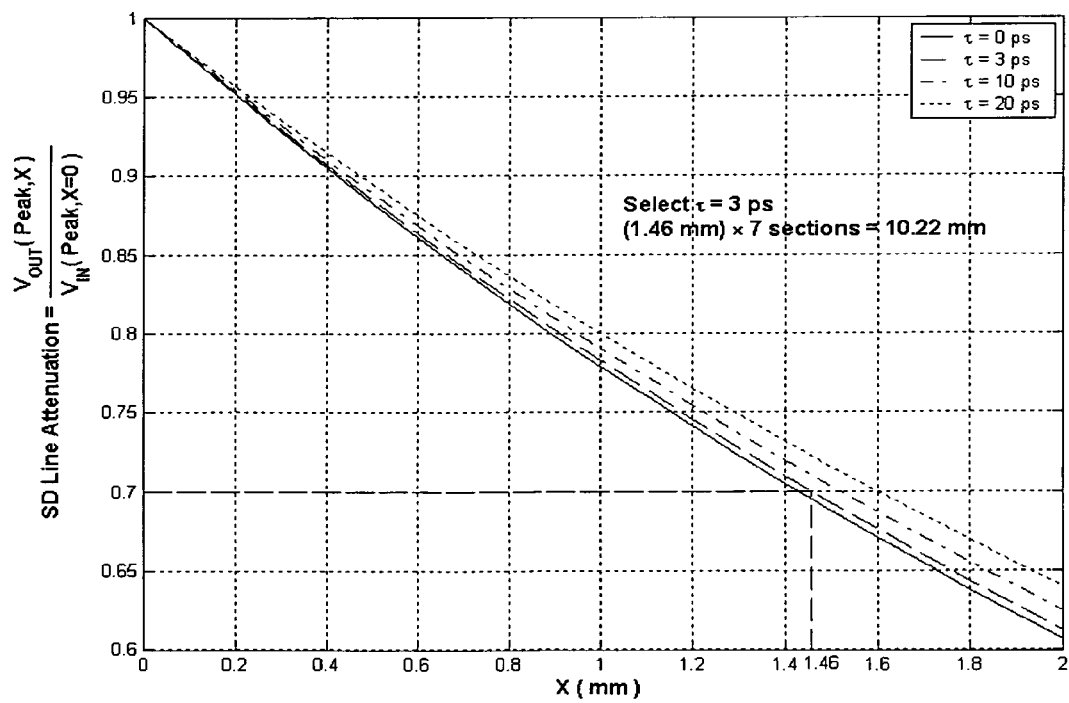

FIG. 58 is a graph of a signal attenuation as a function of line length, representing an embodiment of the invention.

Figure 59:
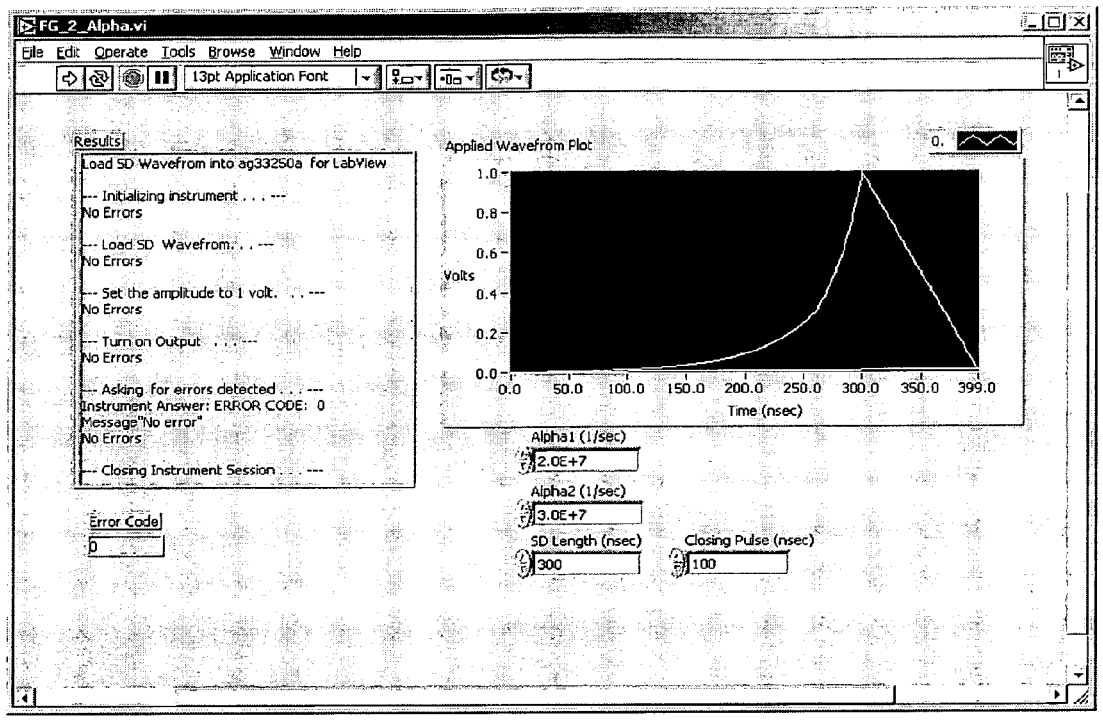

FIG. 59 is a graphical user interface showing two parameters encoded into a leading edge of a signal, representing an embodiment of the invention.

Figure 60:
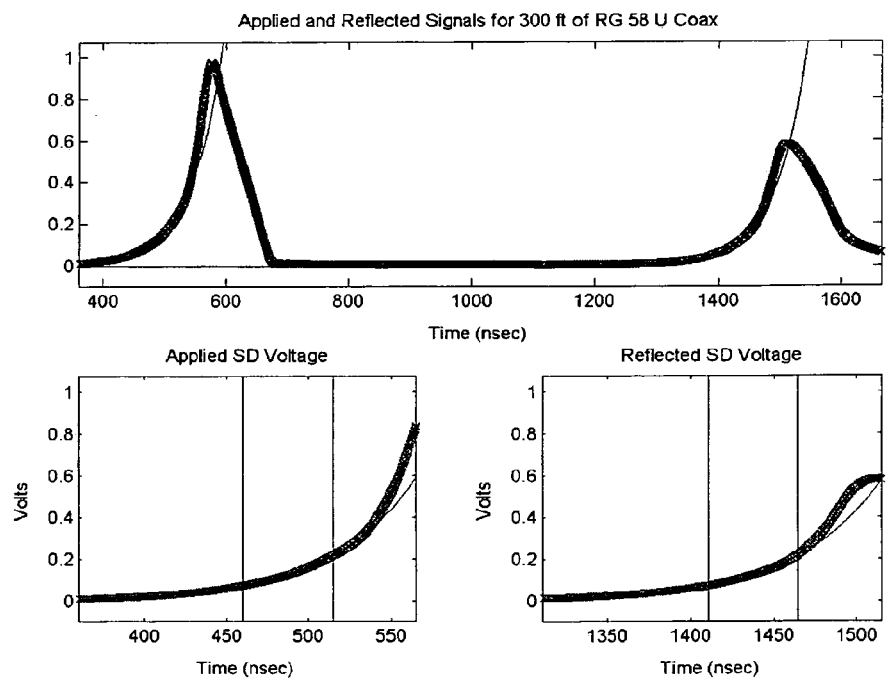

FIG. 60 are graphs of an encoded signal of FIG. 59 and a reflected signal of the encoded signal, representing an embodiment of the invention.

Figure 61:
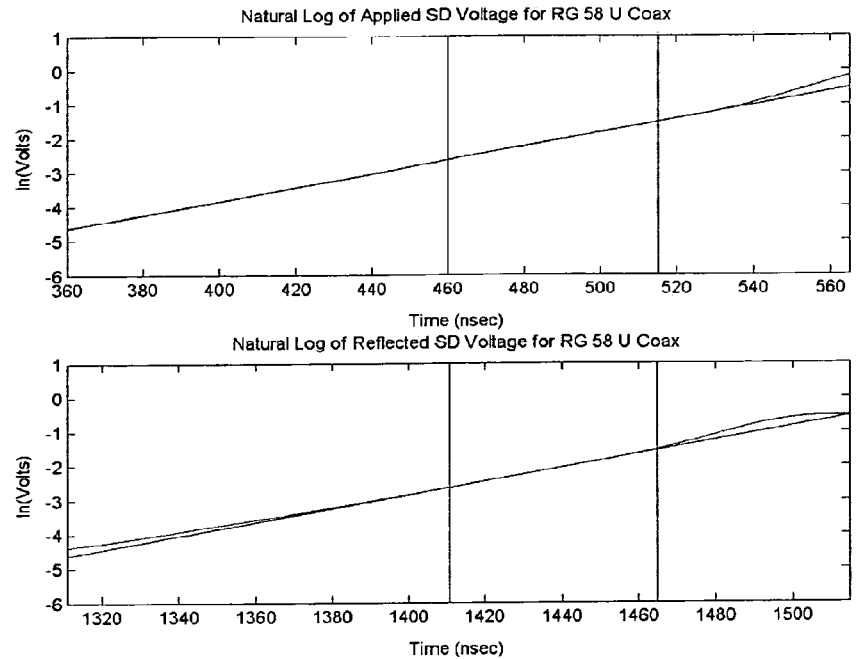

FIG. 61 are natural log graphs of an exponential portion of a lower portion of the leading edge on the encoded signal of FIG. 60, representing an embodiment of the invention.

Figure 62:
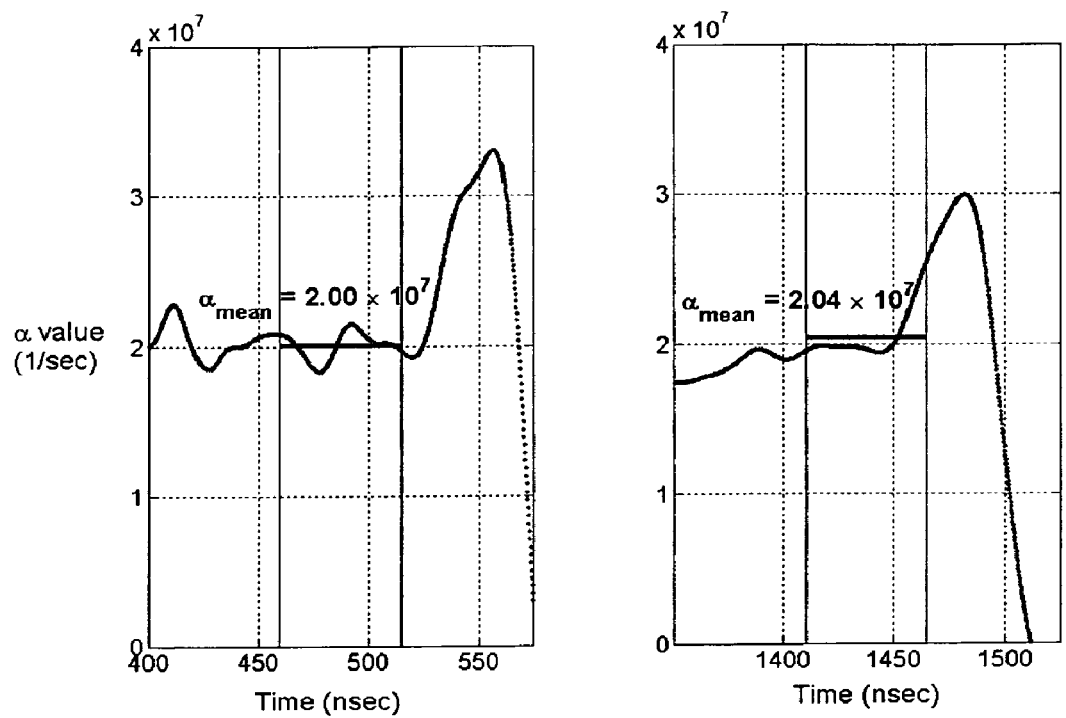

FIG. 62 are graphs of the output of ratio of filters used on the encoded signal of FIG. 60, representing an embodiment of the invention.

Figure 63A:
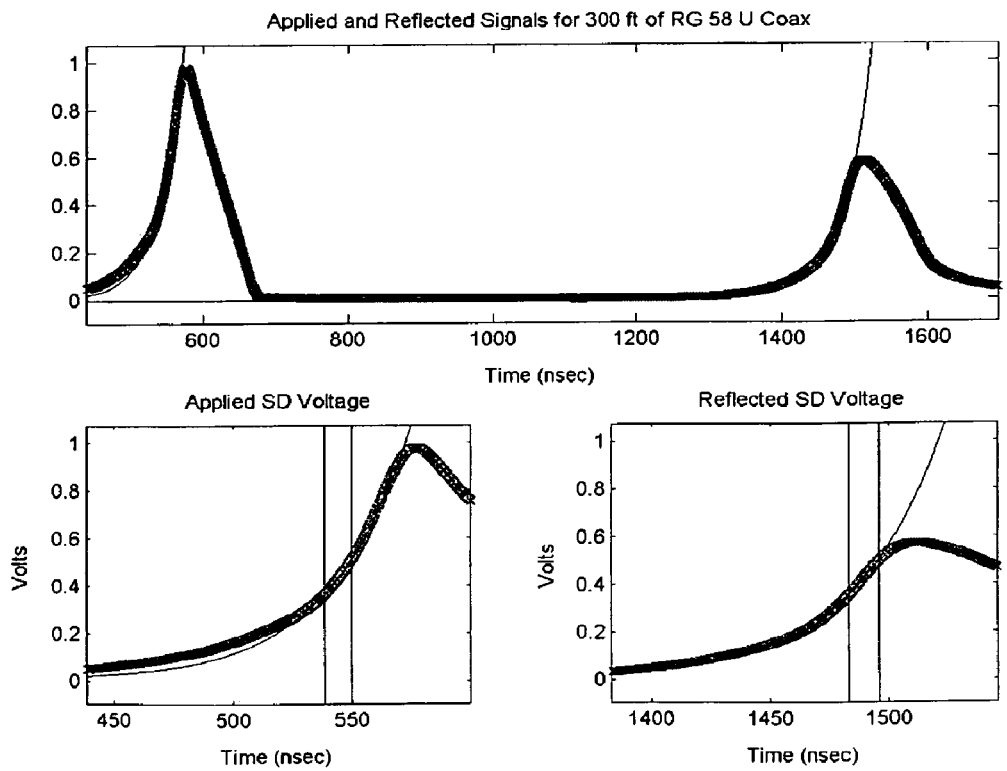

FIG. 63A are graphs of an encoded signal of FIG. 59 and a reflected signal of the encoded signal, representing an embodiment of the invention.

Figure 63B:
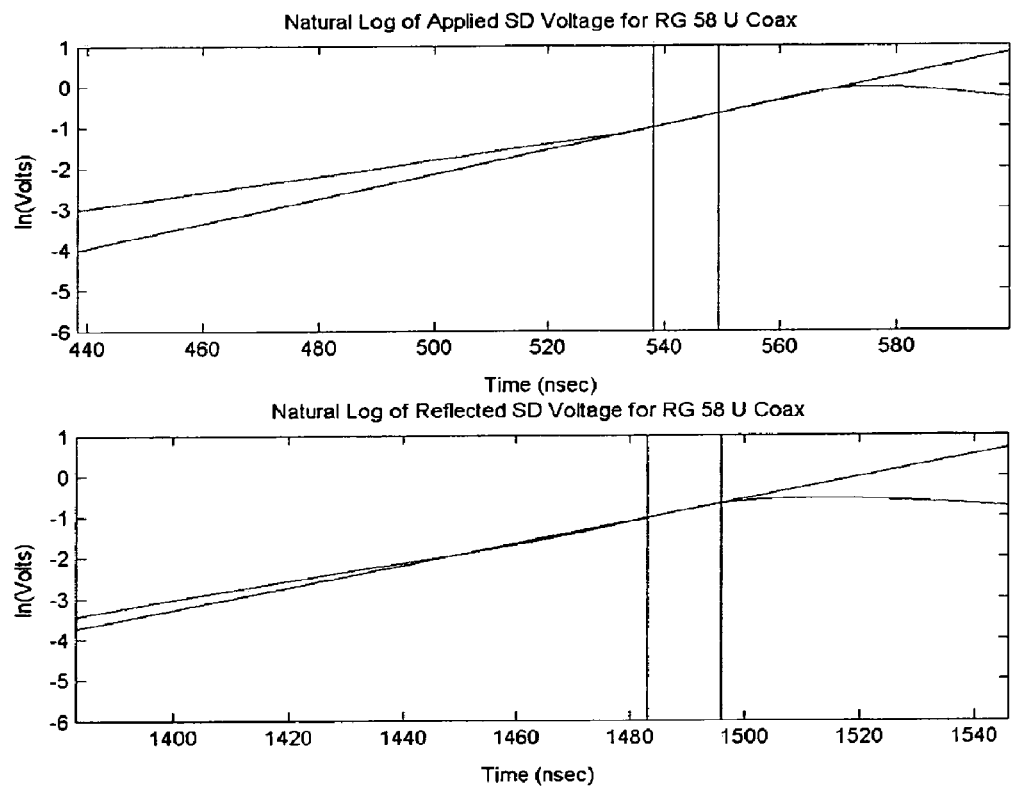

FIG. 63B are natural log graphs of an exponential portion of an upper portion of the leading edge on the encoded signal of FIG. 63A, representing an embodiment of the invention.

Figure 63C:
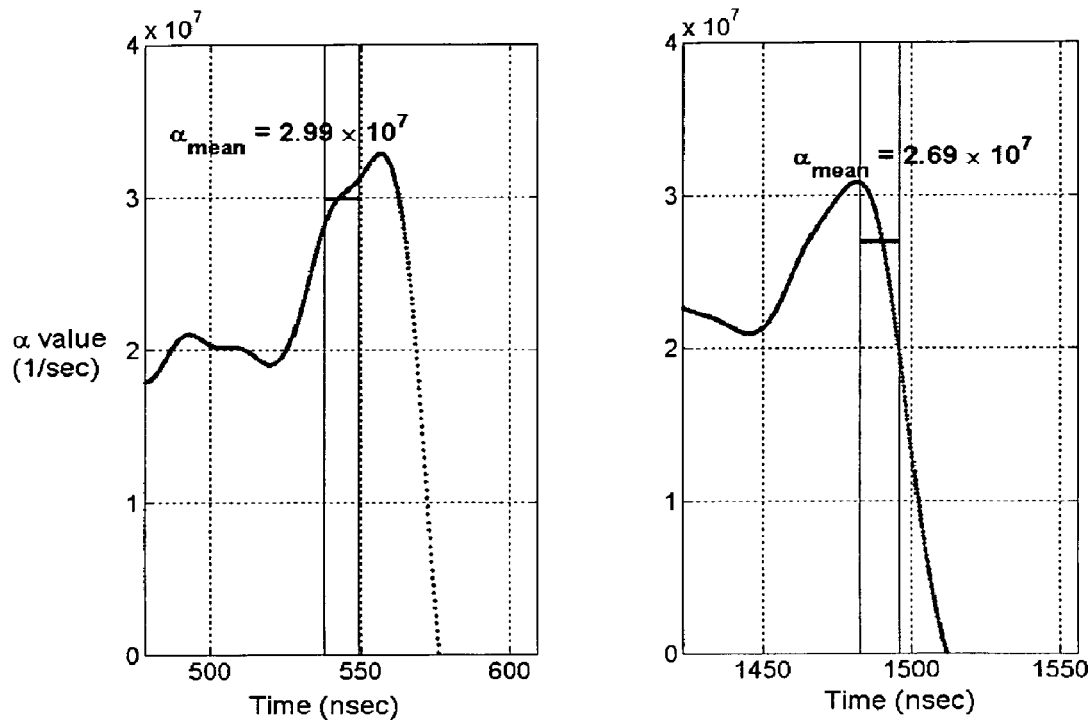

FIG. 63C are graphs of the output of ratio of filters used on the encoded signal of FIG. 63A, representing an embodiment of the invention.

Figure 64:
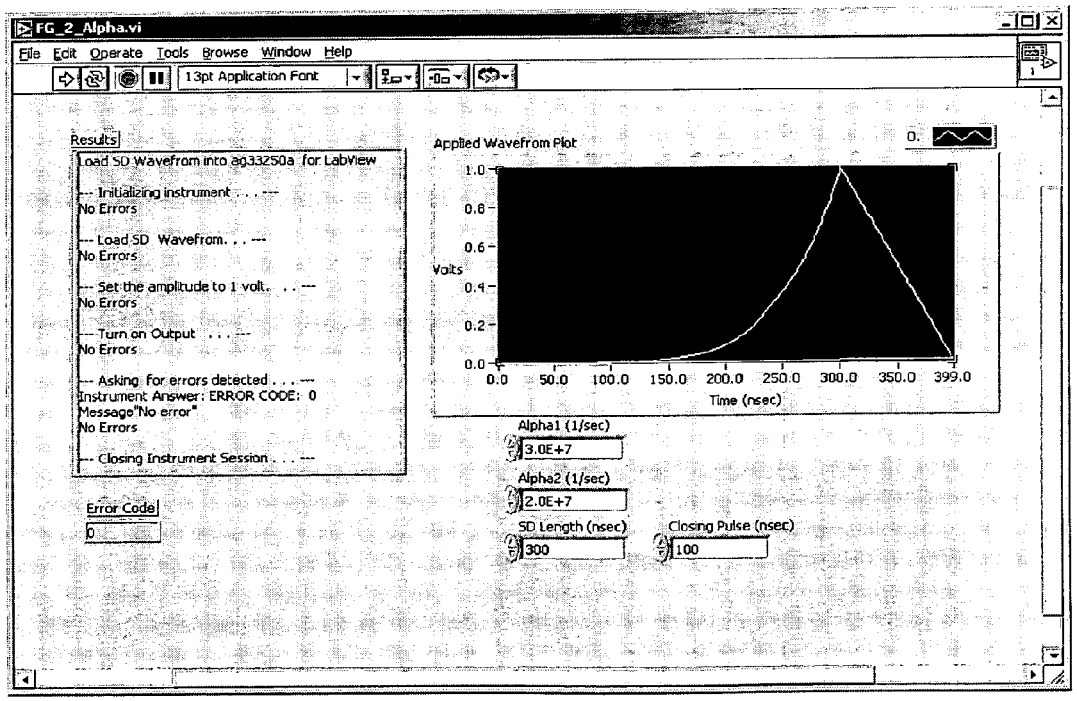

FIG. 64 is a graphical user interface showing two parameters encoded into a leading edge of a signal, representing an embodiment of the invention.

Figure 65:
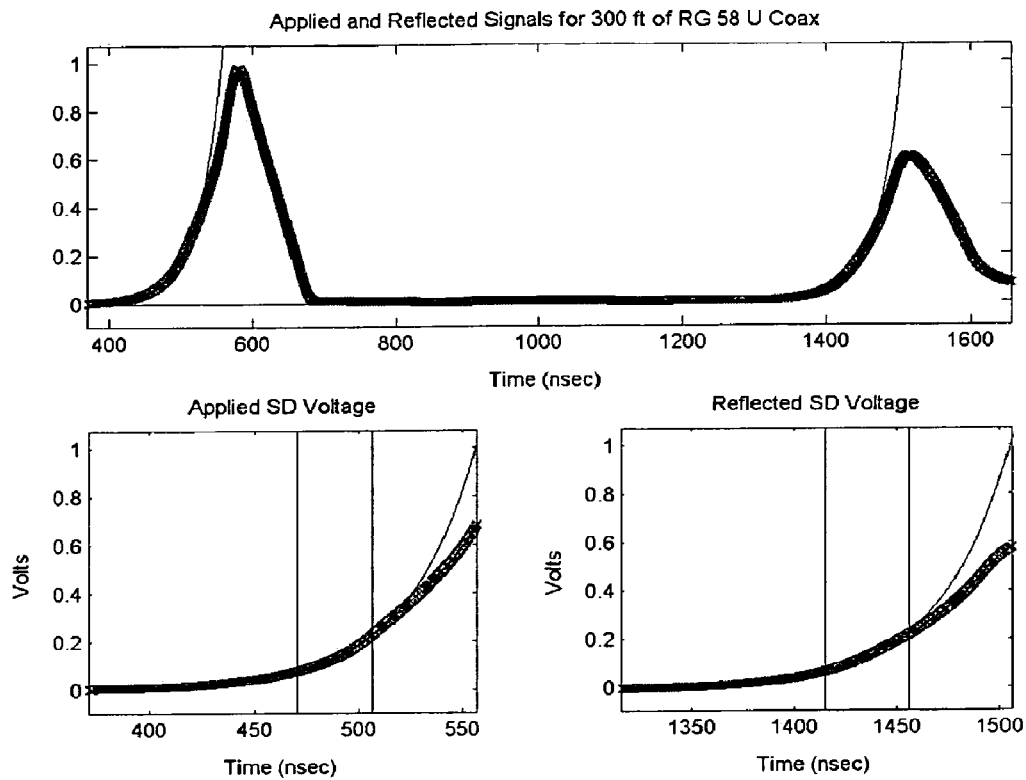

FIG. 65 are graphs of an encoded signal of FIG. 64 and a reflected signal of the encoded signal, representing an embodiment of the invention.

Figure 66:
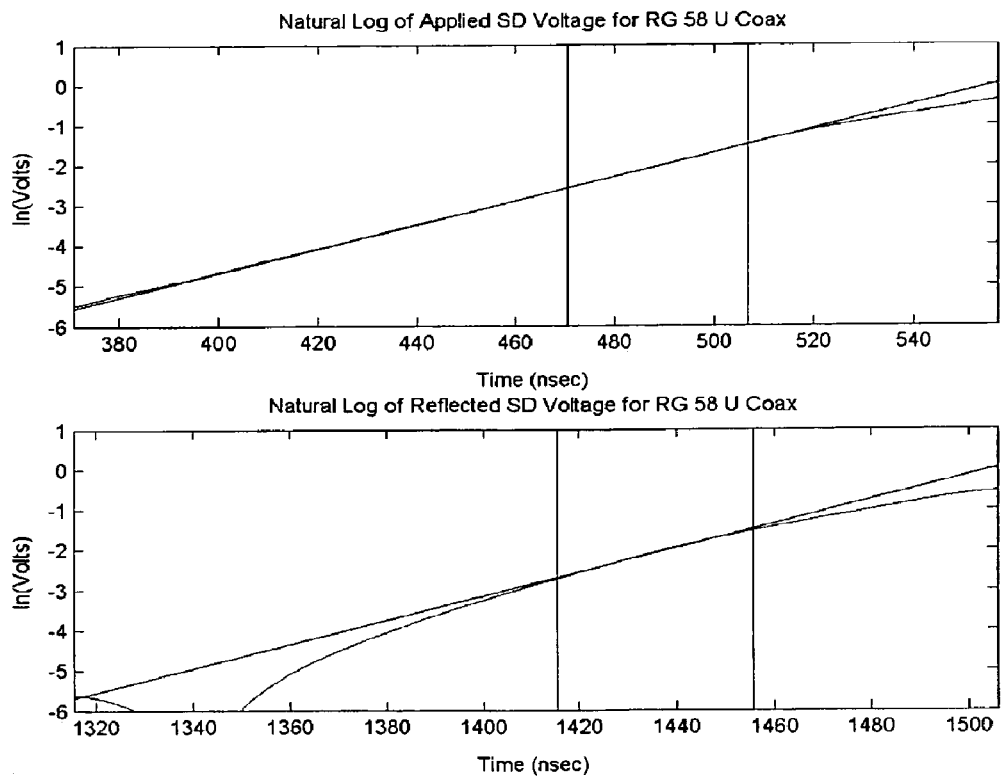

FIG. 66 are natural log graphs of an exponential portion of a lower portion of the leading edge on the encoded signal of FIG. 65, representing an embodiment of the invention.

Figure 67:
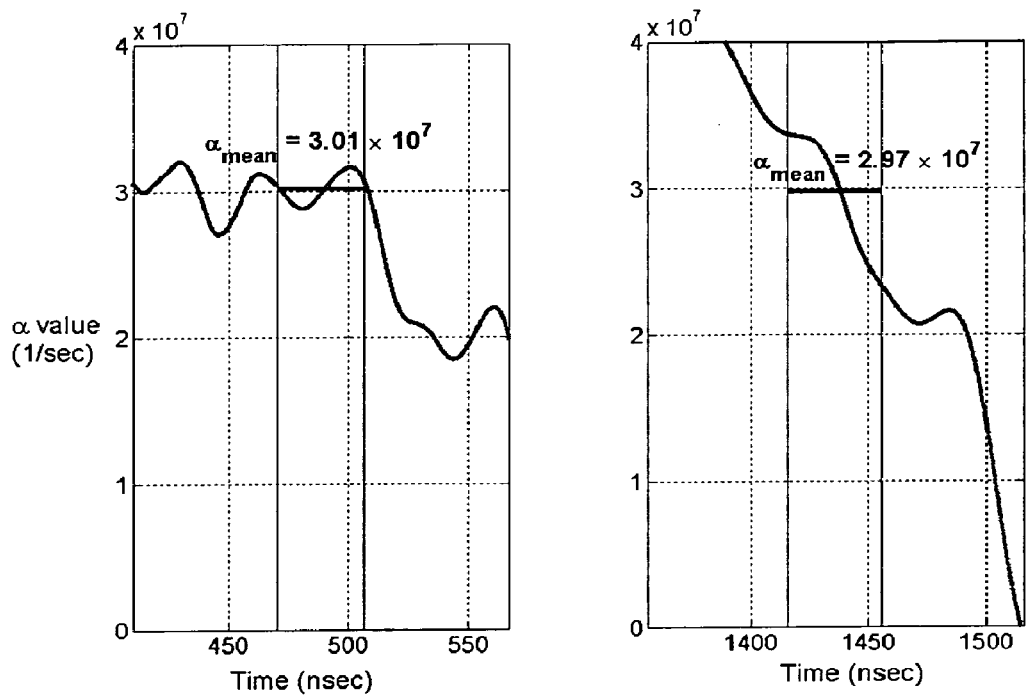

FIG. 67 are graphs of the output of ratio of filters used on the encoded signal of FIG. 65, representing an embodiment of the invention.

Figure 68A:
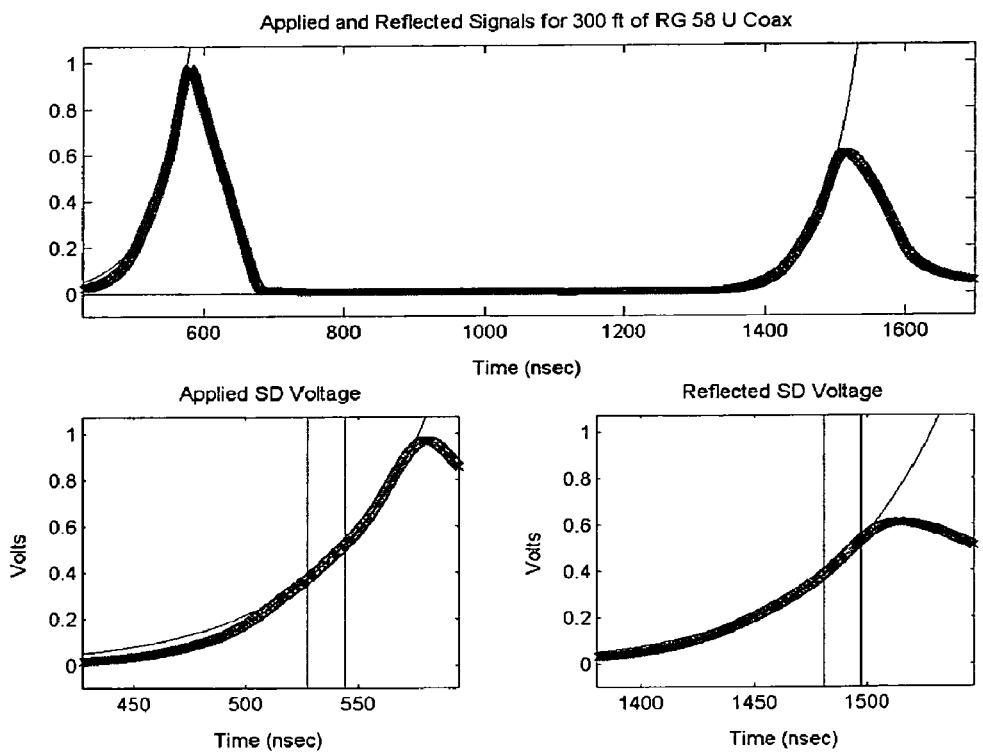

FIG. 68A shows graphs of an encoded signal of FIG. 64 and a reflected signal of the encoded signal, representing an embodiment of the invention.

Figure 68B:
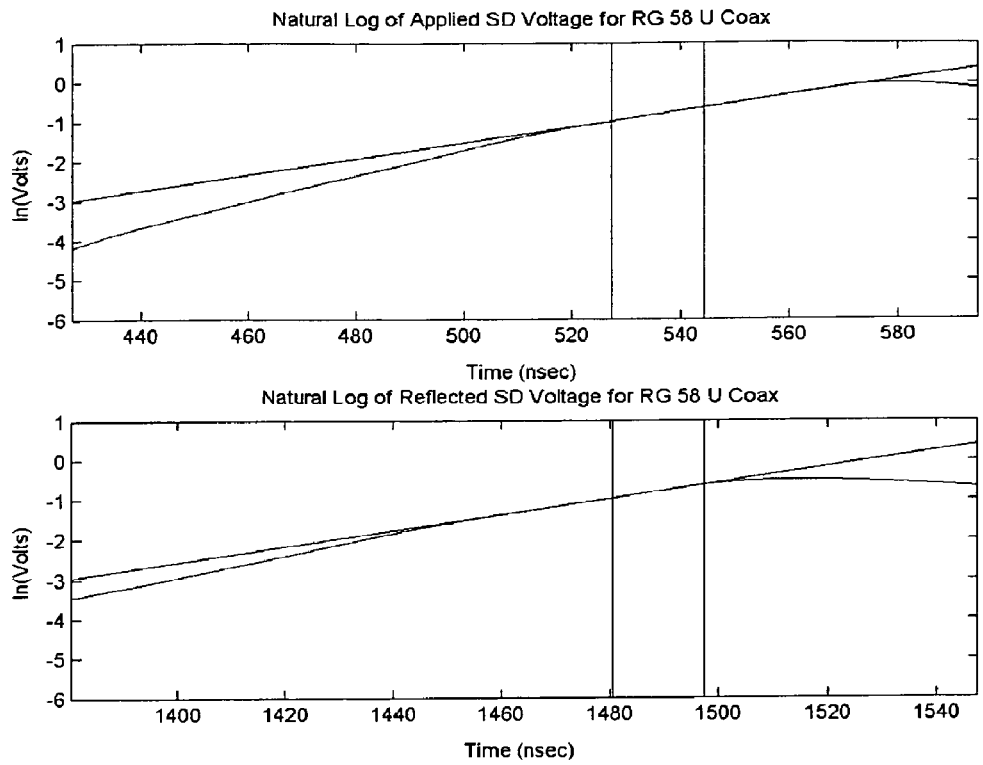

FIG. 68B are natural log graphs of an exponential portion of an upper portion of the leading edge on the encoded signal of FIG. 63A, representing an embodiment of the invention.

Figure 68C:
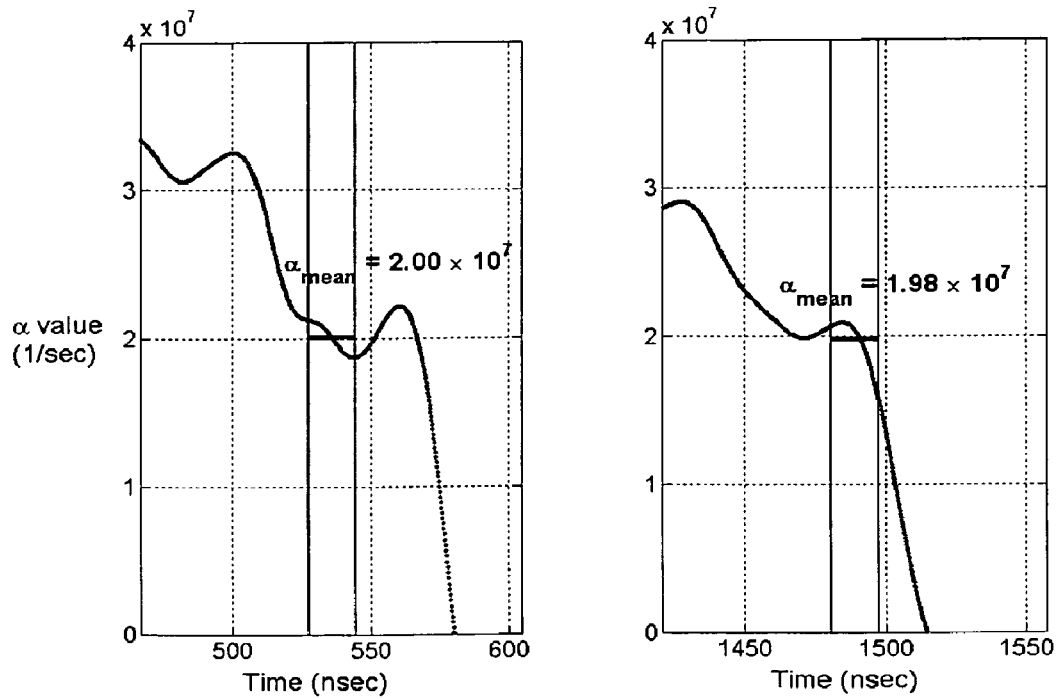

FIG. 68C are graphs of the output of ratio of filters used on the encoded signal of FIG. 63A, representing an embodiment of the invention.

Figure 69:
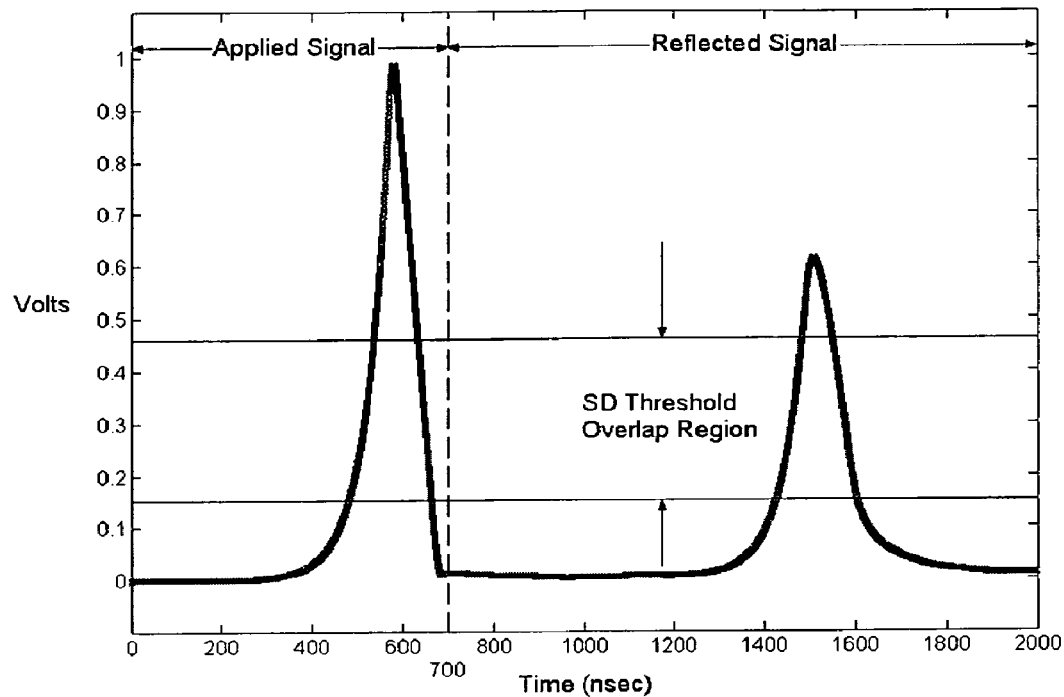

FIG. 69 is an applied signal and a reflected signal without bias, representing an embodiment of the invention.

Figure 70:
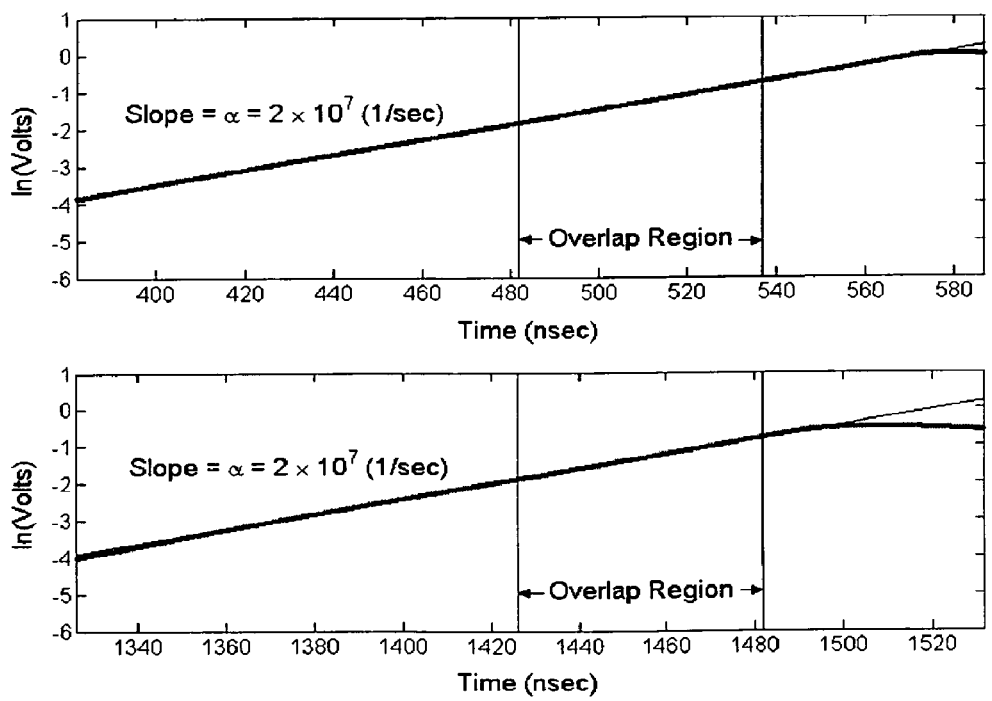

FIG. 70 depicts graphs of the natural log of the signals in FIG. 69, representing an embodiment of the invention.

FIGS. 71A and 71B are graphs of a signal with a positive bias, representing an embodiment of the invention.

FIGS. 72A and 72B are graphs of a signal with a negative bias, representing an embodiment of the invention.

FIG. 73 is a graph of bias compensations for a plurality of signals, representing an embodiment of the invention.

FIGS. 74A and 74B are graphs of plurality of time of flight measurements and bias values for those measurements, representing an embodiment of the invention.

Figure 75:
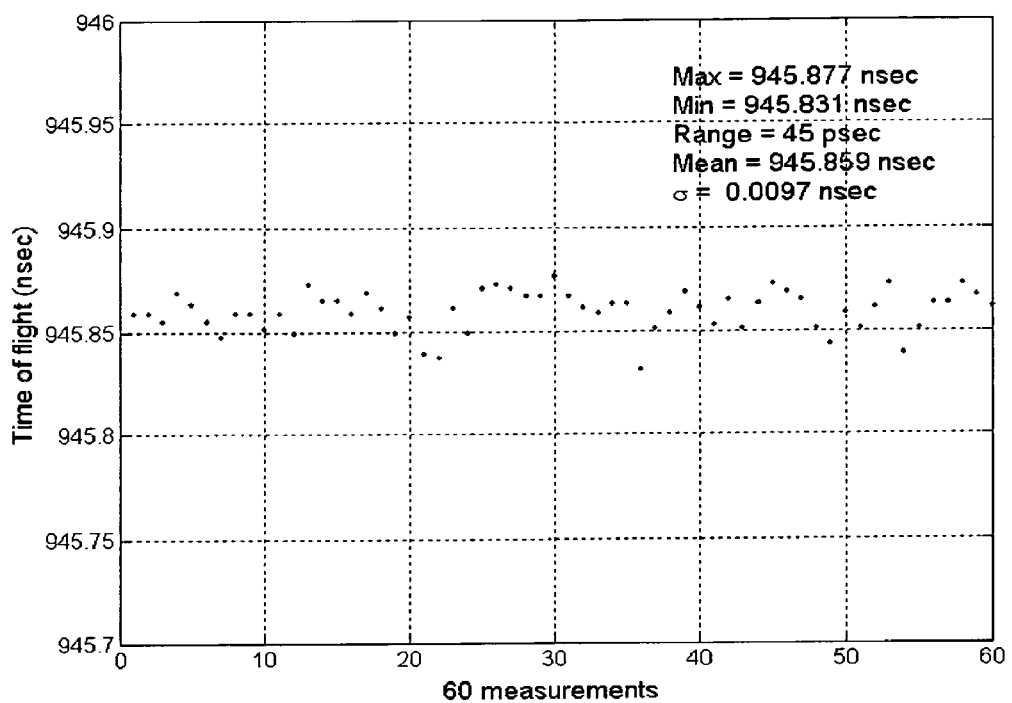

FIG. 75 is a graph of measured constant threshold time domain reflectometer time of flight measurements, representing an embodiment of the invention.

Figure 76:
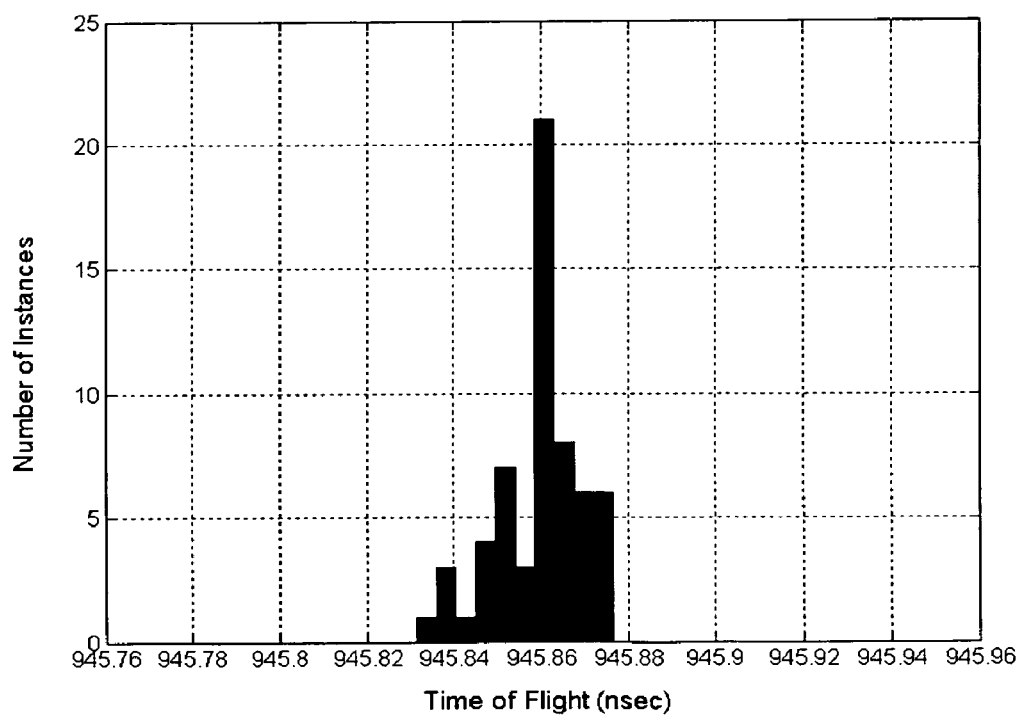

FIG. 76 is a histogram of measured constant threshold time domain reflectometer time of flight measurements, representing an embodiment of the invention.

DETAILED DESCRIPTION

The invention and the various features and advantageous details thereof are explained more fully with reference to the nonlimiting embodiments that are illustrated in the accompanying drawings and detailed in the following description. Descriptions of well known starting materials, processing techniques, components and equipment are omitted so as not to unnecessarily obscure the invention in detail. It should be understood, however, that the detailed description and the specific examples, while indicating specific embodiments of the invention, are given by way of illustration only and not by way of limitation. Various substitutions, modifications, additions and/or rearrangements within the spirit and/or scope of the underlying inventive concept will become apparent to those skilled in the art from this disclosure.

Within this application several publications are referenced by Arabic numerals within parentheses or brackets. Full citations for these, and other, publications may be found at the end of the specification immediately preceding the claims after the section heading References. The disclosures of all these publications in their entireties are hereby expressly incorporated by reference herein for the purpose of indicating the background of the invention and illustrating the state of the art.

In general, the context of the invention can include signal transmission. The context of the invention can include a method and/or apparatus for measuring and estimating transmission line parameters. The context of the invention can also include a method and/or apparatus for performing high-speed communication over a lossy, dispersive transmission line.

A practical application of the invention that has value within the technological arts is in time domain reflectometry. Further, the invention is useful in conjunction with lossy transmission lines. The invention is also useful in conjunction with frequency dependent transmission lines. Another practical application of the invention that has value within the technological arts is high-speed communications. There are virtually innumerable other uses for the invention. In fact, any application involving the transmission of a signal may benefit.

A method for transmitting a waveform having a controllable attenuation and propagation velocity, representing an embodiment of the invention, can be cost effective and advantageous. The invention improves quality and/or reduces costs compared to previous approaches.

The invention includes a method and/or apparatus for utilizing a truncated waveform, coined a Speedy Delivery (SD) waveform by the inventors. An analysis of SD propagation in coupled lossy transmission lines is presented and practical considerations associated with truncating the SD waveforms are addressed. Parameters used to describe the propagation of the SD waveform are defined and techniques for determining their values are presented.

These parameters include the Speedy Delivery propagation velocity, $v_{SD}$, the Speedy Delivery attenuation coefficient, $A_{SD}$, and the Speedy Delivery impedance, $Z_{SD}$. These parameters may depend on properties of a transmission media as well as an exponential coefficient $\alpha$ (SD input signal parameter).

The invention describes SD signal propagation in coupled transmission lines. An embodiment involving two transmission lines is illustrated. More complex configurations that include a larger number of coupled lines may be readily developed by one of ordinary skill in the art in light of this disclosure. Additionally, the behavior of the propagation of a slowly varying envelope of an optical pulse containing a truncated SD signal in a single mode communication fiber is described.

The invention teaches a method for using SD test pulses to obtain empirical estimates of the SD signal propagation parameters, $A_{SD}$ and $v_{SD}$, in lossy transmission lines, including those with frequency dependent parameters. Once the value of $v_{SD}$ is determined for a calibration cable length, constant threshold time of flight measurements can be used to measure distances to discontinuities in similar cables. The calibration procedure can be repeated experimentally for each exponential coefficient $\alpha$.

The invention provides a method for utilizing a wideband, non-SD waveform in order to develop an empirical transfer function for a calibration length of a given transmission media. This transfer function may be used to simulate the transmission of SD waveforms with a wide range of values for the exponential coefficient $\alpha$. The SD parameters $A_{SD}(\alpha)$ and $v_{SD}(\alpha)$ can be determined from these simulated waveforms. The inclusion of a simulation step in the calibration process can significantly reduce the experimental measurements needed to determine the values of $A_{SD}(\alpha)$ and $v_{SD}(\alpha)$ for a variety of values for $\alpha$. The SD behavior of a media can then be determined by simulation, without the need for an SD waveform generator.

The invention teaches a method for determining the SD impedance of a transmission line. It also illustrates the predicable variation of $Z_{SD}$ as a function of $\alpha$. This predictability can allow a designer to control the transmission line SD impedance by appropriately selecting the parameter $\alpha$.

The invention also describes an alternate precision distance measurement method using truncated SD test pulses with high loss, long lines. As the test pulses travel down these lines, the attenuation can be so extensive that their amplitudes are too small for common threshold crossing time of flight measurements to be feasible. The invention includes a method for predicting an attenuation and overcoming this difficulty, extracting accurate length measurements for long lossy lines.

The invention demonstrates the utility of the SD test waveform in accurately determining distances to impedance discontinuities. Examples show how to use SD wave propagation as the basis for an accurate time domain reflectometry (TDR) unit. This unit may include an SD waveform generator, a means of coupling with the transmission media, a means of measuring the applied and reflected waveforms, a display, memory storage, and computational ability to analyze and interpret the SD waveforms. The invention can also include a computer. The invention can include a method which can be applied to modify currently available TDR units to increase their accuracy. This modification may be a TDR software modification resulting in a nonrecurring unit manufacturing cost. A standard TDR waveform may be used to determine an empirical transfer function for the line under test, and this transfer function may then be used to simulate the propagation of the SD waveform. This process allows all the advantages of SD to be incorporated into currently available units with only a modification of existing computational algorithms, creating a virtual SD TDR unit.

The truncated SD test pulse approach can also be applied to the propagation of acoustic waves in sonar and geophysical applications. Reflected acoustic signals can be used to accurately determine the location of underwater objects and to determine locations of geophysical strata boundaries. Empirical transfer functions can be determined and used to simulate SD pulse propagation eliminating the need to physically generate complex acoustic pulses.

The invention provides an SD waveform that has several propagation properties in lossy, frequency dependent transmission media, which make it suitable for enhancing a data transmission scheme.

The invention provides a method to increase the number of bits transmitted per pulse by varying the value of $\alpha$ to encode data on truncated SD waveforms. The example provided utilizes SD pulses with four different $\alpha$'s sequentially transmitted on a 2 kft cable. These SD pulses are received at the end of the cable with the exponential constants undistorted. The four pulses may be transmitted as positive or negative signals resulting in eight possible states. Therefore, each pulse represents three bits of transmitted information in each symbol period. This strategy can be used with short, low loss transmission lines.

The invention also teaches the use of SD propagation properties to generate a set of pulses consisting of linear combinations of truncated SD waveforms that are orthogonal at the receiver. Data can be encoded on these pulses by varying their amplitude, and these amplitude-modulated pulses may be transmitted simultaneously on a transmission line. The individual pulse amplitudes are computed at the receiver taking advantage of their orthogonality. This method provides improved noise immunity, and can be used with longer, higher loss transmission lines.

The invention also teaches the use of SD waveforms in digital circuits, specifically, on-chip clock circuits. It provides a method for utilizing truncated SD clock waveforms to reduce clock skew.

The propagation of a Speedy Delivery (SD) waveform in a transmission line can be described by the equation $V(x, t) = De^{-A_{SD}[x - v_{SD}t]}$. The associated boundary condition at the input to the line is $V(x=0, t) = De^{\alpha t}$, wherein $A_{SD}$ is the exponential coefficient describing the attenuation of the SD signal as a function of distance along the line at a fixed time instant, and $v_{SD}$ is the SD signal propagation velocity. These quantities are also related by the simple equation, $A_{SD}(\alpha) \cdot v_{SD}(\alpha) = \alpha$. The parameters $A_{SD}$ and $v_{SD}$ of the propagating wave and the line boundary condition are all functions of $\alpha$, and may be determined experimentally for a transmission line.

For the case of two balanced twisted wire pair transmission lines, the differential voltage can be equally divided between the two wires and the current on each wire in the pair is equal in magnitude but opposite in direction. In this case, the telegrapher's equations can be written:

$$\frac{\partial}{\partial x} V = Z \cdot I$$

$$\frac{\partial}{\partial x} I = Y \cdot V$$

$$\frac{\partial}{\partial x}\begin{bmatrix} V_1(x,t) \\ V_2(x,t) \end{bmatrix} = \begin{bmatrix} R_1 + L_1 \frac{\partial}{\partial t} & M_{12}\frac{\partial}{\partial t} \\ M_{21}\frac{\partial}{\partial t} & R_2 + L_2 \frac{\partial}{\partial t} \end{bmatrix} \cdot \begin{bmatrix} I_1(x,t) \\ I_2(x,t) \end{bmatrix}$$

$$\frac{\partial}{\partial x}\begin{bmatrix} I_1(x,t) \\ I_2(x,t) \end{bmatrix} = \begin{bmatrix} G_1 + C_1 \frac{\partial}{\partial t} & C_{12}\frac{\partial}{\partial t} \\ C_{21}\frac{\partial}{\partial t} & G_2 + C_2 \frac{\partial}{\partial t} \end{bmatrix} \cdot \begin{bmatrix} V_1(x,t) \\ V_2(x,t) \end{bmatrix}$$

This analysis includes the net cross capacitance, $C_{ij}$, and the net cross inductances, $M_{ij}$. The cross resistance and conductance terms are neglected. These equations are then Laplace transformed into the complex frequency domain.

$$\frac{\partial}{\partial x}\begin{bmatrix} V_1(x,s) \\ V_2(x,s) \end{bmatrix} = \begin{bmatrix} \overline{R}_1(s) + s\overline{L}_1(s) & s\overline{M}_{12}(s) \\ s\overline{M}_{21}(s) & \overline{R}_2(s) + s\overline{L}_2(s) \end{bmatrix} \cdot \begin{bmatrix} I_1(x,s) \\ I_2(x,s) \end{bmatrix}$$

$$\frac{\partial}{\partial x}\begin{bmatrix} I_1(x,s) \\ I_2(x,s) \end{bmatrix} = \begin{bmatrix} \overline{G}_1(s) + s\overline{C}_1(s) & s\overline{C}_{12}(s) \\ s\overline{C}_{21}(s) & \overline{G}_2(s) + s\overline{C}_2(s) \end{bmatrix} \cdot \begin{bmatrix} V_1(x,s) \\ V_2(x,s) \end{bmatrix}$$

Taking the partial derivative of the top equation with respect to x, and substituting the bottom equation for the $$\frac{\partial}{\partial x}\begin{bmatrix} I_1(x,s) \\ I_2(x,s) \end{bmatrix}$$

term, gives the result:

$$\frac{\partial^2}{\partial x^2} V(x,s) = \overline{Z}(s)\overline{Y}(s) \cdot V(x,s)$$

$$\frac{\partial^2}{\partial x^2}\begin{bmatrix} V_1(x,s) \\ V_2(x,s) \end{bmatrix} = \begin{bmatrix} \overline{R}_1(s) + s\overline{L}_1(s) & s\overline{M}_{12}(s) \\ s\overline{M}_{21}(s) & \overline{R}_2(s) + s\overline{L}_2(s) \end{bmatrix} \cdot$$

$$\begin{bmatrix} \overline{G}_1(s) + s\overline{C}_1(s) & s\overline{C}_{12}(s) \\ s\overline{C}_{21}(s) & \overline{G}_2(s) + s\overline{C}_2(s) \end{bmatrix} \cdot \begin{bmatrix} V_1(x,s) \\ V_2(x,s) \end{bmatrix}$$

or, $$\frac{\partial^2}{\partial x^2} V(x,s) = \Gamma(s)^2 \cdot V(x,s)$$

$$\frac{\partial^2}{\partial x^2}\begin{bmatrix} V_1(x,s) \\ V_2(x,s) \end{bmatrix} =$$

$$\begin{bmatrix} (\overline{R}_1(s) + s\overline{L}_1(s))(\overline{G}_1(s) + s\overline{C}_1(s)) & s^2\overline{M}_{12}(s)\overline{C}_{21}(s) \\ s^2\overline{M}_{21}(s)\overline{C}_{12}(s) & (\overline{R}_2(s) + s\overline{L}_2(s))(\overline{G}_2(s) + s\overline{C}_2(s)) \end{bmatrix} \cdot$$

$$\begin{bmatrix} V_1(x,s) \\ V_2(x,s) \end{bmatrix}$$

This system of equations has the solution:

$$V(x,s) = e^{-\Gamma(s) \cdot x} \cdot A + e^{+\Gamma(s) \cdot x} \cdot B$$

Applying the boundary conditions for a semi-infinite pair of transmission lines, $V(x=0,s)$ at $x=0$, and $V(x\to\infty, s)=0$ gives:

$$V(x,s) = e^{-\Gamma(s) \cdot x} \cdot V(x=0,s).$$

Because $\overline{\Gamma}$ is a complex symmetric matrix, it can be written $\overline{\Gamma} = (\overline{ZY})^{1/2} = \overline{P}\overline{\gamma}\overline{P}^{-1}$, where $\overline{P}$ is the eigenvector matrix of the $\overline{ZY}$ product and $\overline{\gamma}$ is the diagonal eigenvalue matrix of $\overline{\Gamma}$. Therefore, we can write $e^{-\overline{\Gamma}(s) \cdot x} = P(s) \cdot e^{-\overline{\gamma}(s) \cdot x} \cdot P(s)^{-1}$. This gives the result:

$$V(x,s) = P(s) \cdot e^{-\overline{\gamma}(s) \cdot x} \cdot P(s)^{-1} \cdot V(x,=0,s)$$

For the case where the applied boundary conditions at x=0 are SD waveforms, $V_1(x=0,t) = D_1 e^{\alpha_1 t}$, $V_2(x=0,t) = D_2 e^{\alpha_2 t}$, the SD solution is:

$$V(x,t) = P(\alpha_1) \cdot e^{-\gamma(\alpha_1) x} \cdot P^{-1}(\alpha_1) \cdot \begin{bmatrix} D_1 \cdot e^{\alpha_1 \cdot t} \\ 0 \end{bmatrix} +$$

$$P(\alpha_2) \cdot e^{-\gamma(\alpha_2) x} \cdot P^{-1}(\alpha_2) \cdot \begin{bmatrix} 0 \\ D_2 \cdot e^{\alpha_2 \cdot t} \end{bmatrix},$$

where $P(\alpha_i)$ is a real matrix.

$$V(x,t) = \begin{bmatrix} P_{11}(\alpha_1) & P_{12}(\alpha_1) \\ P_{21}(\alpha_1) & P_{22}(\alpha_1) \end{bmatrix} \cdot \begin{bmatrix} e^{-\gamma_1(\alpha_1)x} & 0 \\ 0 & e^{-\gamma_2(\alpha_1)x} \end{bmatrix} \cdot$$

$$\begin{bmatrix} P_{11}(\alpha_1) & P_{12}(\alpha_1) \\ P_{21}(\alpha_1) & P_{22}(\alpha_1) \end{bmatrix}^{-1} \cdot \begin{bmatrix} D_1 \cdot e^{\alpha_1 \cdot t} \\ 0 \end{bmatrix} + \begin{bmatrix} P_{11}(\alpha_2) & P_{12}(\alpha_2) \\ P_{21}(\alpha_2) & P_{22}(\alpha_2) \end{bmatrix} \cdot$$

$$\begin{bmatrix} e^{-\gamma_1(\alpha_2)x} & 0 \\ 0 & e^{-\gamma_2(\alpha_2)x} \end{bmatrix} \cdot \begin{bmatrix} P_{11}(\alpha_2) & P_{12}(\alpha_2) \\ P_{21}(\alpha_2) & P_{22}(\alpha_2) \end{bmatrix}^{-1} \cdot \begin{bmatrix} 0 \\ D_2 \cdot e^{\alpha_2 \cdot t} \end{bmatrix}$$

If we designate $P^{-1}$ as Q, we can write:

$$V(x,t) = \begin{bmatrix} P_{11}(\alpha_1) & P_{12}(\alpha_1) \\ P_{21}(\alpha_1) & P_{22}(\alpha_1) \end{bmatrix} \cdot \begin{bmatrix} e^{-\gamma_1(\alpha_1)x} & 0 \\ 0 & e^{-\gamma_2(\alpha_1)x} \end{bmatrix} \cdot$$

$$\begin{bmatrix} Q_{11}(\alpha_1) & Q_{12}(\alpha_1) \\ Q_{21}(\alpha_1) & Q_{22}(\alpha_1) \end{bmatrix} \cdot \begin{bmatrix} D_1 \cdot e^{\alpha_1 \cdot t} \\ 0 \end{bmatrix} + \begin{bmatrix} P_{11}(\alpha_2) & P_{12}(\alpha_2) \\ P_{21}(\alpha_2) & P_{22}(\alpha_2) \end{bmatrix} \cdot$$

$$\begin{bmatrix} e^{-\gamma_1(\alpha_2)x} & 0 \\ 0 & e^{-\gamma_2(\alpha_2)x} \end{bmatrix} \cdot \begin{bmatrix} Q_{11}(\alpha_2) & Q_{12}(\alpha_2) \\ Q_{21}(\alpha_2) & Q_{22}(\alpha_2) \end{bmatrix} \cdot \begin{bmatrix} 0 \\ D_2 \cdot e^{\alpha_2 \cdot t} \end{bmatrix}$$

or, $$V(x,t) = P(\alpha_1) \cdot \begin{bmatrix} Q_{11}(\alpha_1) \cdot e^{-\gamma_1(\alpha_1)x} \\ Q_{21}(\alpha_1) \cdot e^{-\gamma_2(\alpha_1)x} \end{bmatrix} \cdot D_1 \cdot e^{\alpha_1 \cdot t} +$$

$$P(\alpha_2) \cdot \begin{bmatrix} Q_{12}(\alpha_2) \cdot e^{-\gamma_1(\alpha_2)x} \\ Q_{22}(\alpha_2) \cdot e^{-\gamma_2(\alpha_2)x} \end{bmatrix} \cdot D_2 \cdot e^{\alpha_2 \cdot t}$$

or, $$V(x,t) = \begin{bmatrix} Q_{11}(\alpha_1)P_{11}(\alpha_1)e^{-\gamma_1(\alpha_1)x} + Q_{21}(\alpha_1)P_{12}(\alpha_1)e^{-\gamma_2(\alpha_1)x} \\ Q_{11}(\alpha_1)P_{21}(\alpha_1)e^{-\gamma_1(\alpha_1)x} + Q_{21}(\alpha_1)P_{22}(\alpha_1)e^{-\gamma_2(\alpha_1)x} \end{bmatrix} \cdot$$

$$D_1 \cdot e^{\alpha_1 \cdot t} +$$

$$\begin{bmatrix} Q_{12}(\alpha_2)P_{11}(\alpha_2)e^{-\gamma_1(\alpha_2)x} + Q_{22}(\alpha_2)P_{12}(\alpha_2)e^{-\gamma_2(\alpha_2)x} \\ Q_{12}(\alpha_2)P_{21}(\alpha_2)e^{-\gamma_1(\alpha_2)x} + Q_{22}(\alpha_2)P_{22}(\alpha_2)e^{-\gamma_2(\alpha_2)x} \end{bmatrix} \cdot D_2 \cdot e^{\alpha_2 \cdot t}.$$

The real constants associated with the eigenvector matrix, P, its inverse, $P^{-1} = Q$, and the SD parameters D can be written:

$A_{11} D_1 P_{11}(\alpha_1) Q_{11}(\alpha_1)$
$A_{12} D_1 P_{12}(\alpha_1) Q_{21}(\alpha_1)$
$A_{21} D_2 P_{11}(\alpha_2) Q_{12}(\alpha_2)$
$A_{22} D_2 P_{12}(\alpha_2) Q_{22}(\alpha_2)$
$B_{11} D_1 P_{21}(\alpha_1) Q_{11}(\alpha_1)$ $B_{12}D_1P_{22}(\alpha_1)Q_{21}(\alpha_1)$
$B_{21}D_2P_{21}(\alpha_2)Q_{12}(\alpha_2)$
$B_{22}D_2P_{22}(\alpha_2)Q_{22}(\alpha_2)$ The signals on transmission lines will be:

$$V_1(x,t) = A_{11} \cdot e^{-\gamma_1(\alpha_1)x} e^{\alpha_1 t} + A_{21} \cdot e^{-\gamma_2(\alpha_1)x} e^{\alpha_1 t} +$$
$$A_{12} \cdot e^{-\gamma_1(\alpha_2)x} e^{\alpha_2 t} + A_{22} \cdot e^{-\gamma_2(\alpha_2)x} e^{\alpha_2 t}$$

$$V_2(x,t) = B_{11} \cdot e^{-\gamma_1(\alpha_1)x} e^{\alpha_1 t} + B_{21} \cdot e^{-\gamma_2(\alpha_1)x} e^{\alpha_1 t} +$$
$$B_{12} \cdot e^{-\gamma_1(\alpha_2)x} e^{\alpha_2 t} + B_{22} \cdot e^{-\gamma_2(\alpha_2)x} e^{\alpha_2 t}$$

or, $$V_1(x,t) = A_{11} \cdot e^{-A_{SD_{11}}(x-v_{SD_{11}}t)} + A_{21} \cdot e^{-A_{SD_{21}}(x-v_{SD_{21}}t)} +$$
$$A_{12} \cdot e^{-A_{SD_{12}}(x-v_{SD_{12}}t)} + A_{22} \cdot e^{-A_{SD_{22}}(x-v_{SD_{22}}t)}$$

$$V_2(x,t) = B_{11} \cdot e^{-A_{SD_{11}}(x-v_{SD_{11}}t)} + B_{21} \cdot e^{-A_{SD_{21}}(x-v_{SD_{21}}t)} +$$
$$B_{12} \cdot e^{-A_{SD_{12}}(x-v_{SD_{12}}t)} + B_{22} \cdot e^{-A_{SD_{22}}(x-v_{SD_{22}}t)}$$

Where:

$A_{SD_{11}} = \gamma_1(\alpha_1)$, $A_{SD_{12}} = \gamma_1(\alpha_2)$, $A_{SD_{21}} = \gamma_2(\alpha_1)$, and $A_{SD_{22}} = \gamma_2(\alpha_2)$.

$v_{SD_{11}} = \dfrac{\alpha_1}{\gamma_1(\alpha_1)}$, $v_{SD_{12}} = \dfrac{\alpha_2}{\gamma_1(\alpha_2)}$, $v_{SD_{21}} = \dfrac{\alpha_1}{\gamma_2(\alpha_1)}$, and $v_{SD_{22}} = \dfrac{\alpha_2}{\gamma_2(\alpha_2)}$.

Thus, there are SD attenuations and velocities associated with each eigenvalue, $\gamma_i$, of the product $\overline{ZY}$ evaluated at each $\alpha$.

Because positive exponential waveforms continually increase, practical considerations may create the need to truncate or limit the waveform at some level determined by the specific application. Truncation may be accomplished by several methods, as is known in the art.

The result of this truncation of the input of a transmission media is that the propagating exponential (SD) signal is also limited in magnitude as it travels in the media, and in lossy media, this maximum amplitude decreases with distance traveled exhibiting an attenuating behavior.

The propagating (SD) signal is described in the coordinate frame, $(x, t)$, by $V(x,t) = De^{-A_{SD}(\alpha)[x-v_{SD}(\alpha)\cdot t]} = De^{\alpha \cdot t} e^{-A_{SD}(\alpha)\cdot x}$, where $A_{SD}(\alpha)v_{SD}(\alpha) = \alpha$.

Figure 1A:
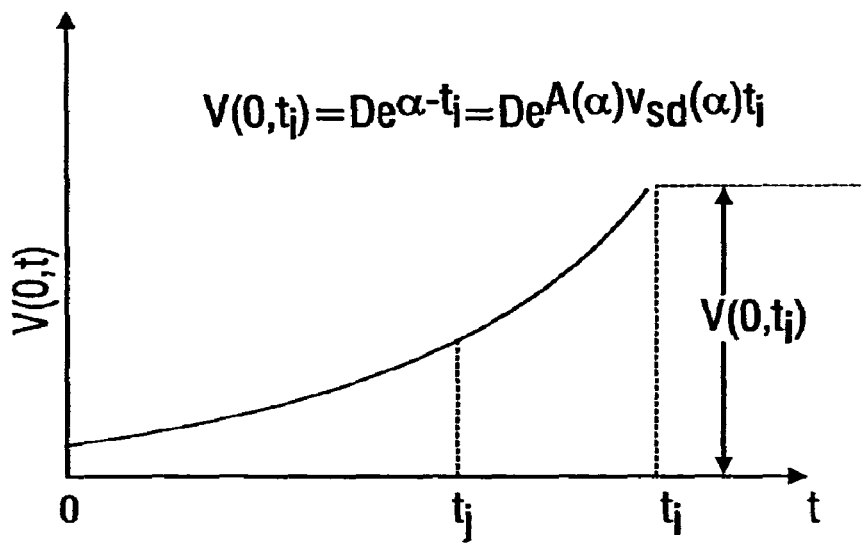
FIG. 1A is a graph of an SD waveform for (x=0, t), representing an embodiment of the invention.

Referring to FIG. 1A, a graph of an SD waveform for $(x=0,t)$ is depicted. The truncated input waveform at $x=0$ reaching a limit at $t=t_i$ is shown.

In the case of a four parameter (LCRG) transmission line, we have the expressions $$A_{SD}(\alpha) = \sqrt{LC\alpha^2 + (RC+LG)\alpha + RG},$$
$$\text{and } v_{SD}(\alpha) = \dfrac{\alpha}{\sqrt{LC\alpha^2 + (RC+LG)\alpha + RG}}.$$

The attenuation of the traveling SD wave may be viewed from the perspective of a moving reference frame traveling at the speed $1/\sqrt{LC}$.

Introducing the new coordinates:

$t' = t - x\sqrt{LC}$.

$x' = x$

Then $$V(x',t') = De^{-A_{SD}(\alpha)\cdot[x'-v_{SD}(\alpha)\cdot(t'+x'\cdot\sqrt{LC})]},$$

or $$V(x',t') = De^{\alpha \cdot t'} e^{-A_{SD}(\alpha)\cdot[1-v_{SD}(\alpha)\cdot\sqrt{LC}]\cdot x'}.$$

If we view the traveling wave after traveling a distance, $x = x' = l$, in the transmission media, then $$V(l,t') = De^{\alpha \cdot t'} e^{-A_{SD}(\alpha)\cdot[1-v_{SD}(\alpha)\cdot\sqrt{LC}]\cdot l}.$$

Setting $t' = t_j$, yields the maximum value of the truncated SD waveform at $x=l$, and for any value $0 \leq t_j \leq t_i$, the value of the signal at the associated point $t_j$ in the moving reference frame at $x=l$ is:

$$V(l,t_j) = De^{\alpha \cdot t_j} e^{-A_{SD}(\alpha)\cdot[1-v_{SD}(\alpha)\cdot\sqrt{LC}]\cdot l}.$$

Figure 1B:
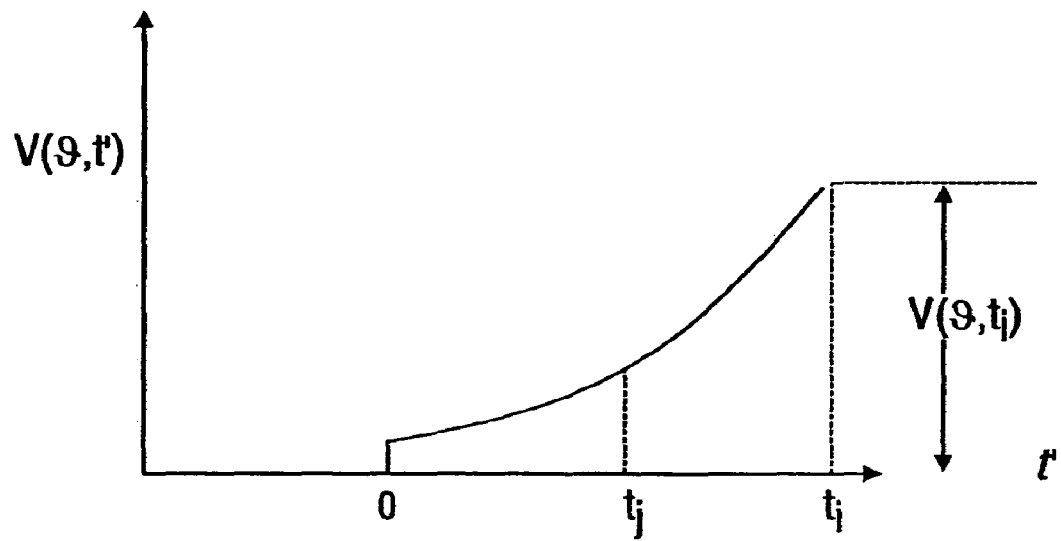
FIG. 1B is a graph of an SD waveform in moving frame at x'=l (x=l, t'), representing an embodiment of the invention.

Referring to FIG. 1B, a graph of an SD waveform in moving frame at $x'=l$ $(x=l,t')$ is depicted. The attenuation of this truncated waveform is defined by the ratio:

$$\dfrac{V(l,t_j)}{V(0,t_j)} = \dfrac{De^{\alpha \cdot t_j} e^{-A_{SD}(\alpha)\cdot[1-v_{SD}(\alpha)\cdot\sqrt{LC}]\cdot l}}{De^{\alpha \cdot t_j}}$$
$$= e^{-A_{SD}(\alpha)\cdot[1-v_{SD}(\alpha)\cdot\sqrt{LC}]\cdot l}$$

This attenuation of the signal at a point $t_j$ of a truncated SD waveform traveling in a transmission line with frequency dependent parameters whose Laplace transforms are $\overline{L}(s)$, $\overline{C}(s)$, $\overline{R}(s)$, and $\overline{G}(s)$, is:

$$\dfrac{V(l,t_j)}{V(0,t_j)} = e^{-\overline{A}_{SD}(\alpha)\cdot[1-v_{SD}(\alpha)\cdot\sqrt{\overline{LC}(\alpha)}]\cdot l}$$

where:

$$\overline{A}_{SD}(\alpha) = \sqrt{\overline{LC}(\alpha)\cdot\alpha^2 + (\overline{RC}(\alpha)+\overline{LG}(\alpha))\cdot\alpha + \overline{RG}(\alpha)}, \text{ and}$$

$$\overline{v}_{SD}(\alpha) = \dfrac{\alpha}{\sqrt{\overline{LC}(\alpha)\cdot\alpha^2 + (\overline{RC}(\alpha)+\overline{LG}(\alpha))\cdot\alpha + \overline{RG}(\alpha)}}.$$

Furthermore, in this transmission media with frequency dependent parameters, if the input exponential pulse is rapidly closed when the exponential amplitude truncation limit is reached, then the end of the exponential region of the leading edge of the transmitted pulse is further reduced in amplitude and rounded by the chromatic dispersion.

Coupled transmission lines can be treated in a similar fashion. The equations governing SD propagation on one of two coupled transmission lines is:

$$V_1(x,t) = A_{11} \cdot e^{-A_{SD_{11}}(x-v_{SD_{11}}t)} + A_{21} \cdot e^{-A_{SD_{21}}(x-v_{SD_{21}}t)} +$$
$$A_{12} \cdot e^{-A_{SD_{12}}(x-v_{SD_{2}}t)} + A_{22} \cdot e^{-A_{SD_{22}}(x-v_{SD_{22}}t)}.$$

Applying the substitution: $t' = t - x\sqrt{LC}$, $x' = x$, gives the result:

$$\frac{V_1(x'=l, t'=t_i)}{V_1(x=0, t=t_i)} = \frac{A_{11} \cdot e^{\alpha_1 t_i} \cdot e^{-A_{SD_{11}}(1-v_{SD_{11}}\sqrt{LC})l} +}{A_{11} \cdot e^{\alpha_1 t_i} + A_{21} \cdot e^{\alpha_1 t_i} + A_{12} \cdot e^{\alpha_2 t_i} + A_{22} \cdot e^{\alpha_2 t_i}} +$$

$$\frac{A_{21} \cdot e^{\alpha_1 t_i} \cdot e^{-A_{SD_{21}}(1-v_{SD_{21}}\sqrt{LC})l}}{}$$

$$\frac{A_{12} \cdot e^{\alpha_2 t_i} \cdot e^{-A_{SD_{12}}(1-v_{SD_{12}}\sqrt{LC})l} +}{A_{11} \cdot e^{\alpha_1 t_i} + A_{21} \cdot e^{\alpha_1 t_i} + A_{12} \cdot e^{\alpha_2 t_i} + A_{22} \cdot e^{\alpha_2 t_i}}$$

$$\frac{A_{22} \cdot e^{\alpha_2 t_i} \cdot e^{-A_{SD_{22}}(1-v_{SD_{22}}\sqrt{LC})l}}{}$$

Which can be written:

$$\frac{V_1(l, t_j)}{V_1(0 t_j)} = \frac{\left(A_{11} \cdot e^{-A_{SD_{11}}(1-v_{SD_{11}}\sqrt{LC})l} + A_{21} \cdot e^{-A_{SD_{21}}(1-v_{SD_{21}}\sqrt{LC})l}\right)}{(A_{11}+A_{21}) + (A_{12}+A_{22}) \cdot e^{(\alpha_2-\alpha_1)t_i}} +$$

$$\frac{\left(A_{12} \cdot e^{-A_{SD_{12}}(1-v_{SD_{12}}\sqrt{LC})l} + A_{22} \cdot e^{-A_{SD_{22}}(1-v_{SD_{22}}\sqrt{LC})l}\right)}{(A_{11}+A_{21}) \cdot e^{(\alpha_1-\alpha_2)t_i} + (A_{12}+A_{22})}.$$

Another example includes of the evolution of a slowly varying envelope, E(x, t), of an optical pulse in a single mode communication fiber. The Schrödinger partial differential equation [3], $$\frac{\partial E}{\partial x} + \beta_1 \frac{\partial E}{\partial t} - \frac{j}{2}\beta_2 \frac{\partial^2 E}{\partial t^2} - \frac{1}{6}\beta_3 \frac{\partial^3 E}{\partial t^3} = -\frac{\gamma}{2}E,$$

describes the evolution of the shape of the propagating pulse envelope undergoing chromatic dispersion in fiber. Chromatic dispersion occurs because the mode-propagation constant, β(ω), is a nonlinear function of the angular frequency ω, where $$\beta_n = \left[\frac{\partial^n \beta}{\partial \omega^n}\right]_{\omega=\omega_o}$$

and $\omega_o$ is the frequency of the light being modulated in the fiber.

$\omega_o/\beta_o$ is the phase velocity of the pulse. $1/\beta_1$ is the group velocity, $\beta_2$ is the group velocity dispersion (GVD) parameter which causes the pulse to broaden as it propagates in the fiber. $\beta_3$ is the third-order dispersion (TOD) parameter [4]

The higher order derivatives of β with respect to ω are assumed negligible. However, they may be added in these analyses by anyone familiar with the art. The fiber attenuation is represented by the parameter γ.

The SD solution of the linear Schrödinger equation with loss (γ≠0) is:

$$E(x, t) = De^{\left[\frac{t}{T_o} - \left(\frac{\beta_1}{T_o} - \frac{\beta_3}{6T_o^3} + \frac{\gamma}{2}\right)x\right]} e^{j\left(\frac{\beta_2 \cdot x}{2T_o^2}\right)}.$$

The boundary condition at the input to the fiber at $x=0$ is $E(0, t) = De^{\frac{t}{T_o}}$, (see FIG. 1A with $$\alpha = \frac{1}{T_o}\bigg).$$

The receiver detector in a fiber optic communication network responds to the square of the magnitude $|E(x, t)|^2$ of the propagating pulse envelope. In this case $$|E(x,t)|^2 = D^2 e^{-2 \cdot A(T_o)[x-v_{sd}(T_o) \cdot t]},$$

where the velocity of propagation of a truncated SD leading edge of the envelope is $$v_{sd}(T_o) = \frac{1}{\left(\beta_1 - \frac{\beta_3}{6T_o^2} + \frac{T_o \gamma}{2}\right)}, \text{ and } A(T_o) = \left(\frac{\beta_1}{T_o} - \frac{\beta_3}{6T_o^3} + \frac{\gamma}{2}\right).$$

Note that $$v_{sd}(T_o) \cdot A(T_o) = \frac{1}{T_o}.$$

Transforming to a moving reference frame traveling at the group velocity $1/\beta_1$, $t'=t-\beta_1 x$.

x'=x

The SD propagation speed in this moving reference frame is $$\overline{v}_{sd}(T_o)|_{in\ x',t'\ frame} = \frac{1}{T_o\left(\frac{\gamma}{2} - \frac{\beta_3}{6T_o^3}\right)},$$

The attenuation of the truncated SD portion of the leading edge of the pulse envelope is $$\frac{|E(l, t_j)|^2}{|E(0, t_j)|^2} = e^{-\left(\frac{\gamma}{2} - \frac{\beta_3}{6T_o^3}\right)l}.$$

This result implies that if $T_o$ can be made small enough, this attenuation may be reduced. Higher order terms of β(ω), which were not included is this particular analysis, may become more significant as $T_o$ become smaller.

EXAMPLES

Specific embodiments of the invention will now be further described by the following, nonlimiting examples which will serve to illustrate in some detail various features. The following examples are included to facilitate an understanding of ways in which the invention may be practiced. It should be appreciated that the examples which follow represent embodiments discovered to function well in the practice of the invention, and thus can be considered to constitute preferred modes for the practice of the invention. However, it should be appreciated that many changes can be made in the exemplary embodiments which are disclosed while still obtaining like or similar result without departing from the spirit and scope of the invention. Accordingly, the examples should not be construed as limiting the scope of the invention.

Example 1

Method for Determining SD Waveform Parameters, $A_{SD}$ and $v_{SD}$

This example teaches how SD test pulses may be used to obtain empirical estimates of the transmission line parameters, $A_{SD}$ and $v_{SD}$, that describe the propagation of SD waveforms in lossy, dispersive lines, including those with frequency dependent parameters. The numerical values of $A_{SD}$ and $v_{SD}$ as a function of $\alpha$ can be determined empirically.

Figure 2:
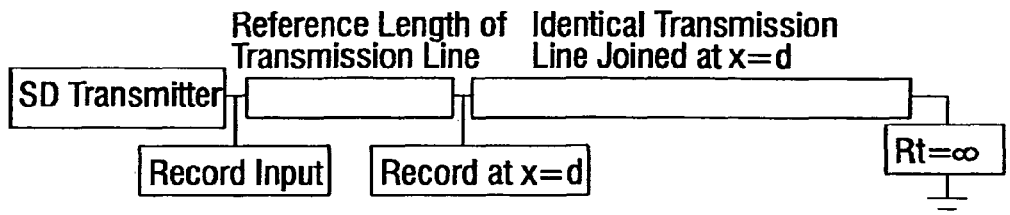
FIG. 2 is block diagram of a setup to measure SD parameters, representing an embodiment of the invention.

Referring to FIG. 2, an experimental set up that may be used to determine these parameters for a copper, twisted wire pair transmission line is depicted. The test length of the transmission line, d, and the value of $\alpha$ for the applied SD input signal are measured. An additional length of transmission line that is identical to the line under test is attached as shown and terminated with an open circuit. In this example the cables are two 24 AWG, individually shielded, twisted wire pairs in a 1002 ft coil of T1 cable.

The values of D, $\alpha$ and the duration of the SD signal were chosen to prevent the occurrence of reflections at the measurement point, d, during the initial time of flight of the SD signal propagating in the test line. The additional length of transmission line also ensures that all reflections occurring in the test line are delayed until well after the propagating SD waveform measurement at d is complete.

Figure 3:
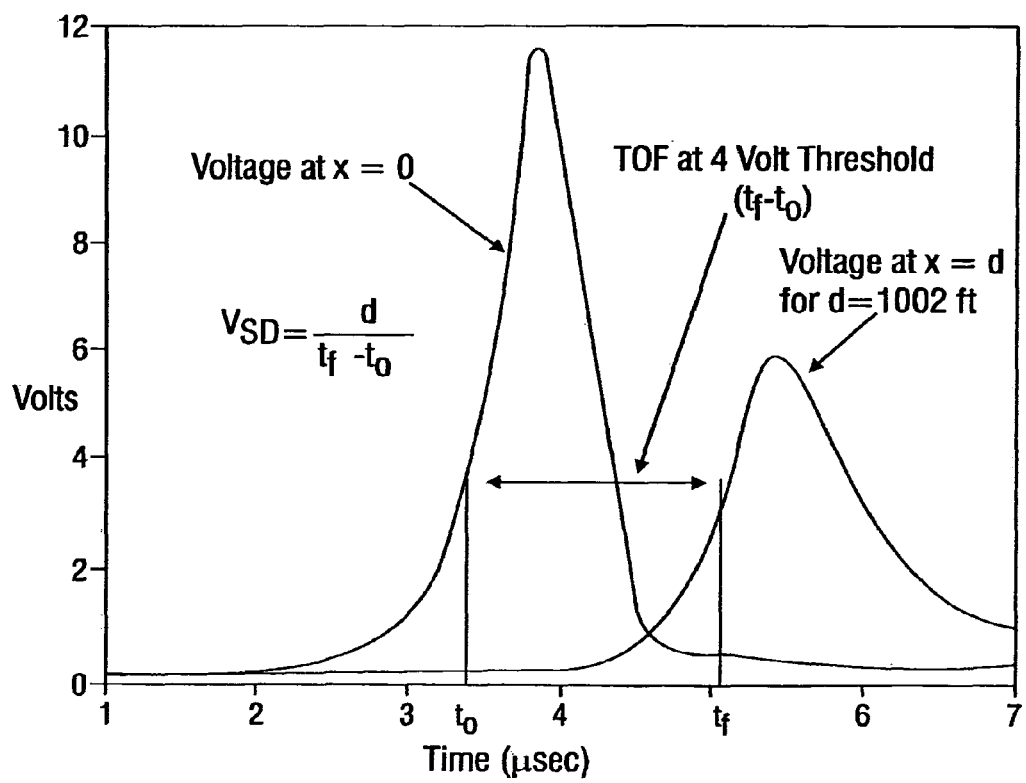
FIG. 3 is a graph of voltage traces at x=0 and x=1002 ft of a 2004 ft transmission line (T1 cable) with $\alpha = 3.0 \times 10^6$ 1/sec indicating time-of-flight measured at 4V threshold, representing an embodiment of the invention.
Figure 4A:
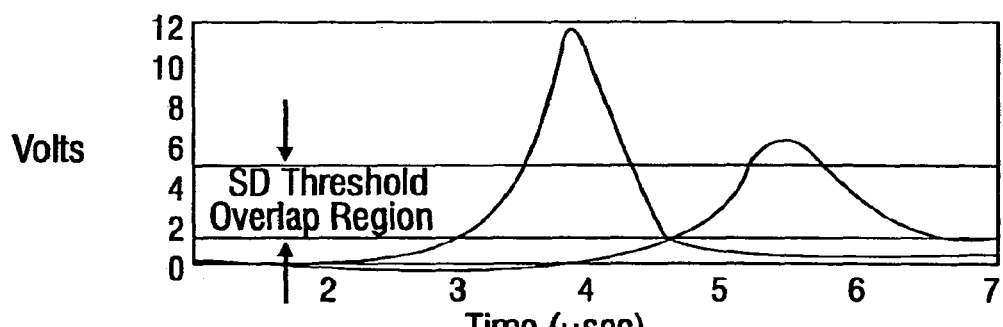
FIG. 4A is a graph of SD threshold overlap regions for voltages at x=0 and at x=d (1002 ft), representing an embodiment of the invention.
Figure 4B:
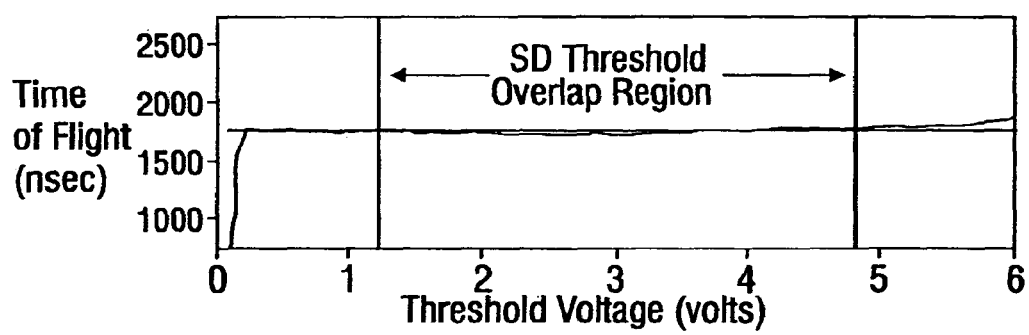
FIG. 4B is a graph of measured constant threshold times-of-flight for 1002 ft T1 line with $\alpha = 3.0 \times 10^6$ 1/sec, representing an embodiment of the invention.

The SD signal time of flight can be directly measured by timing the propagating SD waveform crossing of a constant voltage threshold (FIG. 3). The value of the SD signal propagation velocity in the line, $v_{SD}$, can be calculated using the relationship, $v_{SD}=d/t_f-t_o$. The times of flight for these waveforms shown again in FIG. 4A at thresholds from 1.2 volts to 4.8 volts are plotted in FIG. 4B. The average TOF for the threshold overlap region shown in FIG. 4B is 1,716 ns. This average TOF results in $$v_{SD} = \frac{d}{TOF_{AVG}} = \frac{1002 \text{ ft}}{1,716 \times 10^{-9} \text{ sec}} = 5.839 \times 10^8 \text{ ft/sec}.$$

The SD attenuation coefficient, $A_{SD}$, can be calculated from $\alpha$ and $v_{sd}$ using the relationship $A_{SD} \cdot v_{SD} = \alpha$. The calculated $A_{SD}$ obtained from the waveforms shown in FIG. 4.3a is $$A_{SD} = \frac{\alpha}{v_{SD}} = \frac{3.0 \times 10^6 \text{ 1/sec}}{5.839 \times 10^8 \text{ ft/sec}} = 5.138 \times 10^{-3} \text{ 1/ft}.$$

Once this velocity is known for a calibrated length of the cable, this type of threshold crossing TOF measurement can be used to determine the unknown length of another sample of the same transmission line.

Figure 5A:
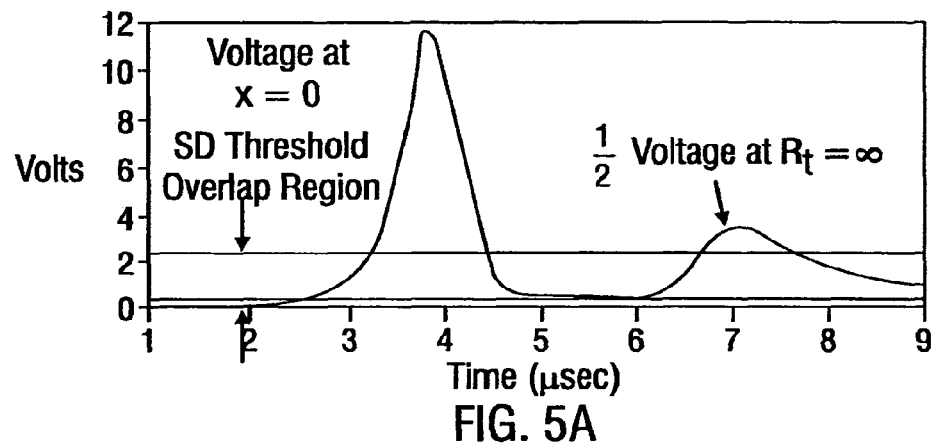
FIG. 5A is a graph of SD threshold overlap regions for voltages at x=0 and ½ voltage across $R_f = \infty$, representing an embodiment of the invention.
Figure 5B:
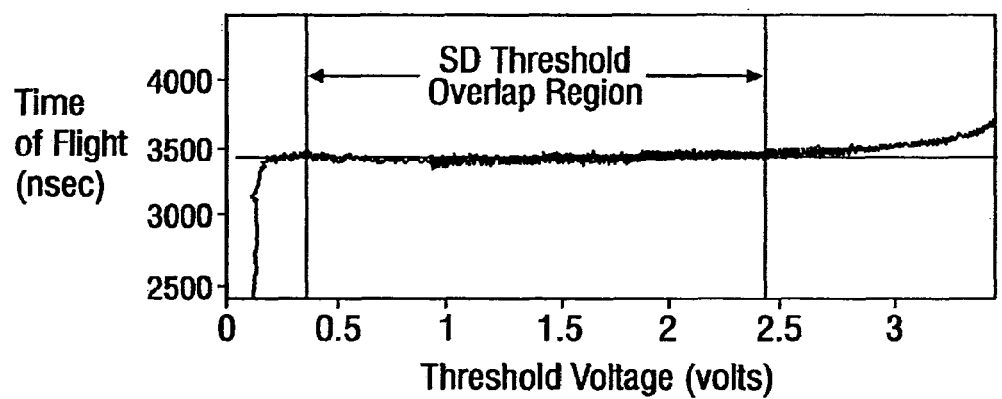
FIG. 5B is a graph of measured constant threshold times-of-flight for 2004 ft T1 line with $\alpha = 3.0 \times 10^6$ 1/sec, representing an embodiment of the invention.

Referring to FIG. 5A, the measured input voltage of the two twisted wire pairs in a T1 line connected in series is depicted (see FIG. 2) and one-half of the voltage measured at the end of the open terminated second twisted wire pair in the T1 line ($R_t=\infty$ in FIG. 2). The average TOF for the threshold overlap region shown in FIG. 5B is 3,418 ns. This time of flight together with the previously calibrated $v_{SD}$, results in an estimated distance of 1,996 ft, or 99.6% of the actual length (2004 ft).

FIG. 5A also indicates a potential difficulty in longer lines caused by the attenuation of the truncated SD pulse. The region of SD threshold overlap grows smaller as the pulse propagates, and is attenuated over longer distances. The accuracy of this measurement can be improved, and the difficulty caused by the reduced region of threshold overlap can be overcome for very long transmission lines using the TOF measurement technique discussed in example 4.

The high accuracy of this method results from the use of an average of TOF measurements taken over a range of signal threshold amplitudes. It is feasible to use the average of these values to improve the accuracy of the measurement of TOF since all points on the leading SD edge of the waveform travel at the same speed. This is in contrast with the current time domain reflectometry art in which a measurement of the time of emergence of the dispersing test pulse is attempted. This is equivalent to attempting to accurately measure the threshold crossing time of the pulse at a zero threshold level when the slope of the pulse is also nearly zero.

Example 2

Extracting SD Parameters from Empirical Transfer Function

The method described in example 1 can be limiting in that it should be experimentally repeated for each exponential coefficient $\alpha$. This may require a lengthy laboratory calibration time for each cable type. Simulation can be included in the calibration process to significantly reduce the experimental measurements needed to determine the values of $A_{SD}$ and $v_{SD}$. The use of simulation in this process requires a transfer function that describes the response of the specific type of cable. The $\alpha$'s analyzed for the T1 cable range from $1 \times 10^5$ sec$^{-1}$ to $1 \times 10^7$ sec$^{-1}$. This range of $\alpha$'s corresponds to the frequency band of 16 kHz to 1.6 MHz, so the transfer function must be accurate for this range. The transfer function of the cable may available from the manufacturer or can be determined empirically by applying a known pulse and measuring the applied cable input waveform and the response waveform at a known (calibration) distance along the cable. The transfer function is then calculated from the ratio of the fast Fourier transforms (FFT) of the input-output pulses:

$$H_{est}(j\omega) = \frac{FFT(V_{Measured\ at\ l})}{FFT(V_{Applied})}.$$

Once the transfer function is determined, the propagation of SD waveforms with a series of different values for $\alpha$ can be simulated and the times of flight and SD parameters, $A_{SD}$ and $v_{SD}$, determined.

Figure 6A:
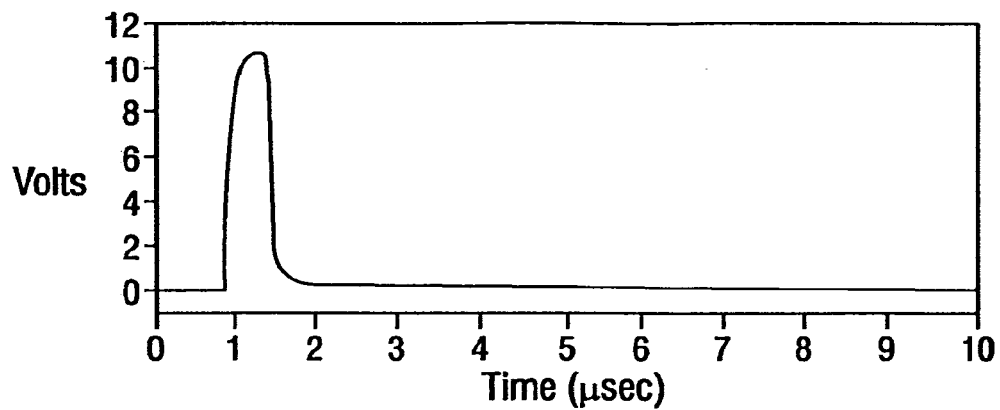
FIG. 6A is a graph of an input pulse applied to a T1 cable to empirically determine a transfer function, representing an embodiment of the invention.
Figure 6B:
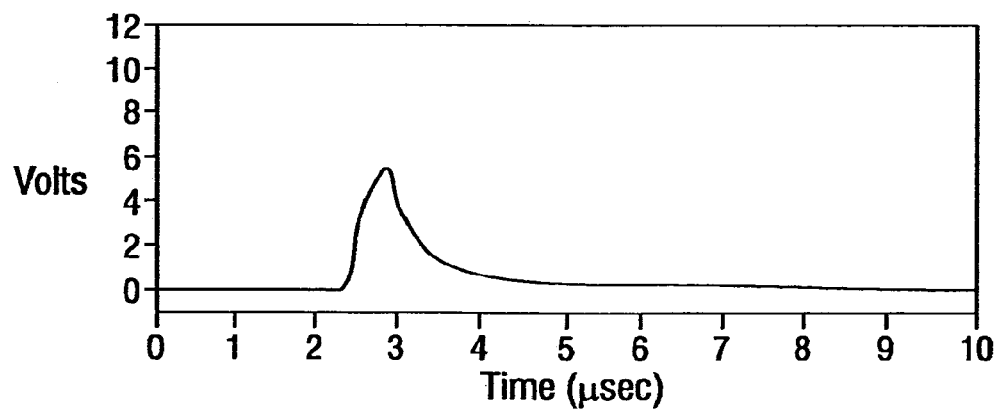
FIG. 6B is a graph of a pulse measured at 1002 ft for a T1 cable, representing an embodiment of the invention.
Figure 7A:
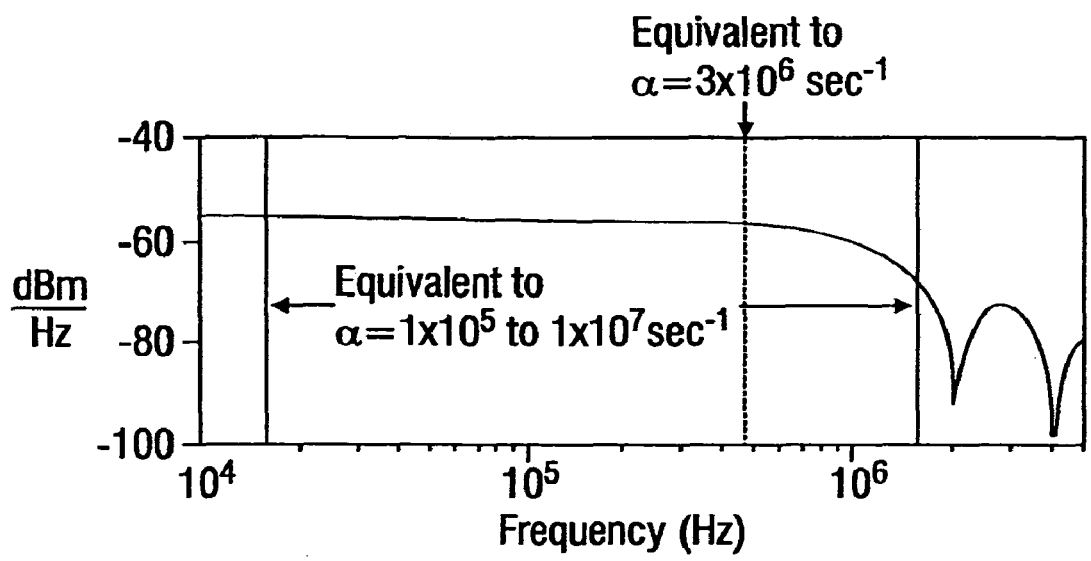
FIG. 7A is a graph of a Power Spectral Density of an input pulse applied to a T1 cable, representing an embodiment of the invention.
Figure 7B:
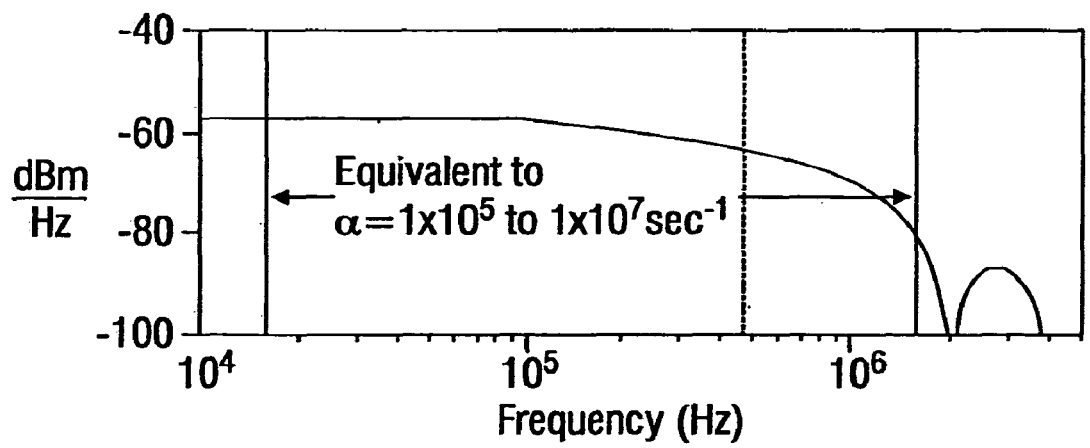
FIG. 7B is a graph of a Power Spectral Density of a pulse measured at 1002 ft for a T1 cable, representing an embodiment of the invention.
Figure 8:
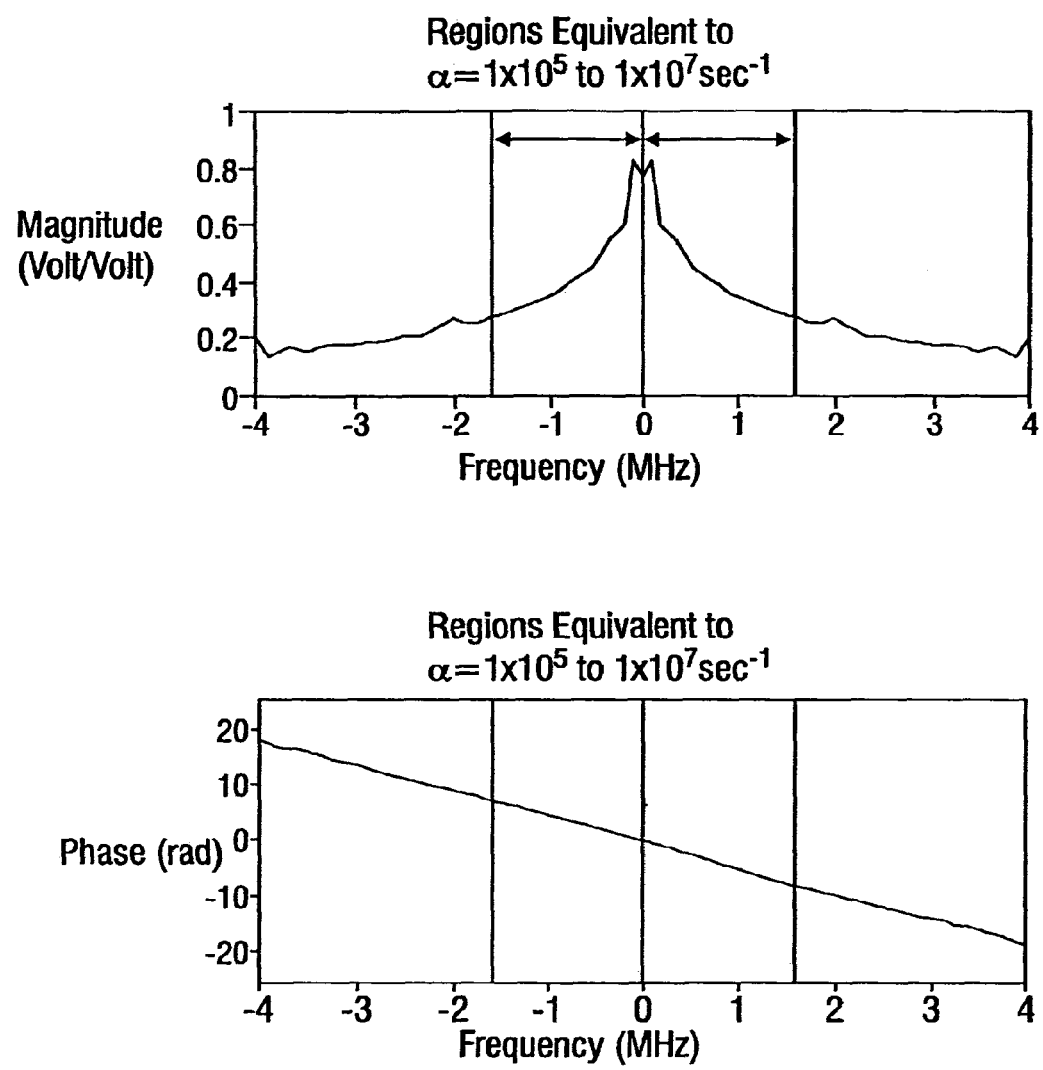
FIG. 8 is a graph of an empirically derived transfer function for a 1002 ft T1 cable, representing an embodiment of the invention.

This method can be demonstrated for the T1 cable used in example 1. The end of the total 2004 length has been terminated with a 100-Ohm resistor ($R_t$ in FIG. 2) to minimize reflections at the 1002 ft measurement point. FIG. 6A shows a measured input pulse applied to the T1. FIG. 6B shows the output pulse measured at 1002 ft. FIGS. 7A-B show the Power Spectral Density of the measured pulses. The range of $\alpha$'s is indicated to show that there is sufficient energy in the frequency band of interest to empirically estimate an accurate transfer function. The magnitude and the phase of the transfer function determined from the measured signals are shown in FIG. 8.

Figure 9:
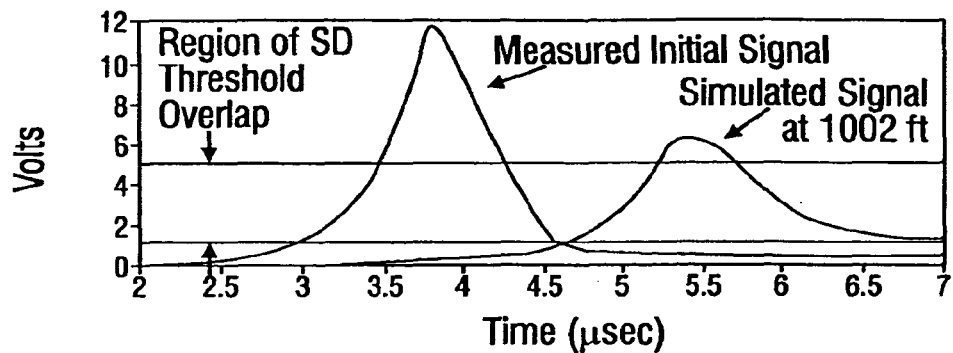
FIG. 9 is a graph of a measured initial waveform with simulated 1002 ft waveform for T1 cable and constant threshold times-of-flight, representing an embodiment of the invention.
Figure 9:
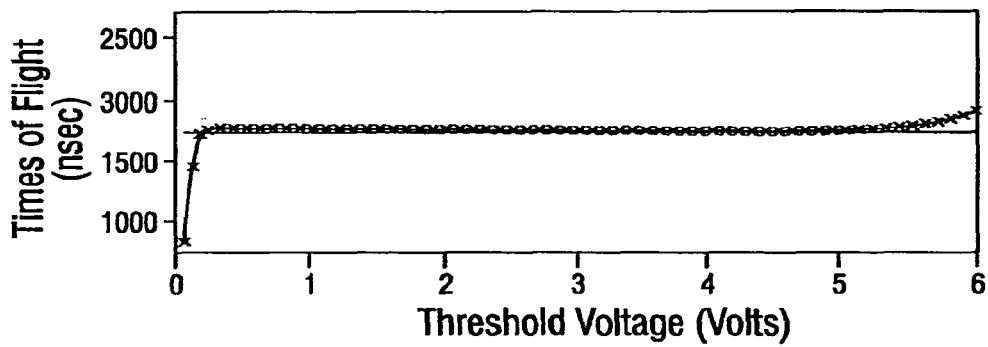
Figure 10:
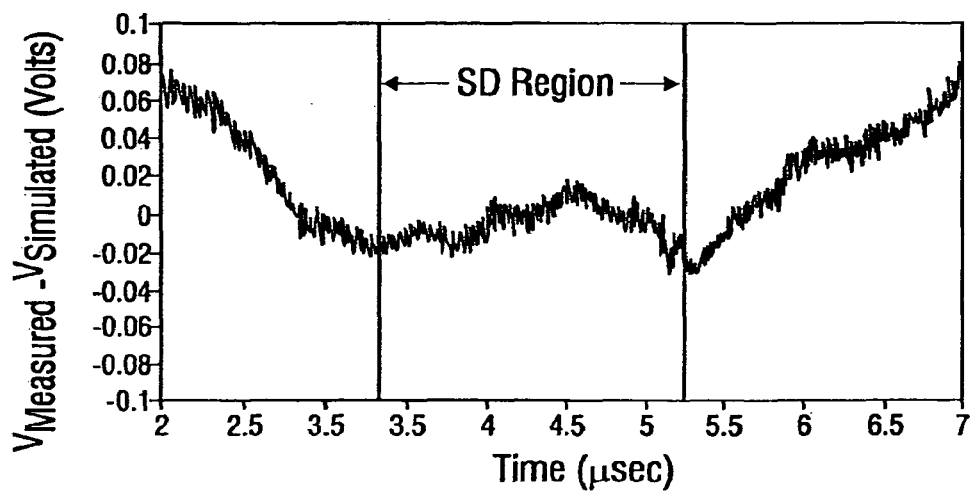
FIG. 10 is a graph of a difference between measured and simulated 1002 ft voltage traces, representing an embodiment of the invention.

Once the transfer function is known, a waveform with any $\alpha$ in the indicated range of interest can be simulated and the value of $A_{SD}$ and $v_{SD}$ determined. The values of $A_{SD}$ and $v_{SD}$ of the measured SD waveforms of Example 1 provide a test of the transfer function for an $\alpha$ of $3 \times 10^6$ sec$^{-1}$. FIG. 9 shows the time of flight plots determined using the input signal measured in Example 1 (FIG. 4A), and the 1002 ft waveform predicted by simulation using the empirical transfer function. The simulation TOF result (FIG. 9) of 1,714 nsec is almost identical to the experimentally measured (FIG. 4B) TOF of 1,716 nsec. FIG. 10 shows the difference between the measured waveform at 1002 ft and the simulated waveform at 1002 ft (FIG. 9, Top). During the SD propagation region the difference is on the order of ±20 mV.

Figure 11:
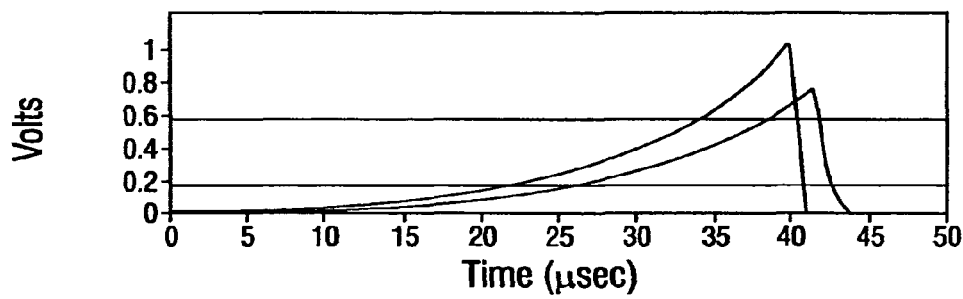
FIG. 11 is a graph of a simulated initial waveform with 1002 ft waveform for T1 cable, $\alpha = 1 \times 10^5$ sec$^{-1}$, and constant threshold times-of-flight, representing an embodiment of the invention.
Figure 11:
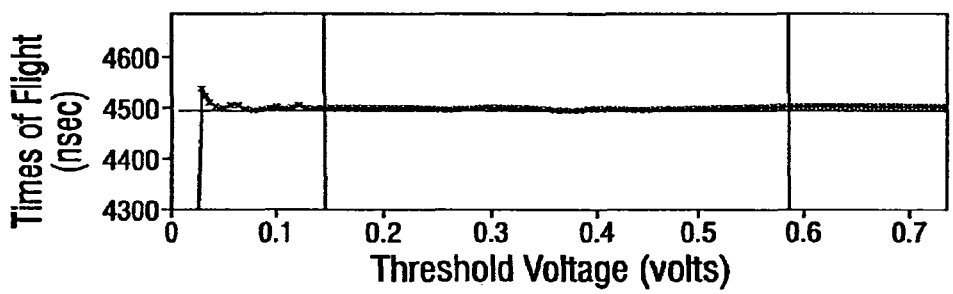
Figure 12:
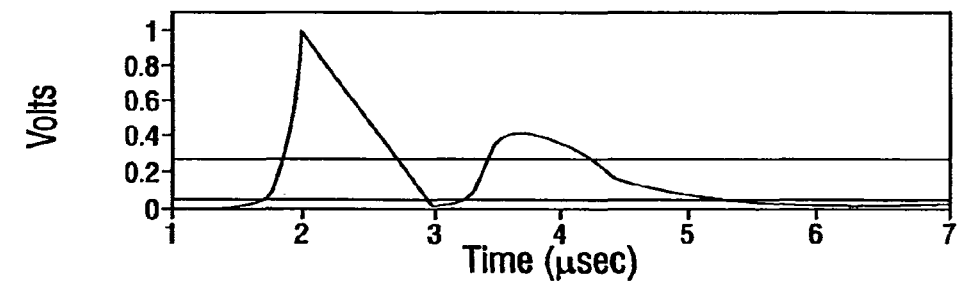
FIG. 12 is a graph of a simulated initial waveform with 1002 ft waveform for T1 cable, $\alpha = 1 \times 10^7$ sec$^{-1}$, and constant threshold times-of-flight, representing an embodiment of the invention.
Figure 12:
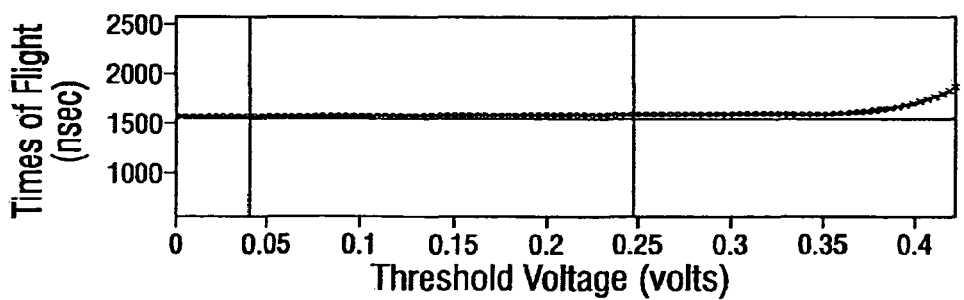
Figure 13A:
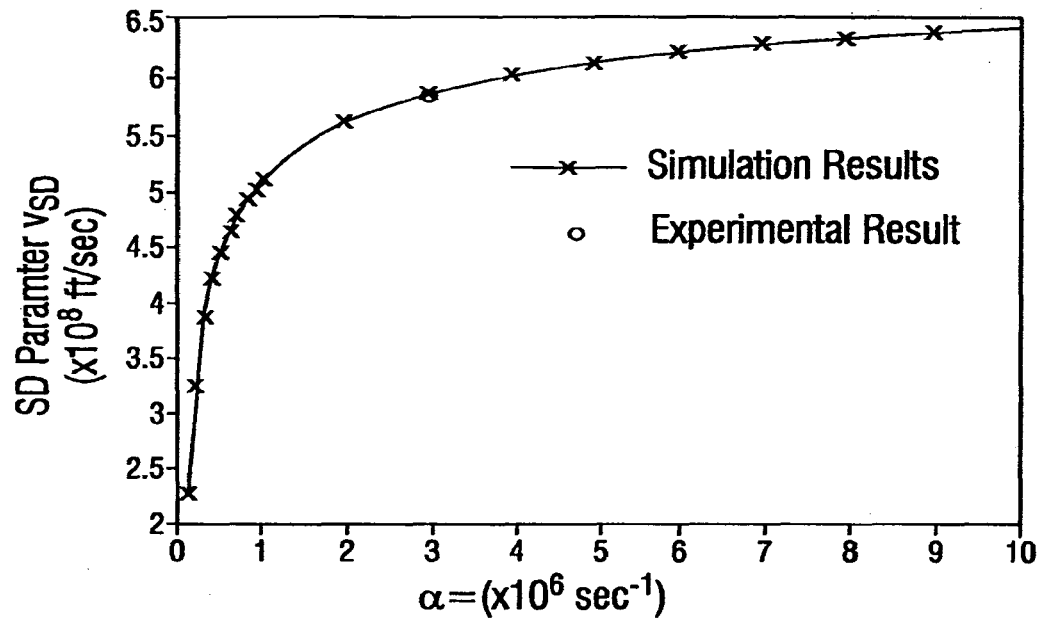
FIG. 13A is a graph of SD parameters $V_{SD}$ determined by simulation with empirical transfer function, representing an embodiment of the invention.
Figure 13B:
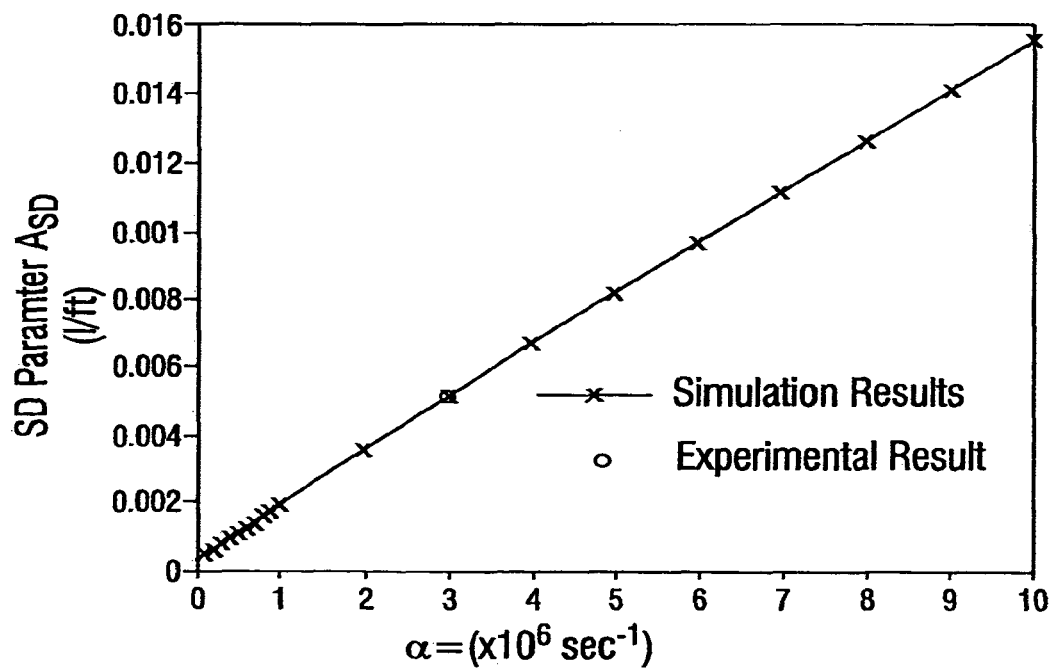
FIG. 13B is a graph of SD parameters $A_{SD}$ determined by simulation with empirical transfer function, representing an embodiment of the invention.

This process is performed for the range of $\alpha$'s by simulating the initial SD waveforms and using the transfer function to predict the waveforms at 1002 ft. In all cases, the simulated initial waveforms were closed with a 1 µsec ramp to reduce their high frequency components. FIGS. 11-12 show the simulated input and 1002 ft curves for the endpoint $\alpha$'s of $1 \times 10^5$ sec$^{-1}$ and $1 \times 10^7$ sec$^{-1}$ along with their respective constant threshold times of flight curves. The values of $v_{SD}$ and $A_{SD}$ from simulation are presented in FIGS. 13A-B, illustrated in Table I for the range of $\alpha$'s, as set forth below (* values in parenthesis obtained using methods of example 1, with measured input and output SD signals along actual T1 Line):

TABLE I $v_{SD}$ and $A_{SD}$ Determined By Simulation with Empirical Transfer Function

| Alpha (sec$^{-1}$) | 1002 Simulation TOF (µsec) | Simulation $v_{SD}$ (×10$^8$ ft/sec) | Simulation $A_{SD}$ (×10$^{-3}$ 1/ft) |
| --- | --- | --- | --- |
| $1 \times 10^5$ | 4.487 | 2.233 | 0.448 |
| $2 \times 10^5$ | 3.068 | 3.266 | 0.612 |
| $3 \times 10^5$ | 2.608 | 3.842 | 0.781 |
| $4 \times 10^5$ | 2.382 | 4.207 | 0.951 |
| $5 \times 10^5$ | 2.271 | 4.412 | 1.133 |
| $6 \times 10^5$ | 2.172 | 4.613 | 1.301 |
| $7 \times 10^5$ | 2.103 | 4.765 | 1.469 |
| $8 \times 10^5$ | 2.040 | 4.912 | 1.629 |
| $9 \times 10^5$ | 1.999 | 5.013 | 1.796 |
| $1 \times 10^6$ | 1.973 | 5.079 | 1.969 |
| $2 \times 10^6$ | 1.792 | 5.592 | 3.577 |
| $3 \times 10^6$ | 1.714 (1.716*) | 5.849 (5.839*) | 5.129 (5.138*) |
| $4 \times 10^6$ | 1.666 | 6.014 | 6.651 |
| $5 \times 10^6$ | 1.634 | 6.132 | 8.154 |
| $6 \times 10^6$ | 1.610 | 6.224 | 9.641 |
| $7 \times 10^6$ | 1.592 | 6.294 | 11.122 |
| $8 \times 10^6$ | 1.577 | 6.354 | 12.591 |
| $9 \times 10^6$ | 1.565 | 6.403 | 14.057 |
| $1 \times 10^7$ | 1.555 | 6.444 | 15.519 |

Example 3

Measurement of SD Transmission Line Impedance

The SD line impedance, $Z_{SD}(\alpha)$, is a real number which may be determined for the $\alpha$'s of interest. If the Laplace transform of the frequency dependent transmission line parameters $\overline{R}(s), \overline{L}(s), \overline{C}(s),$ and $\overline{G}(s)$, are known, then $Z_{SD}(\alpha)$ may be computed from, $$Z_{SD} = \sqrt{\frac{\alpha \overline{L}(\alpha) + \overline{R}(\alpha)}{\alpha \overline{C}(\alpha) + \overline{G}(\alpha)}}.$$

The SD line impedance, $Z_{SD}(\alpha)$, may also be experimentally determined for a test transmission line by measuring the SD portion of the voltage waveform across various known termination impedances and computing the value $Z_{SD}(\alpha)$ from the measurements. The measured SD waveform at a termination, $V_{SD}(R_t)$, consists of the sum of the incident SD waveform, $V_{SD}^+$, and a reflected SD wave. The reflected wave is the product of the SD reflection coefficient, $\Gamma$, and the incident wave. The measured SD signal at the termination will be $$V_{SD}(R_t) = (1 + \Gamma_t) \cdot V_{SD}^+ = \frac{2 \cdot R_t}{R_t + Z_{SD}} \cdot V_{SD}^+.$$

Note that all lumped and distributed impedance values are real for SD signals.

Figure 14:
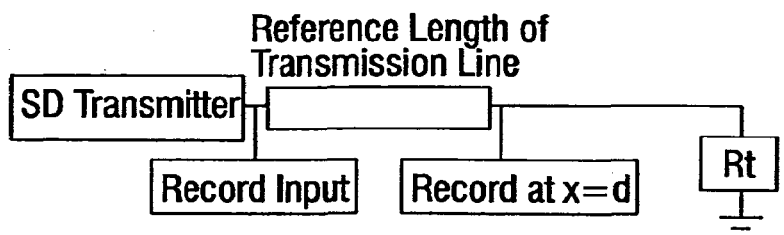
FIG. 14 is block diagram of a setup to determine $Z_{SD}(\alpha)$, representing an embodiment of the invention.
Figure 15A:
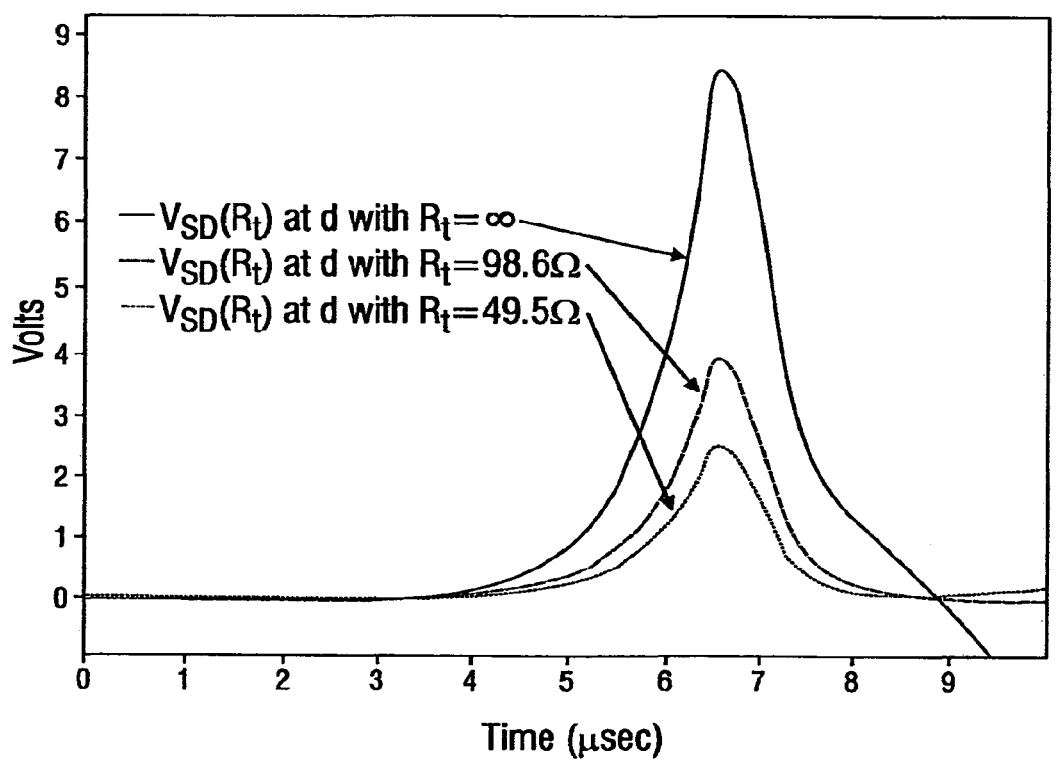
FIG. 15A is a graph of voltage traces measured at d=1002 ft with varying termination resistances, $\alpha = 1.5 \times 10^6$ 1/sec, representing an embodiment of the invention.

The experimental setup used to determine $Z_{SD}$ from line measurements is shown in FIG. 14. The measured input and termination waveforms of the voltages for a 1002 ft of T1 line, are shown in FIG. 15A. These measurements were made with an $\alpha$ of $1.5 \times 10^6$ 1/sec and termination resistances of 49.5 ohms, 98.6 ohms and an open circuit. The magnitude of the waveform with no reflection, (the incident waveform $V_{SD}^+$), is determined by dividing the signal measured with an open termination, $(+R_t = \infty, \Gamma_\infty = 1)$, in half. The ratio of the waveforms $V_{SD}(R_t)/V_{SD}^+$, with known terminations and the incident waveform gives a direct measurement of the reflection coefficient, $\Gamma_t$, for each termination resistance, $$\Gamma_t = \frac{V_{SD}(R_t)}{V_{SD}^+} - 1.$$

Figure 15B:
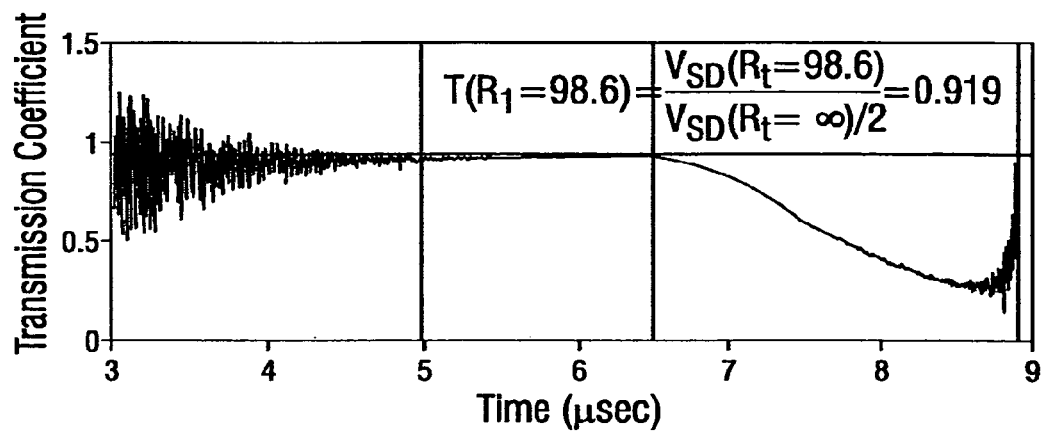
FIG. 15B is a graph of ratios of output signal amplitudes with known termination traces and one-half of line output signal amplitude for open termination trace, $\alpha = 1.5 \times 10^6$ 1/sec, representing an embodiment of the invention.
Figure 15B:
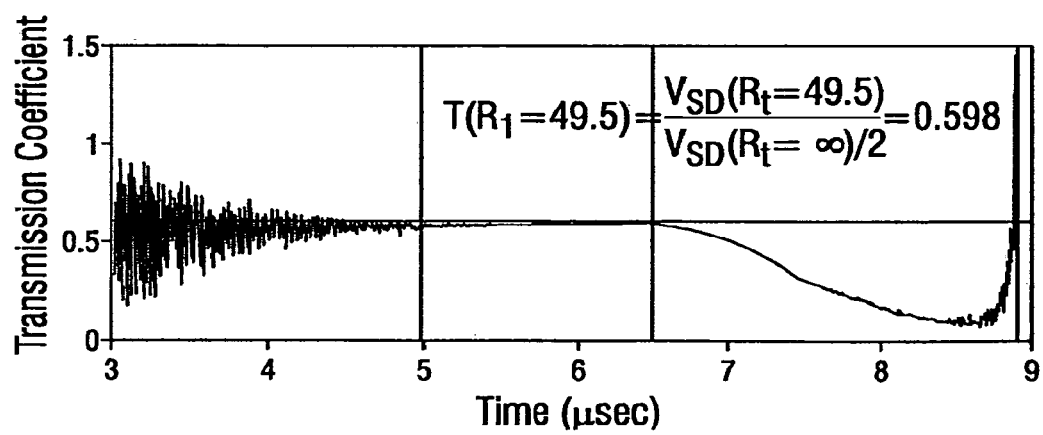

FIG. 15B shows the measured ratios for this cable and $\alpha$. Using the relationship for the transmission coefficient, $$1 + \Gamma_t = \frac{2 \cdot R_t}{R_t + Z_{SD}},$$

gives $$Z_{SD} = \frac{R_t}{1 + \Gamma_t}(1 - \Gamma_t).$$

Using the two finite values for $R_t$, 98.6 Ω and 49.5 Ω, yields two estimates for Zsd:

$$Z_{SD}\left(\alpha = 1.5 \times 10^6 \frac{1}{\text{sec}}\right) = \frac{98.6}{1 + (0.919 - 1)}\left(\frac{1-}{(0.919 - 1)}\right) = 116\Omega,$$

or $$Z_{SD}\left(\alpha = 1.5 \times 10^6 \frac{1}{\text{sec}}\right) = \frac{49.5}{1 + (0.598 - 1)}\left(\frac{1-}{(0.598 - 1)}\right) = 116\Omega,$$

for this T1 cable.

Figure 16:
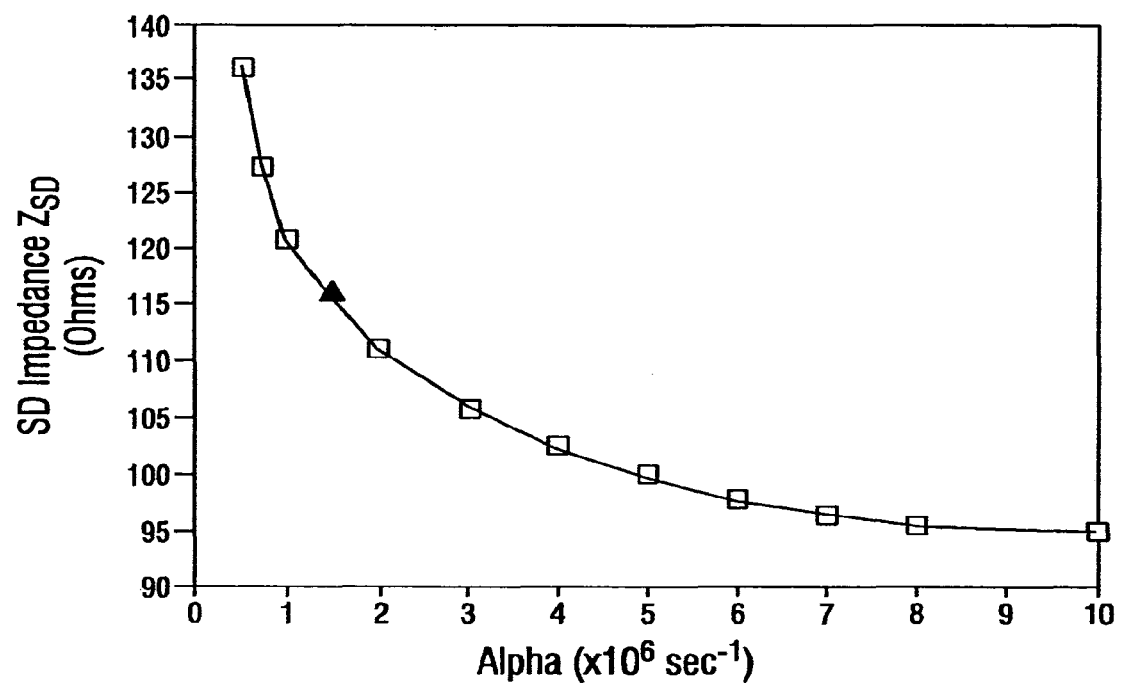
FIG. 16 is a graph of experimentally determined SD impedances for a T1 cable as a function of $\alpha$, representing an embodiment of the invention.

This process was repeated for α's from $5 \times 10^5$ sec$^{-1}$ to $10 \times 10^6$ sec$^{-1}$ and the results are shown in FIG. 16.

Example 4

Precision Measurement of Long Transmission Line Length or Distance to an Impedance Change Using a Reflected Wave This example describes an alternate precision TOF measurement method of SD test pulses for higher loss, longer lines whose attenuation of the test pulses is so extensive that their amplitudes become too small as they travel down the line for a common threshold crossing measurement to be feasible.

The time of flight measured at a constant voltage threshold becomes more difficult to estimate as the waveform is attenuated. This can be seen by examining the voltage traces along an approximately 6-kft, 24 AWG, fifty twisted wire pair, telephone cable (See FIG. 17). Three pairs of the fifty have been connected in series to generate an approximately 18-kft cable with three equal length sections. The applied SD input waveform is $De^{\alpha t}$, with D of 0.19 volts and an α of $3.5 \times 10^5$ 1/sec. This α is approximately one tenth of the α used for the 2-kft T1 cable. The smaller α is required here to reduce the attenuation of the truncated SD leading edge of the propagating pulse over these longer distances as discussed in section two. This allows signal detection over longer distances. The value of $A_{SD}$ and $v_{SD}$ for this cable and a were determined using the procedure of example 1. These measured values are based on assuming a 6000 ft calibration length for each twisted pair length inside the telephone cable. The results are $v_{SD}=4.348 \times 10^8$ ft/sec and $A_{SD}=8.279 \times 10^{-4}$ 1/ft.

Figure 17:
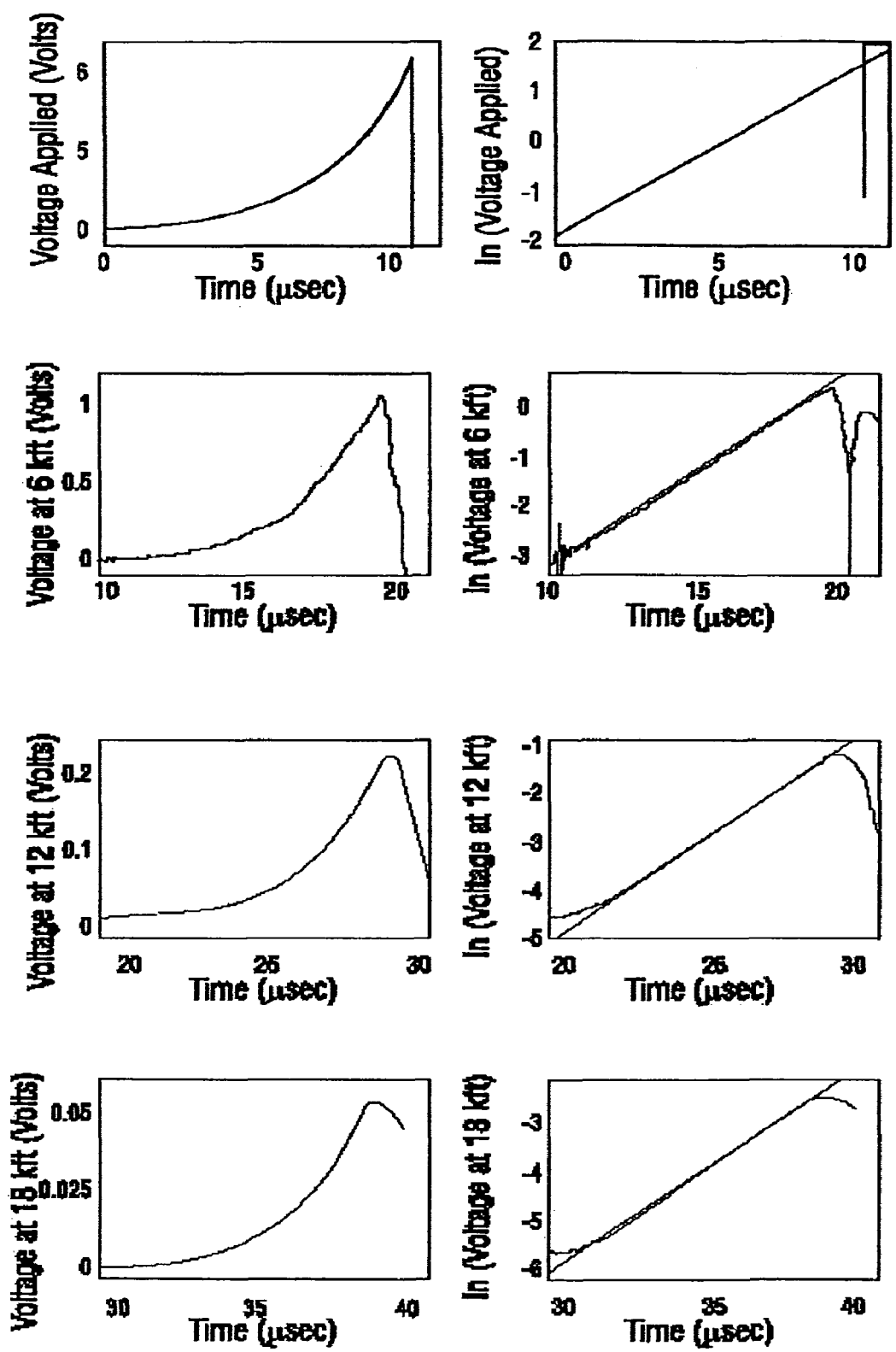
FIG. 17 is a graph of SD voltage traces and the natural logarithm of SD voltage traces measured at input, ~6 kft, ~12 kft and ~18 kft along 24 AWG twisted wire pairs connected in series, representing an embodiment of the invention.

Even though the signal was detectable at much greater distances than 6 kft, the constant threshold time of flight could not be measured. FIG. 17 shows the voltage traces measured at the input, ~6 kft, ~12 kft, and ~48 kft distances, and it also shows the preservation of shape of the SD region of the highly attenuated propagating waveform. The ~18 kft trace is corrected for the reflection from the open termination by dividing the measured waveform in half. The last two traces show that even with this smaller α, beyond 12,000 ft there is little or no SD signal above 0.19 volts. This is the value of the input SD waveform parameter D, thus there is little or no SD voltage threshold common to the input SD waveform and the SD waveforms at these longer distances.

Figure 18:
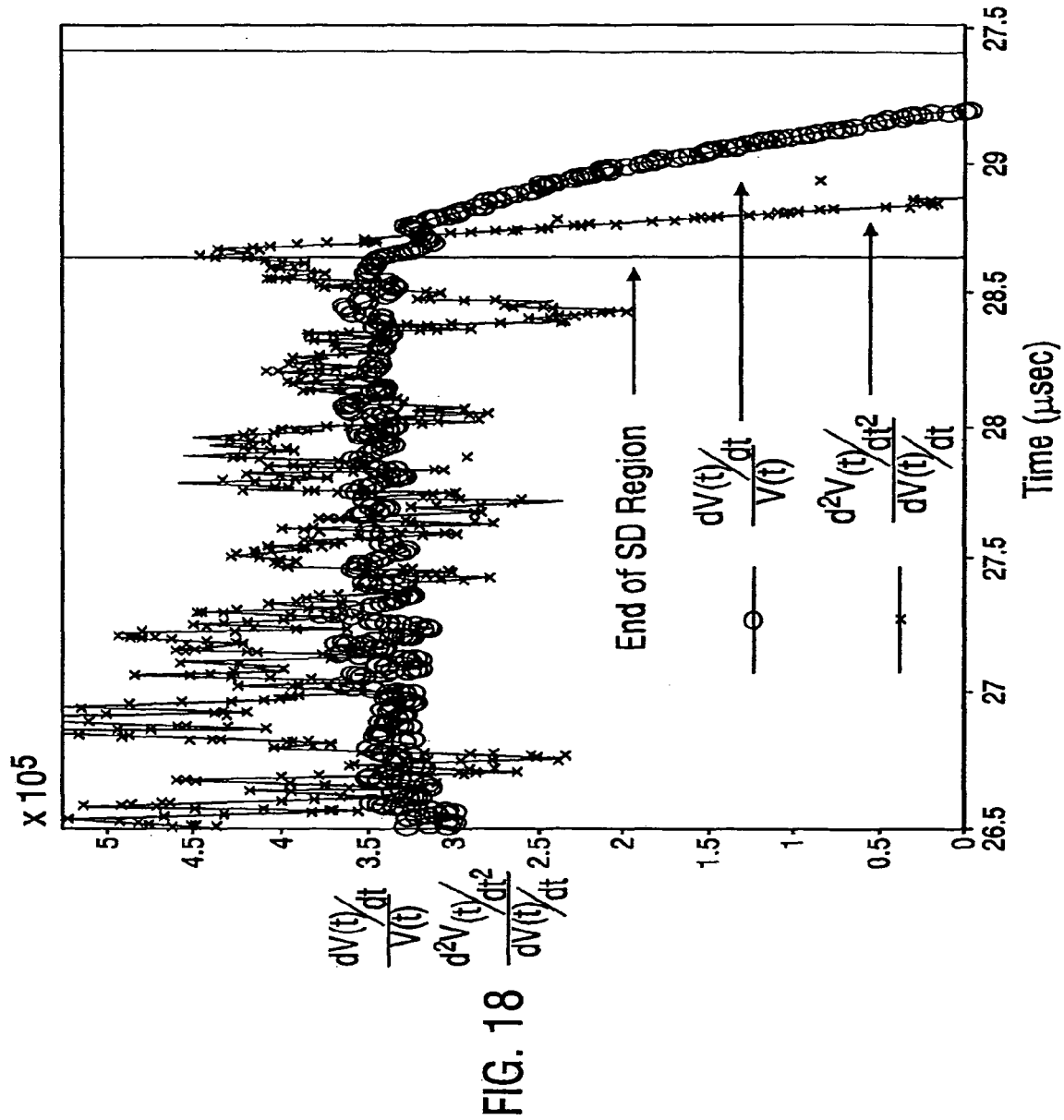
FIG. 18 is a graph used to detect end of SD region demonstrating sensitivity to noise and speed of response for the filters at 12 kft., representing an embodiment of the invention.

The first step in precisely measuring highly attenuated SD pulse time of flight is to detect the SD region of the propagating pulse, V(t), measured and recorded at the distance l along the cable. This is done by computing the ratio $$\frac{\frac{dV(t)}{dt}}{V(t)}$$

of the measured pulse waveform. In the SD region of the pulse, this ratio is α. The end of the SD region is then found by detecting the time that this ratio diverges from α. The ratio $$\frac{\frac{d^2 V(t)}{dt^2}}{\frac{dV(t)}{dt}}$$

can also be used to detect the end of the SD region. In the SD region, this ratio is also α. The later ratio of the second and first derivative responds more quickly, but is also more susceptible to noise than the ratio of the first derivative and the signal. These ratios as a function of time are plotted in FIG. 18 for the SD waveform measured at 12-kft. In general, the ratio of $$\frac{\frac{\partial^n V(x,t)}{\partial^n t}}{\frac{\partial^{n-1} V(x,t)}{\partial^{n-1} t}}$$

for any positive n will have this property. Additionally, the ratio of the signal and its integral can be used to locate the SD region. In the SD region, we have the relationship:

$$\frac{De^{\alpha t}}{\int_0^t De^{\alpha \tau} d\tau} = \frac{De^{\alpha t}}{\frac{1}{\alpha}(De^{\alpha t} - D)} = \alpha \frac{1}{1 - e^{-\alpha t}}.$$

Thus, the ratio will converge on α as time progresses. This ratio diverges at the end of the SD region. In a lossy transmission medium with constant transmission line parameters, the end of the estimated SD region can provide a good marker to determine the speed of light in the medium. The truncated SD leading edge of the pulse does not disperse, even with frequency dependent parameters. The high frequency components of the closing pulse, however, do undergo dispersion. These fast, high frequency components tend to erode the end of the truncated SD region as the pulse propagates. At long distances, these high frequency components are also more highly attenuated so the amount of SD region erosion is not proportional to the distance traveled. In this case, the detected end of the SD region serves as an initial estimate of the pulse time of flight or the distance the wave has traveled and serves to define the region examined for more precise time of flight measurements in the next step.

Figure 19:
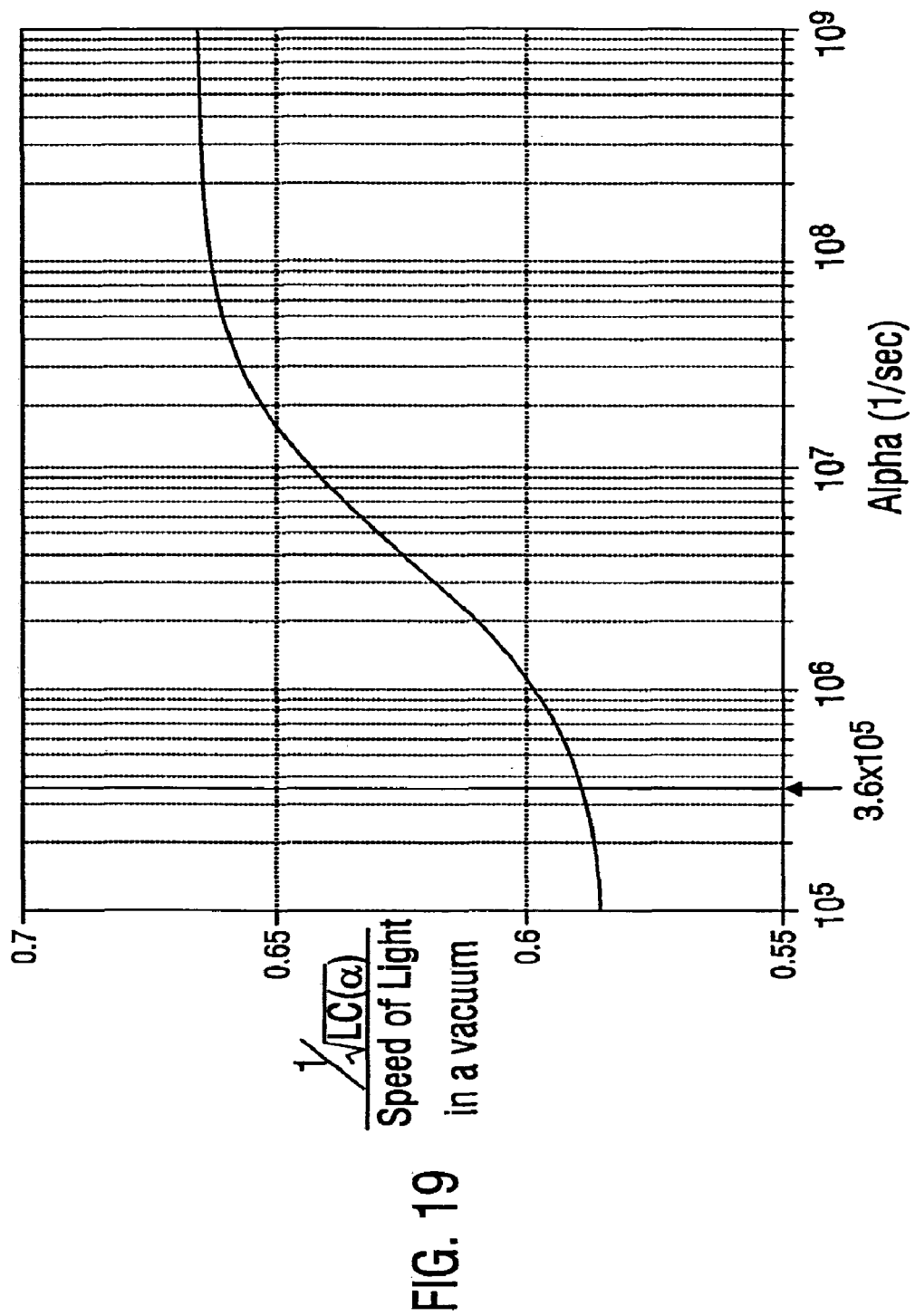
FIG. 19 is a graph of a variation of $1/\sqrt{LC}$ as a fraction of the speed of light in a vacuum with α, representing an embodiment of the invention.

The attenuation of the truncated SD signal propagating a distance d was shown to be $e^{-A_{sd}(1 - v_{sd}\sqrt{LC})d}$. In the application of time domain reflectometry (TDR) to these lines, the parameter $1/\sqrt{LC}$ is commonly referred to as Vp and is given as a fraction of the speed of light in a vacuum. The standard value of Vp used in TDR for this air core poly 24 AWG cable is 0.67. However, the value of the ratio used in this analysis is 0.59. The reason for this can be seen in FIG. 19. The value of 0.67 is appropriate for the high frequencies that are found in a standard TDR pulse used to test these telephone lines, but the a selected here for low truncated SD signal attenuation in these long lines is equivalent to a low frequency and propagates at a slower speed.

Figure 20:
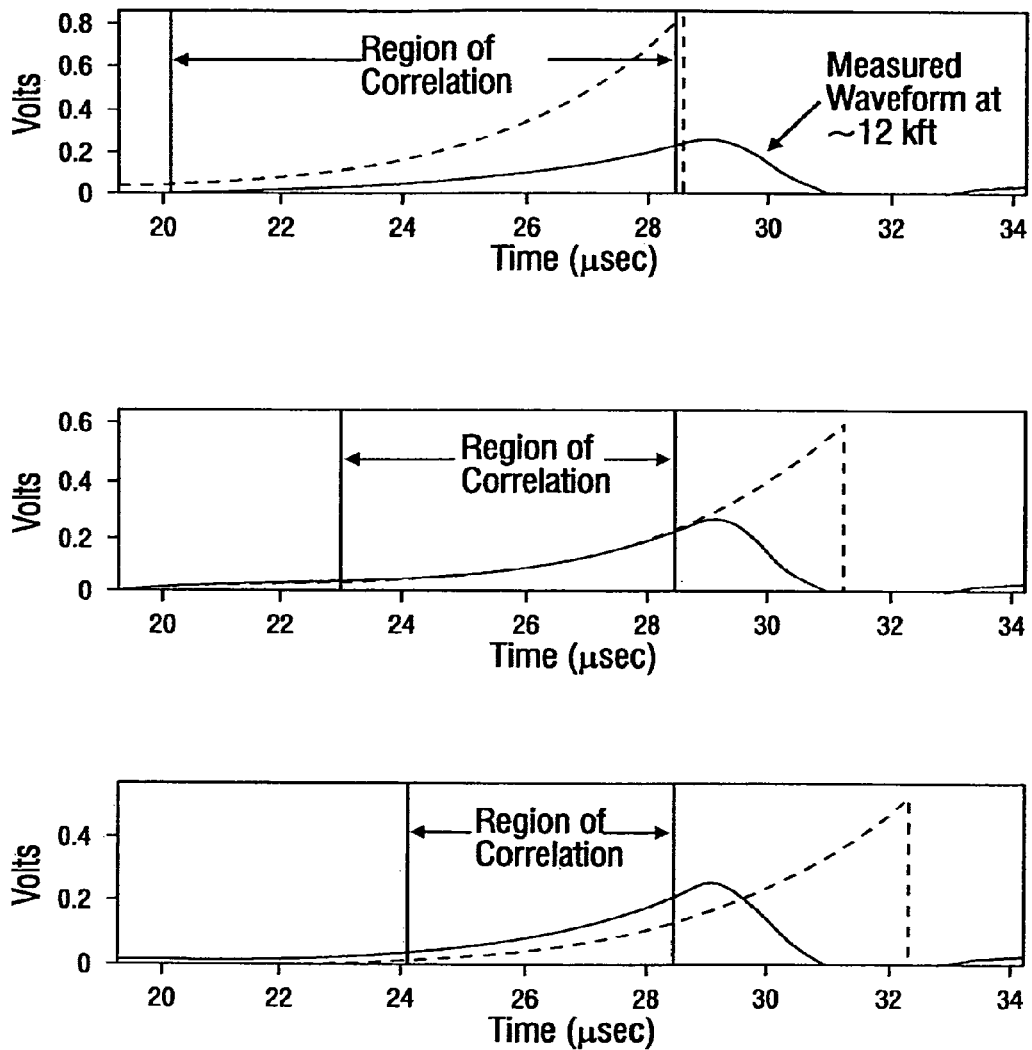
FIG. 20 is a graph of an input waveform attenuated and time shifted for 11,573 ft (Top), 12,219 ft (Middle) and 12,859 ft (Bottom) shown with waveform measured at ~12 kft, representing an embodiment of the invention.
Figure 21:
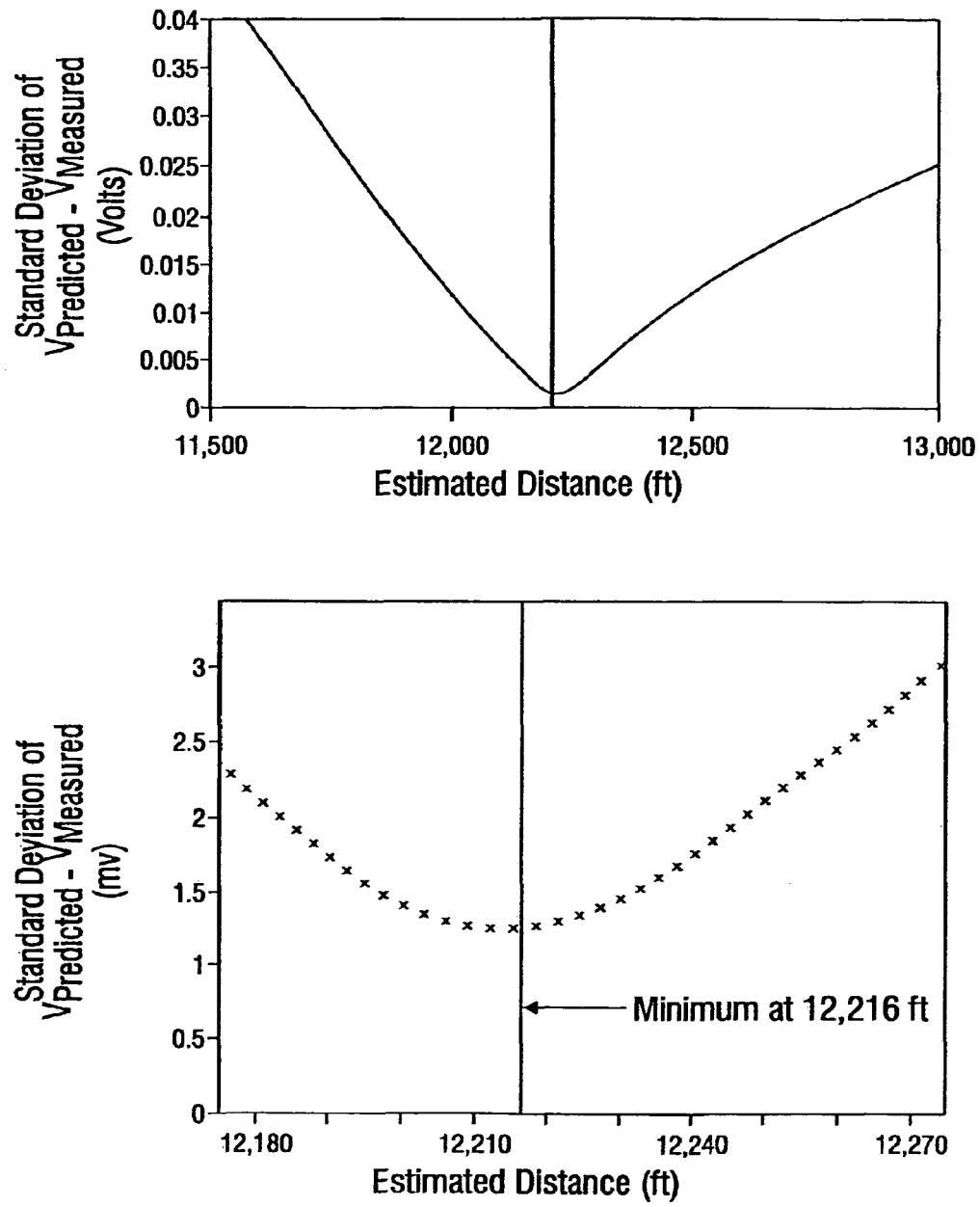
FIG. 21 is a graph of a standard deviation of $V_{predicted} - V_{Measured}$ in the SD region vs. estimated distance in region of correlation, representing an embodiment of the invention.
Figure 22A:
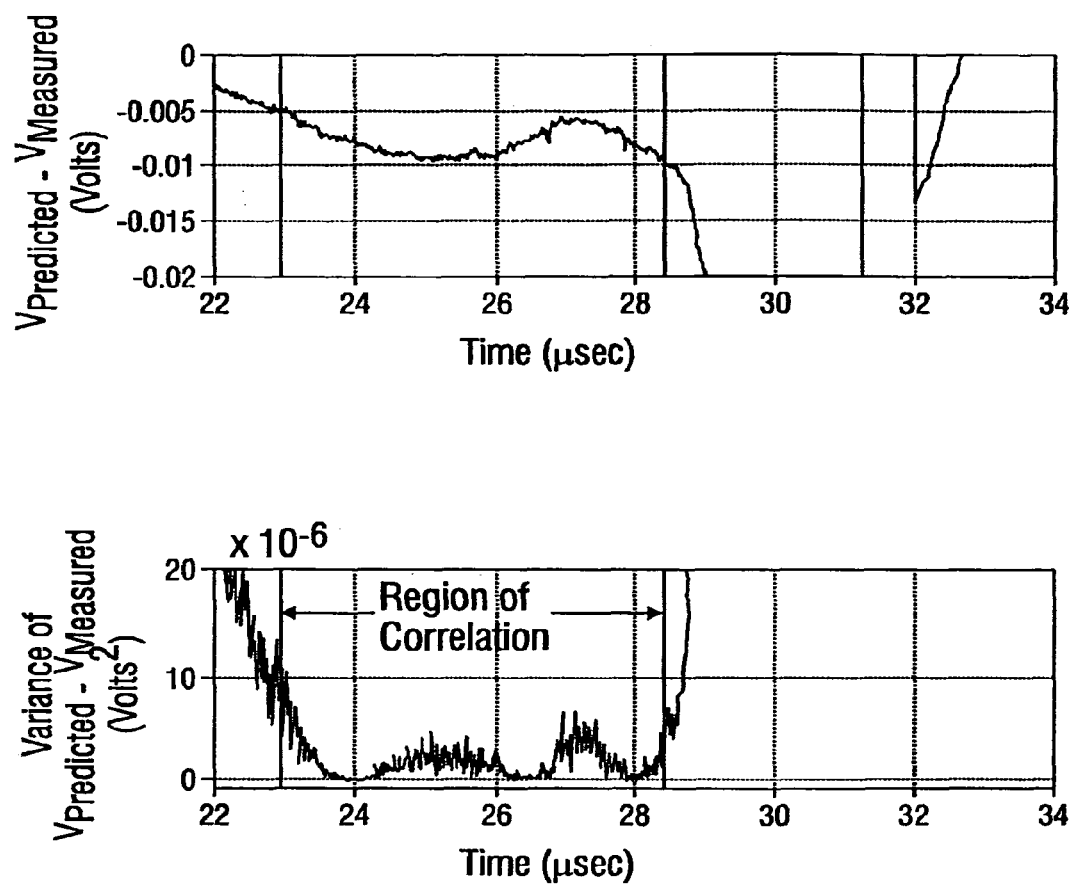
FIG. 22A is a graph of $V_{Predicted} - V_{Measured}$ and minimum variance of $V_{Predicted} - V_{Measured}$ at estimated distance of 12,216 ft, representing an embodiment of the invention.
Figure 22B:
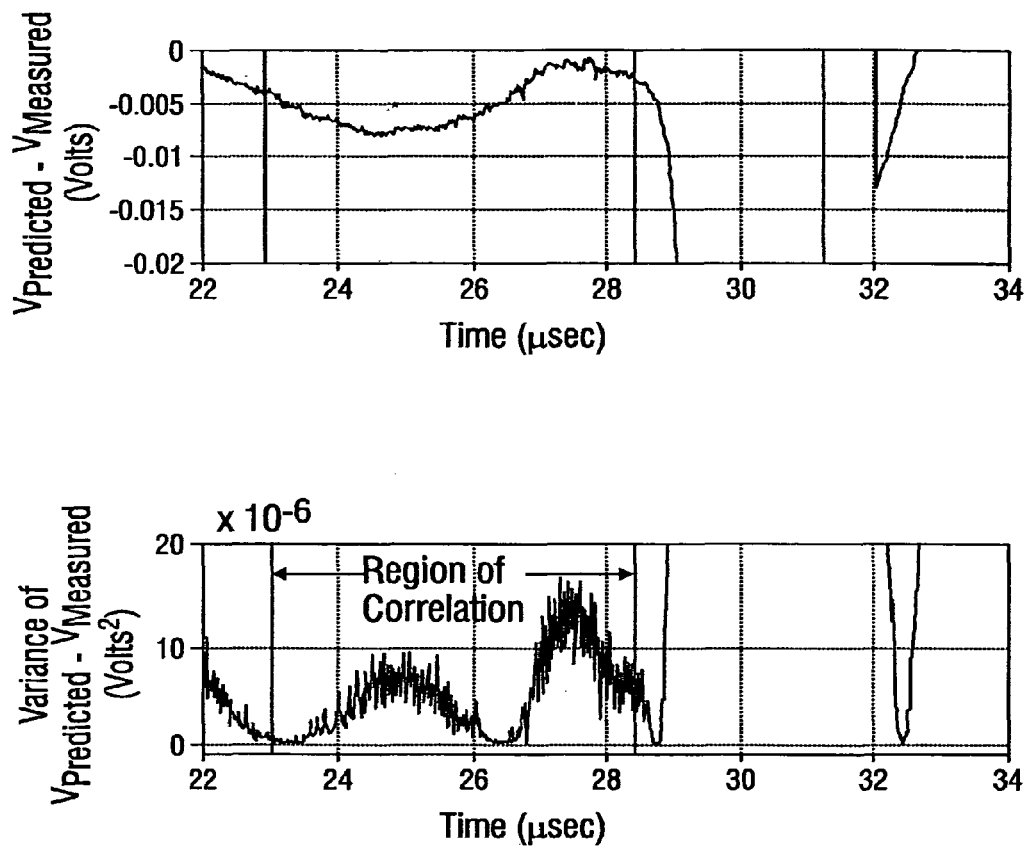
FIG. 22B is a graph of $V_{Predicted} - V_{Measured}$ and variance of $V_{Predicted} - V_{Measured}$ at estimated distance of 12,254 ft, representing an embodiment of the invention.

Once the initial TOF estimate of end of the SD region in the leading edge of the propagating pulse is obtained at the distance l, the input waveform is attenuated and time shifted assuming the end of the SD region of the traveling wave corresponds to the point of truncation of the initial SD waveform, (FIG. 20, top). The input waveform is then incrementally translated in time and attenuated based on each new estimated distance traveled. At each distance estimate, this shifted and attenuated input waveform is subtracted from the measured waveform. If there is no dc voltage offset and no noise, this difference will be zero in the SD region when the estimated distance is equal to the actual distance. Because there is always noise and there is frequently a varying differential, dc offset at different points along the cable, the variance of this difference is evaluated at each estimated distance. This correlation has a minimum when the input waveform has been translated to the actual distance traveled, (FIG. 20, middle). If there is a dc differential offset between the lines, this minimum will be non-zero. At this estimated distance, the erosion of the end of the truncated SD region due to the dispersion from the closing pulse is obvious. If the waveform is translated too far, this deviation error measurement increases, (FIG. 20, bottom). FIG. 21 shows the calculated standard deviation of the difference of the shifted and attenuated input waveform and the SD waveform measured at the splice between the second and third twisted wire pairs as a function of estimated distance. The minimum occurs at an estimated distance of 12,216 ft. FIG. 22A shows the difference of the two waveforms and the variance of the difference of the waveforms at the minimum. FIG. 22A indicates that there is a five to ten millivolt differential dc offset between the two measuring points. FIG. 22B is presented to show how the variance has increased when the estimated distance is 38 ft longer than the distance associated with the minimum.

Figure 23:
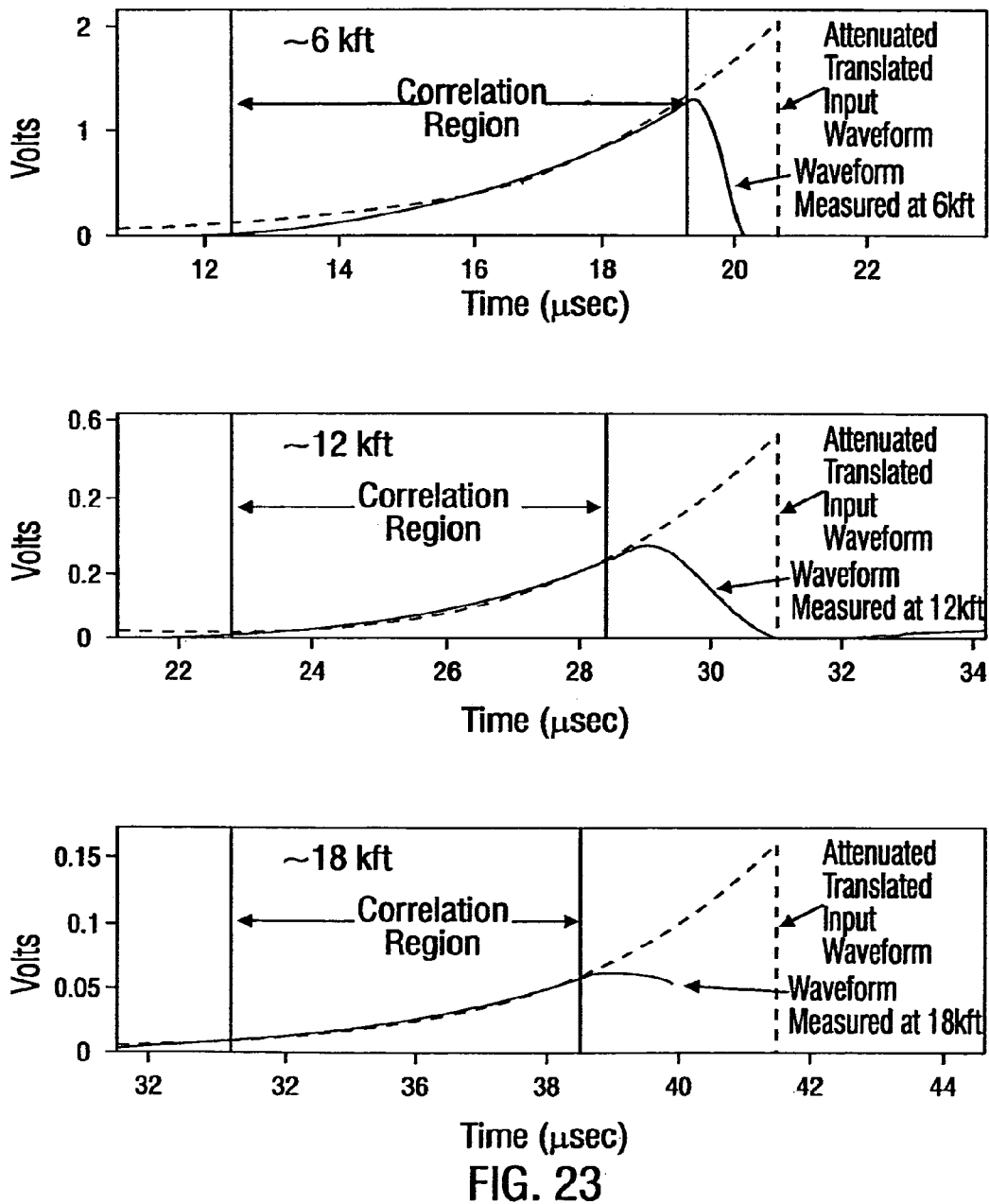
FIG. 23 is a graph of voltage traces measured a ~6, ~12, and ~18 kft of 24 AWG BKMA 50 cable and applied waveform attenuated and shifted in time according to SD prediction, representing an embodiment of the invention.

This process was repeated eight times giving average distances of 6,113 ft, 12,216 ft, and 18,327 ft for the best-fit shift locations of the attenuated input waveform to the measured waveforms. The standard deviations of the three lengths were 1 ft, 1 ft, and 5 ft respectively. The fits associated with one of these data sets are shown in FIG. 23. The actual length of the cable was not exactly known, however, each pair in the cable is parallel and the only differences in length are small and due to different twist rates. This process yields the distance of two lengths within 10 ft of two times the distance of one length. The distance of three lengths is within 11 ft of three times the distance of one length. Using the ~6 kft distance as a standard gives a discrepancy of −0.08% for the ~12 kft length and −0.06% for the ~18 kft length.

Example 5

Time Domain Reflectometer (TDR): Precision Measurement of Transmission Line Distance to Impedance Change Using a Reflected Wave A Time Domain Reflectometer (TDR) is a test instrument used to find faults in transmission lines and to empirically estimate transmission line lengths and other parameters characterizing the line such as inductance per unit length, capacitance per unit length, resistance per unit length and conductance per unit length. A fundamental measurement in TDR test technology is the time of flight (TOF) of a test pulse generated by the instrument and applied to the line. This time of flight may be measured by timing the passage of the pulse detected at two locations along the line, referred to as Time Domain Transmission measurements (TDT). Or by Time Domain Reflection measurements which estimate the launch time of a pulse at one position and the subsequent return time of the pulse back to the same location after the pulse has been reflected from a fault or other impedance change some distance along the line. These measured TOF values, along with a value of the propagation speed of the pulse, allows one to obtain the distance between measurement points or in the case of the reflected wave, the distance from the pulse launch point to the location of the impedance change causing the pulse to be reflected and returned to the launch point.

A fundamental limitation in TDR technology is the poor accuracy of these TOF measurements in lossy, dispersive transmission lines. The relatively high TDR accuracy of TOF values obtainable in short low loss, low dispersion transmissions lines is possible only because the propagating test pulses keep their shape and amplitude in tact over the distances they travel during TOF measurements. By contrast, in dispersive, lossy long transmission lines the test pulses used in the art change shape, change amplitude any speed as they travel. The TOF measurements used in the art under these circumstances focus on estimating the emergence time of the leading profile of the test pulses. This part of the signature of test pulses used in the art has characteristically a low signal level and low signal slope making an accurate pulse emergence time measurement difficult to obtain.

Several advantages can be obtained in TDR technology for lossy, dispersive transmission lines by using a test pulse that contains a truncated SD signal in its leading edge. This truncated SD leading edge travels at a constant speed along these transmission lines without changing shape. The speed of propagation of this SD edge is a function of the line parameters and the SD signal parameter alpha and is controllable by changing alpha. The truncated SD leading edge of the test pulse will be attenuated as it travels along a lossy line. However, this rate of attenuation is also a function of the line parameters and the SD signal parameter alpha and is controllable by changing alpha.

The same principles used for TDR can be applied to waveforms other than electromagnetic waves in a transmission line. The reflections of acoustic waves in SONAR or geophysical applications can be analyzed using the techniques discussed in this section to provide accurate time of flight and distance estimates as well as be used to characterize the transmission media.

The accuracy of the SD test waveform in a TDR application can be demonstrated by an example using the T1 cable, as discussed in examples 1 and 2. The two twisted wire pairs inside the T1 cable are connected in series to form a 2004 ft cable and the truncated SD signal is applied to the input. The voltage trace is measured at the splice of the two lines at 1002 ft. This can eliminate the need to correct for any line impedance mismatch at the point of measurement. The exponential coefficient $\alpha$ of the applied wave is $6.7 \times 10^6$ sec$^{-1}$. The SD parameters, $A_{SD}$ and $v_{SD}$, are obtained from the empirical transfer function analysis presented in example 2. Interpolating from the data of table I gives an $A_{SD}$ of $10.703 \times 10^3$ ft$^{-1}$ and a $V_{SD}$ of $6.276 \times 10^8$ ft/sec for this $\alpha$.

Figure 24:
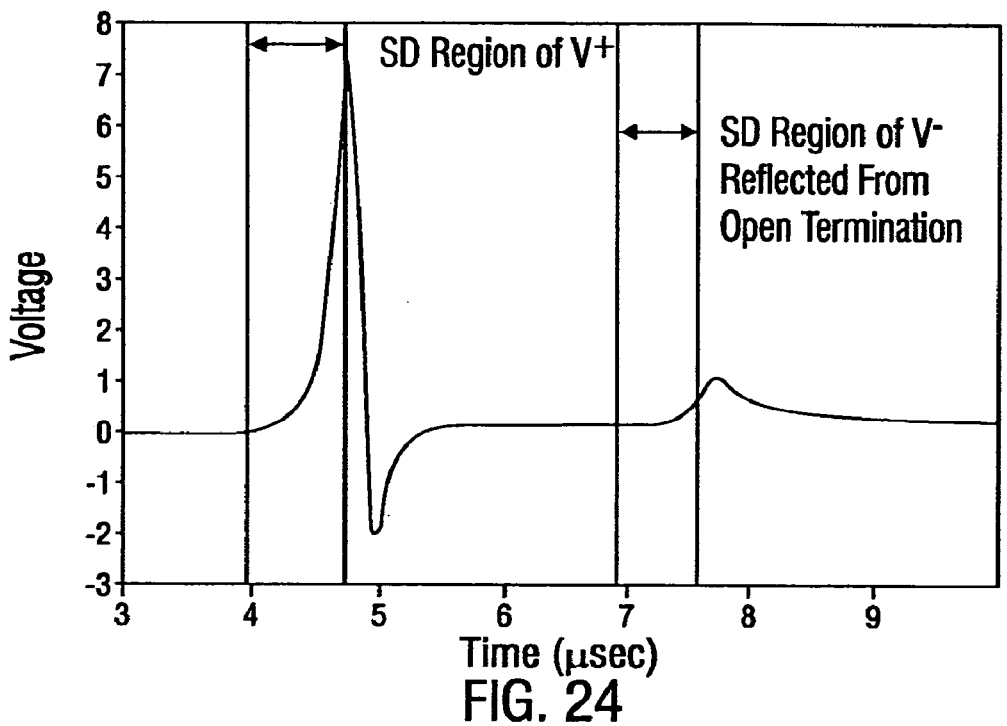
FIG. 24 is a graph of voltage trace measured at input showing applied truncated SD pulse and wave reflected from open termination at 1002 ft, representing an embodiment of the invention.
Figure 25:
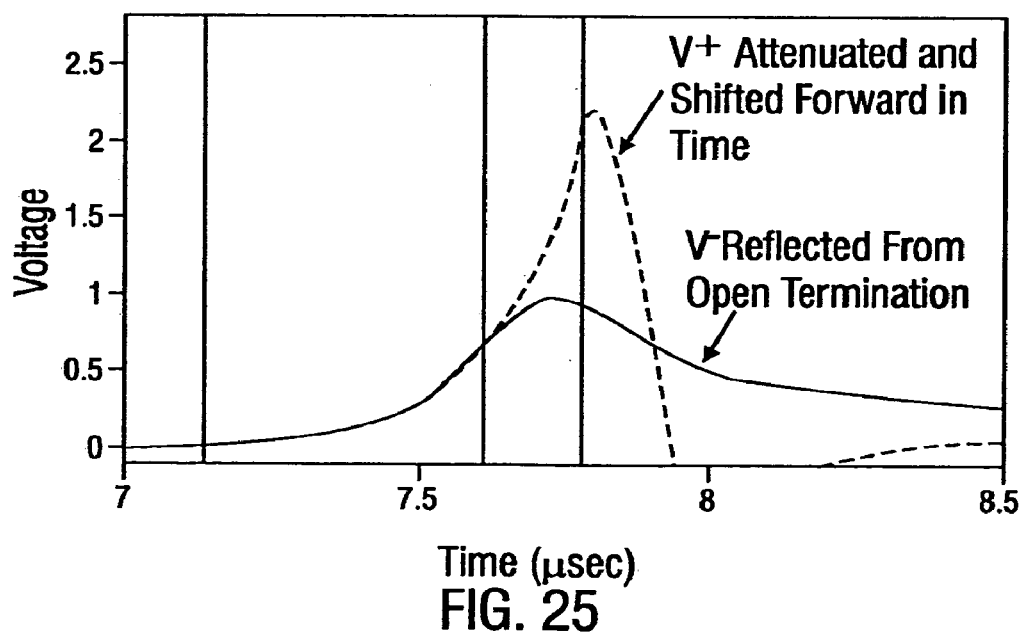
FIG. 25 is a graph of voltage trace measured at input showing wave reflected from open termination at 1002 ft and applied wave attenuated and shifted forward in time for best fit resulting in 2004 ft estimated total distance traveled, representing an embodiment of the invention.
Figure 26A:
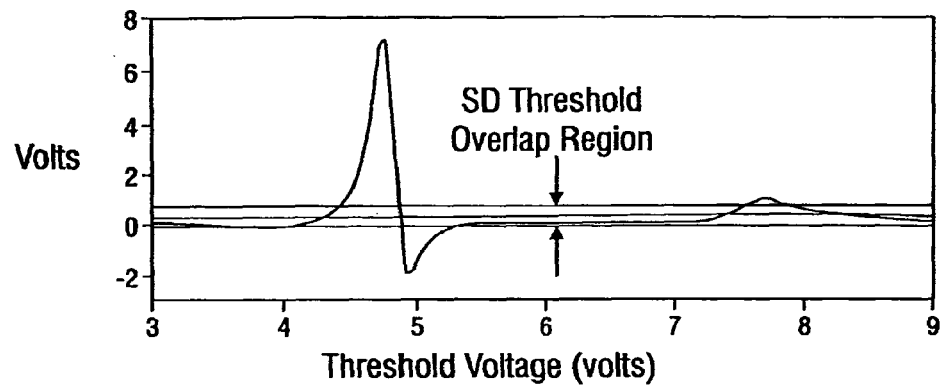
FIG. 26A is a graph of SD TDR threshold overlap regions for voltages at x=0 for 1002 ft open terminated T1 line, representing an embodiment of the invention.
Figure 26B:
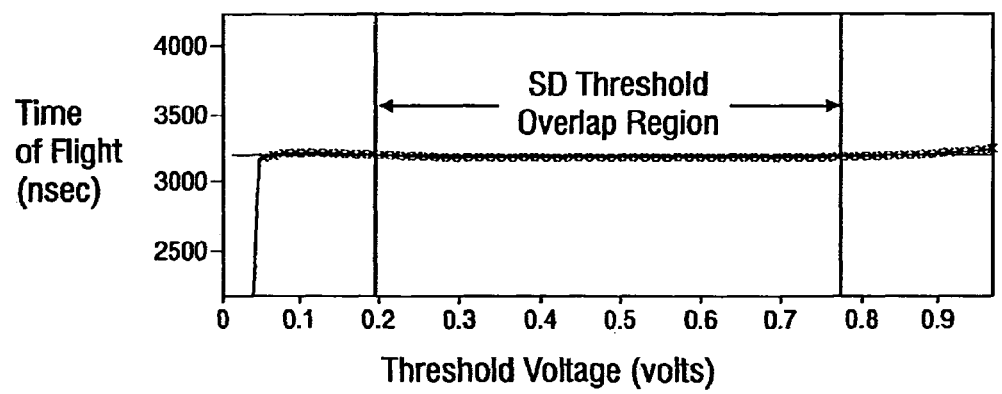
FIG. 26B is a graph of measured constant threshold TDR times-of-flight for 1002 ft T1 line with α=6.7×10⁶ 1/sec resulting in total estimated distance traveled by the reflected wave of 2010 ft., representing an embodiment of the invention.

The first demonstration terminates the cable with an open circuit. The reflected coefficient of an open circuit is +1, which results in a positive reflection. FIG. 24 shows the voltage waveform measured at the 1002 ft point showing the forward traveling applied wave and the wave reflected from an open termination at the end of the cable. FIG. 25 shows the result of the measured reflected wave together with the applied wave time shifted and attenuated according to the procedure of example 4. The total distance traveled by the reflected wave is measured to be 2004 ft by this process, or exactly two times the 1002 ft length of this twisted wire pair section. FIGS. 26A-B show the constant threshold timing method result for TOF discussed in example 1. This method results in a time of flight of 3,203 nsec, which gives an estimated total distance traveled of 2010 ft. This results in an estimated twisted wire pair section length of 1005 ft, or 3 ft in error (+0.3%). This is an illustration of reduced accuracy using the constant threshold TOF measurements when the pulse travels far enough to experience significant attenuation. The accuracy of this method may decline more in cases where the test pulse experiences even more attenuation. This level of attenuation may not generally occur in digital circuits. The maximum attenuation of digital signals in interconnects is generally less than one-half of the driving signal. In such cases, the constant threshold TOF measurements with the SD wave should be preferably more accurate than current TDR methods using estimated time of emergence of the reflected pulses.

Figure 27:
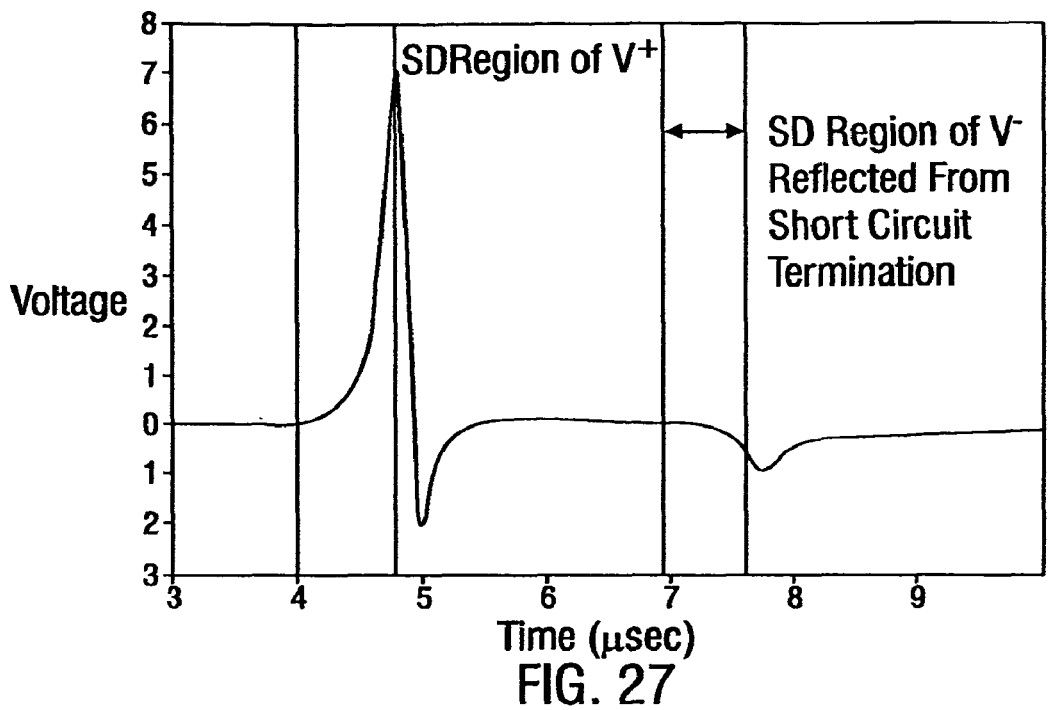
FIG. 27 is a graph of voltage trace measured at input showing applied truncated SD pulse and wave reflected from short circuit termination at 1002 ft., representing an embodiment of the invention.
Figure 28:
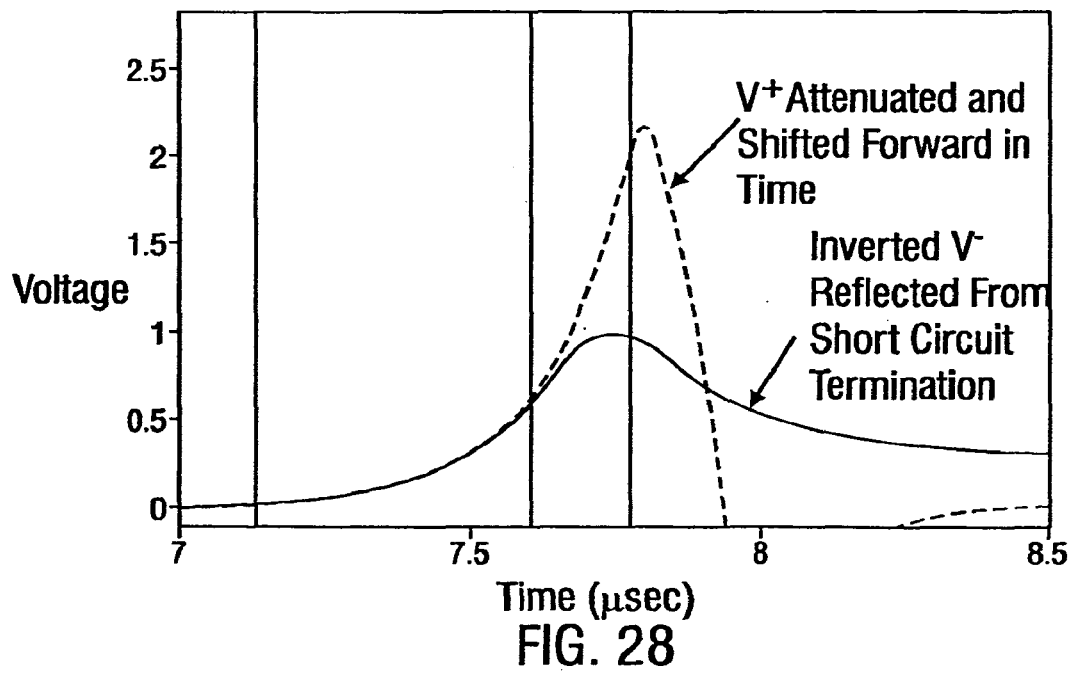
FIG. 28 is a graph of a voltage trace measured at input inverted, showing wave reflected from short circuit termination at 1002 ft inverted and the non-inverted applied input wave attenuated and shifted forward in time for best fit resulting in 2004 ft estimated total distance traveled, representing an embodiment of the invention.
Figure 29A:
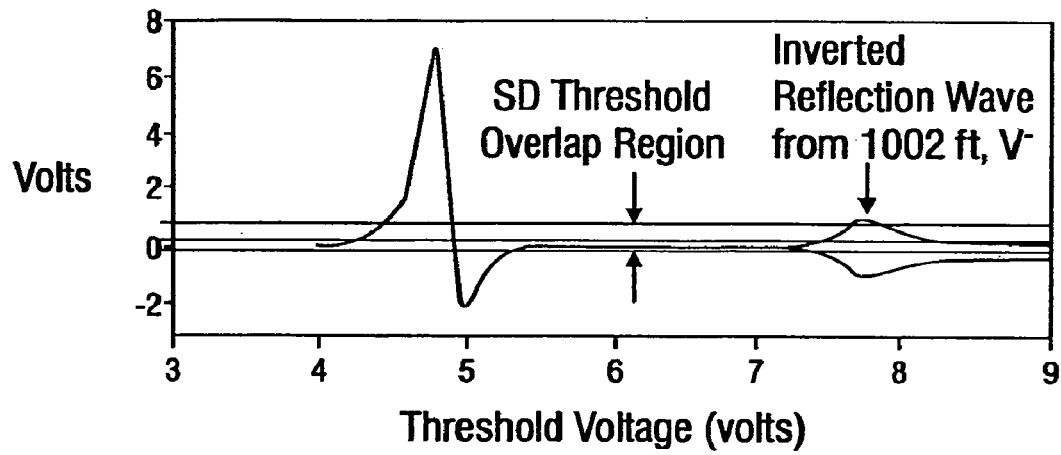
FIG. 29A is a graph of SD TDR threshold overlap regions for voltages at x=0 for 1002 ft short circuit terminated T1 line, representing an embodiment of the invention.
Figure 29B:
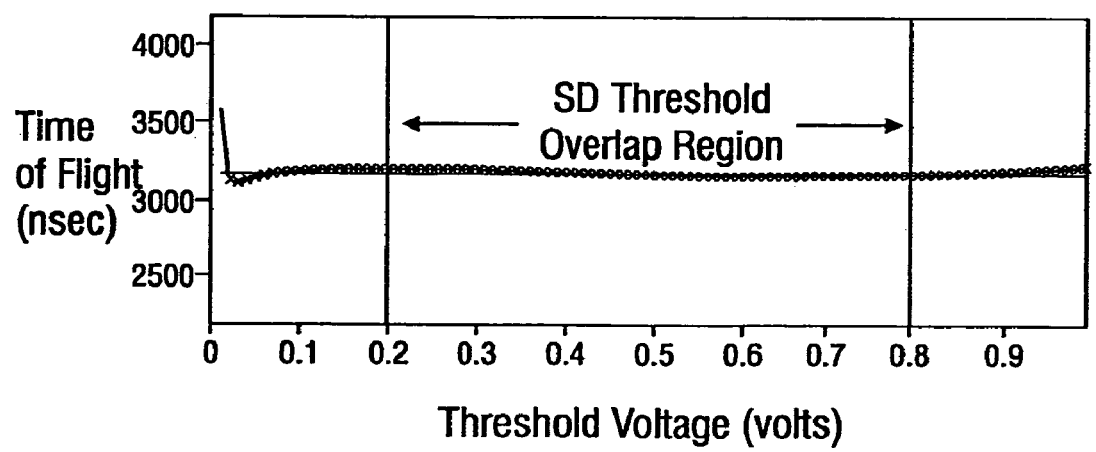
FIG. 29B is a graph of measured constant threshold TDR times-of-flight for 1002 ft T1 line with α=6.7×10⁶ 1/sec resulting in total estimated distance traveled of 2008 ft., representing an embodiment of the invention.

The next demonstration terminates the second twisted wire pair with a short circuit. The reflected coefficient at a short circuit is −1, which results in a negative reflection. FIG. 27 shows the voltage waveform measured at the 1002 ft point showing the forward traveling applied wave and the wave reflected from a short circuit termination at the end of the second twisted wire pair. FIG. 28 shows the result of the inverted reflected wave and the applied wave time shifted and attenuated according to the procedure of example 4. The total distance traveled is measured to be 2004 ft by this process, or exactly two times the 1002 ft twisted wire pair length. FIGS. 29A-B show the constant threshold timing method of estimating TOF discussed in example 1. This method results in a time of flight of 3,200 nsec, which gives an estimated total distance traveled of 2008 ft. This results in an estimated twisted wire pair section length of 1004 ft, or 2 ft in error (+0.2%).

Figure 30:
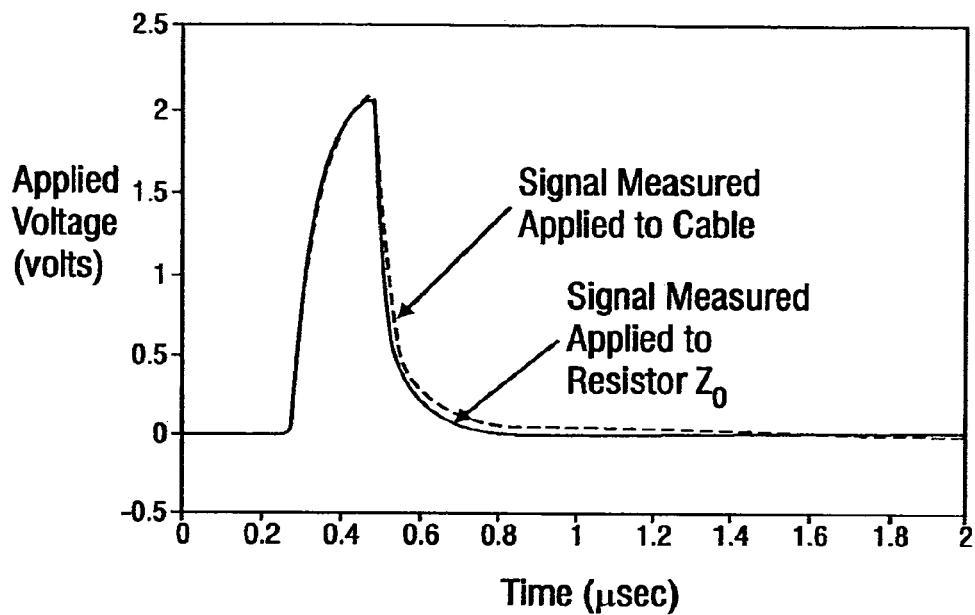
FIG. 30 is a graph of a voltage pulse applied to 1002 ft T1 cable (dotted line), and to resistor with value $Z_o$, representing an embodiment of the invention.
Figure 31:
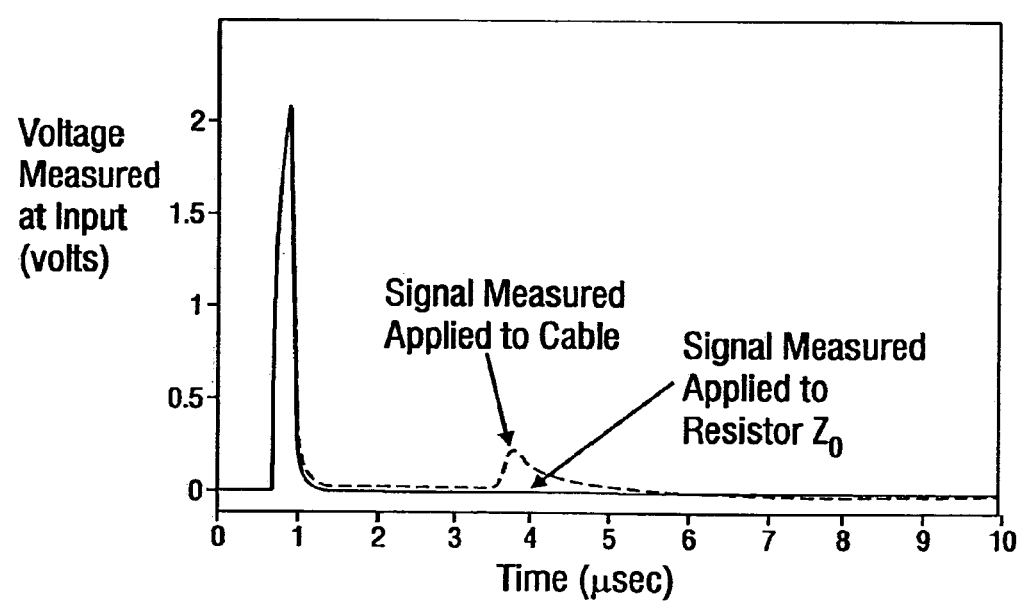
FIG. 31 is another graph of the voltage pulse applied to 1002 ft T1 cable (dotted line), and to resistor with value $Z_o$, representing an embodiment of the invention.

The utility of the SD waveform to the TDR process can be increased by using an empirical transfer function obtained with the use of a non-SD pulse applied to the line in a way similar to the process discussed in example 2. As an example with this cable, an experimental voltage pulse is generated by an arbitrary function generator connected to a single unterminated twisted wire pair from the T1 cable. This waveform is shown in FIGS. 30-31 (dotted). The same waveform can be applied by the signal generator to a variable resistor load substituted for the 1002 ft twisted wire pair. The resistor is adjusted until the waveform approximates the shape and magnitude of the waveform applied by the arbitrary waveform generator to the twisted wire pair, see FIGS. 30-31 (solid). The waveform match is not exact because the resistor does not have the exact same frequency response as that of the twisted wire pair. A load resistance equal to the characteristic impedance, $Z_o$, of the twisted wire pair results in a waveform that is closely matched to the waveform applied to the cable and has similar frequency content. The difference between the signal measured with the resistive load and the signal measured with the transmission line consists of the response of the transmission line to the applied signal and contains any reflected waves from impedance mismatches on the transmission line. The transfer function is then calculated from the ratio of the fast Fourier transforms (FFT) of the difference of the two signals, and the signal of the resistor alone:

$$H_{est}(j\omega) = \frac{FFT(V_{Measured\ with\ Cable} - V_{Measured\ with\ Load\ Resistance\ Z_o})}{FFT(V_{Measured\ with\ Load\ Resistance\ Z_o})}.$$

Figure 32:
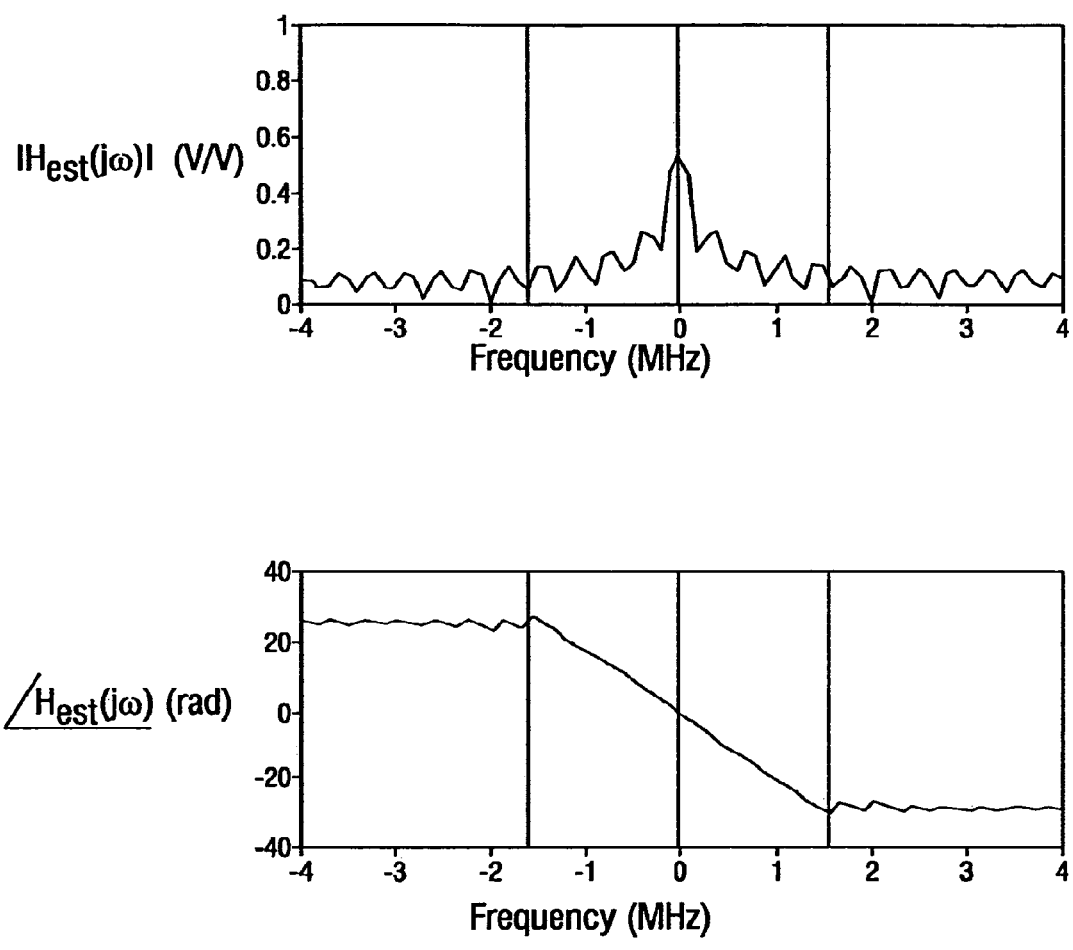
FIG. 32 is a graph of a transfer function between the difference of waveform applied to the twisted wire pair and the waveform applied to $Z_o$, representing an embodiment of the invention.

This function, shown in FIG. 32, can be used to evaluate the reflected transmission line response to a SD pulse.

Figure 33:
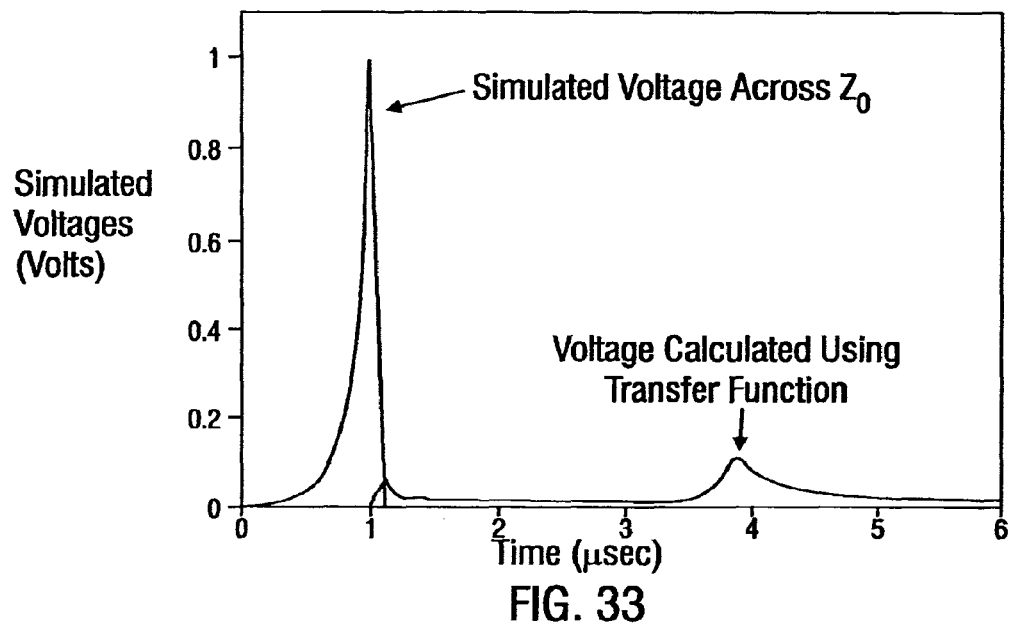
FIG. 33 is a graph of simulated applied SD waveform with α=6.7×10⁶ 1/sec, and reflected waveform calculated with transfer function, representing an embodiment of the invention.
Figure 34:
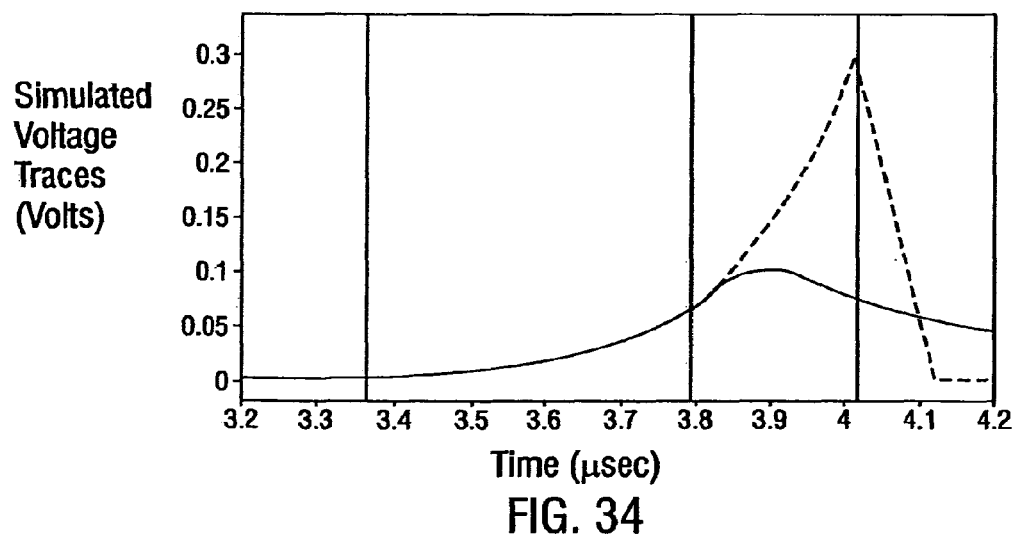
FIG. 34 is a graph of simulated voltage traces showing wave reflected from open termination at 1002 ft and applied wave attenuated and shifted forward in time for best fit resulting in 2004 ft estimated total distance traveled, representing an embodiment of the invention.
Figure 35A:
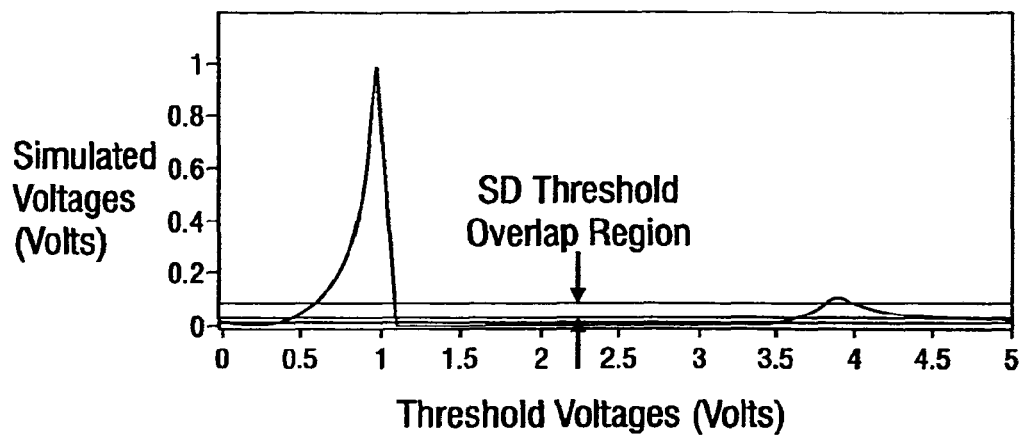
FIG. 35A is a graph of simulated SD TDR threshold overlap regions for voltages at x=0 for 1002 ft open terminated T1 line, representing an embodiment of the invention.
Figure 35B:
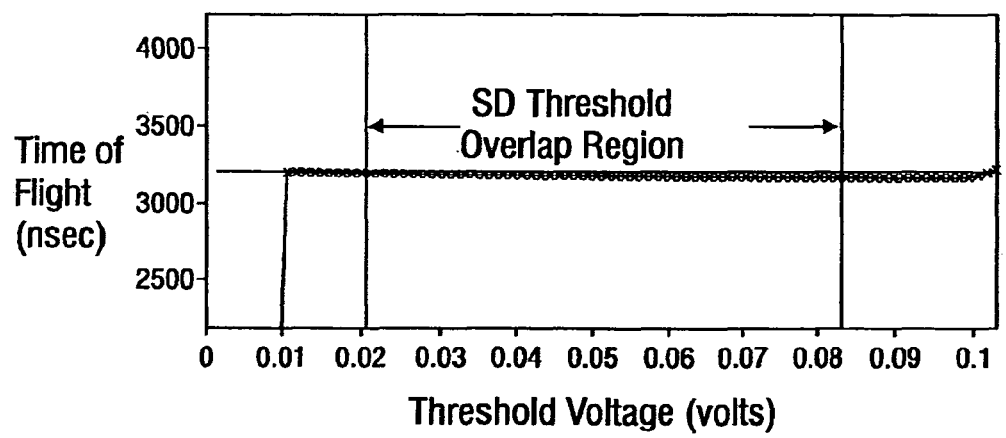
FIG. 35B is a graph of simulated constant threshold TDR times-of-flight for 1002 ft T1 line with α=6.7×10⁶ 1/sec resulting in total estimated distance traveled of 2005 ft, representing an embodiment of the invention.

As a test of this process, a SD pulse with an α equal to the α used in the previous two experiments was simulated. The transfer function determined for the open terminated T1 cable, (FIG. 32), was used to calculate the expected response, see FIG. 33. There is a small pulse at the time of the applied pulse due to the resistor and cable having different high frequency impedance values. The influence of this pulse was eliminated with appropriate time windowing. The simulated response was then used to estimate the distance to the open termination using the methods of example 4 (FIG. 34), and example 1 (FIGS. 35A-B). The result of the slide and attenuate method resulted in an estimated total round trip distance the pulse traveled of 2004, or double the exact distance of 1002 ft to the open. The constant threshold method resulted in time of flight of 3,196 nsec for an estimated distance traveled of 2006 ft, or two times an estimated distance of 1003 ft to the open (0.1% Error).

No actual SD signal was experimentally applied to the twisted wire pair to obtain these results. The test signal applied to the line (FIG. 30) was similar to the type obtained form a commercial TDR instrument for testing communication cables with lengths ranging up to 5-kft. The measurements resulting from this test line voltage were used to obtain an empirical line transfer function. The SD TOF and the line distance estimates were all obtained computationally by simulating the SD propagation along the line utilizing this empirical line transfer function estimated with non-SD signals.

Example 6

Communication by High Speed Data Transmission Using Speedy Delivery Waveforms

The SD waveform has several properties that make it suitable as the basis for a data transmission scheme. For example: the exponential shape is maintained as it propagates at constant speed in a uniform cable; the attenuation of the SD waveform is adjustable by changing the exponential waveform parameter α; the propagating speed of the SD waveform is adjustable by changing the exponential waveform parameter α; and the SD waveforms with different α's are linearly independent.

This example teaches using the first property as the basis for a method of transmitting data using SD waveforms. The signals are transmitted 2004 ft along a transmission line consisting of the two twisted wire pairs in a 1002 ft T1 cable connected in series. The second twisted wire pair is terminated with a 100-ohm resistor. The data is encoded on four SD waveforms, each having a distinct α. Each waveform can be transmitted with a positive or a negative D, resulting in eight total states for three bits per symbol. One symbol is transmitted every three microseconds, giving a data rate of 1 Mbps. As one of ordinary skill in the art will recognize with the benefit of this disclosure, several other communication schemes can be readily derived from the teachings contained herein.

Figure 36A:
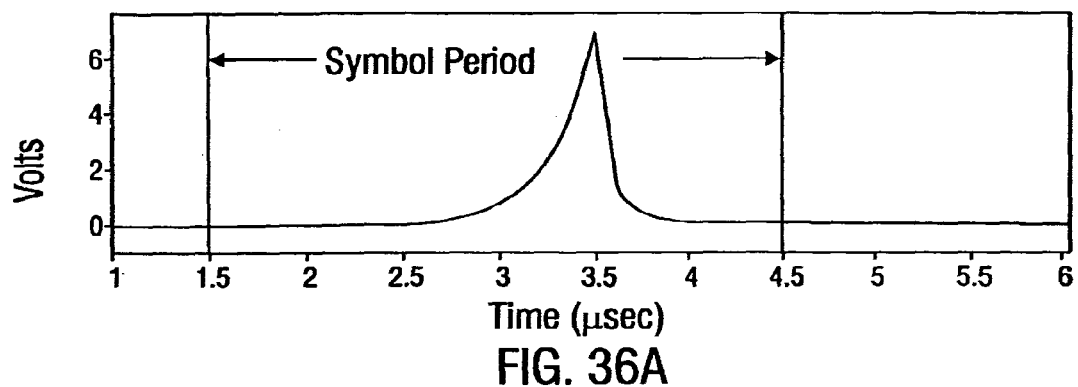
FIG. 36A is a graph of an uncompensated SD waveform applied to a 2004 ft twisted wire pair transmission line, representing an embodiment of the invention.
Figure 36B:
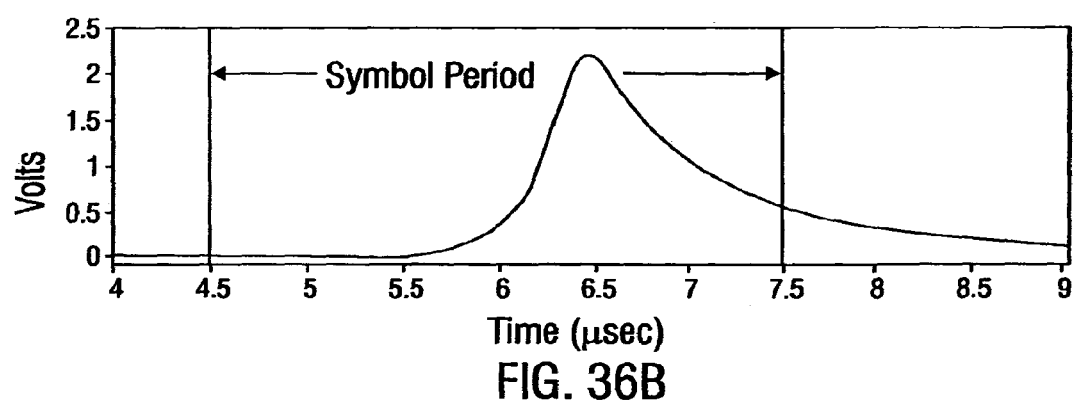
FIG. 36B is a graph of an uncompensated SD waveform measured 100 Ohm termination on a 2004-ft twisted wire pair transmission line, representing an embodiment of the invention.
Figure 37A:
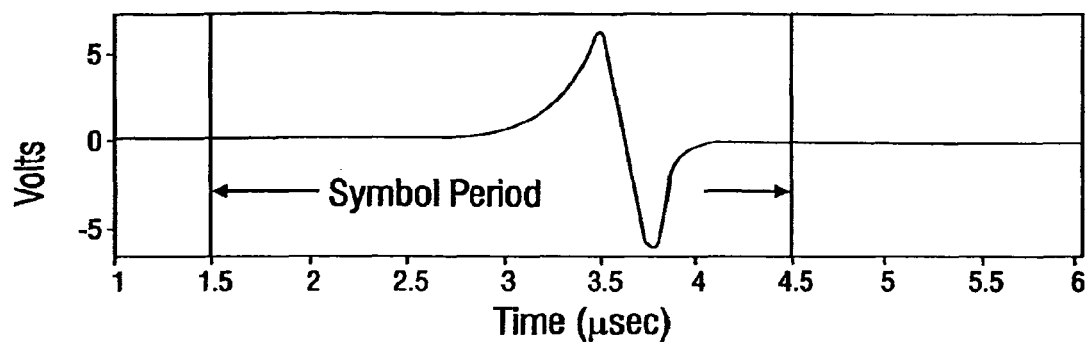
FIG. 37A is a graph of a compensated SD waveform applied to a 2004 ft twisted wire pair transmission line, representing an embodiment of the invention.
Figure 37B:
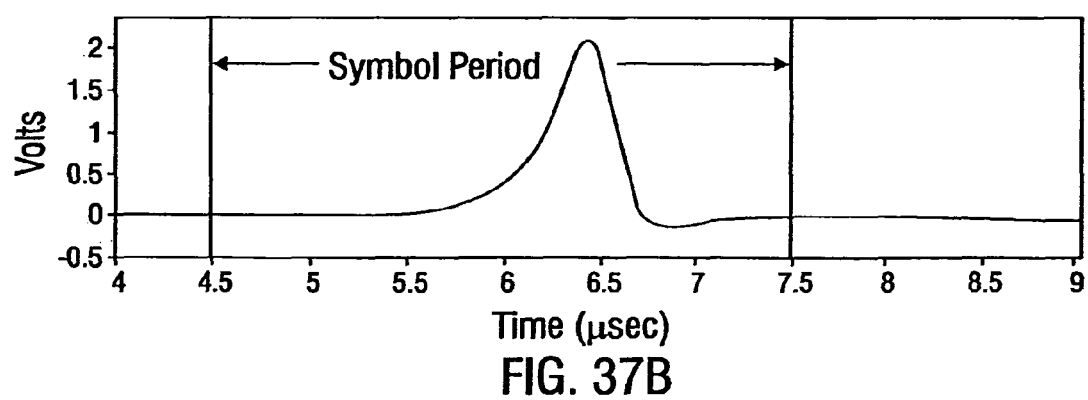
FIG. 37B is a graph of a compensated SD waveform measured 100 Ohm termination on a 2004-ft twisted wire pair transmission line, representing an embodiment of the invention.

The symbols can consist of a two-microsecond truncated SD leading edge period followed by a one-microsecond recovery period. This recovery period includes a variable width half-sine compensating pulse adjusted to shorten the time required for the transmission line to return to a zero voltage. The need for this recovery period and compensating pulse is illustrated in FIGS. 36A-B and FIGS. 37A-B. FIG. 36A shows the transmitted pulse without the compensating pulse, and FIG. 36B shows the received pulse without the compensating pulse. The truncated SD waveform in the leading edge of the input pulse is closed with a simple ramp signal, which is rounded due to the line response. Although the SD portion of the propagating pulse does not undergo deformation, the closing ramp does disperse into the region beyond the three-microsecond symbol period. FIGS. 37A-B show the effect of the compensating pulse in eliminating this inter-symbol interference. Each truncated SD waveform may requires a different amount of compensation so the width of the half-sine pulse can be varied based on observing the pulse at the terminated end of the second twisted wire pair.

Figure 38:
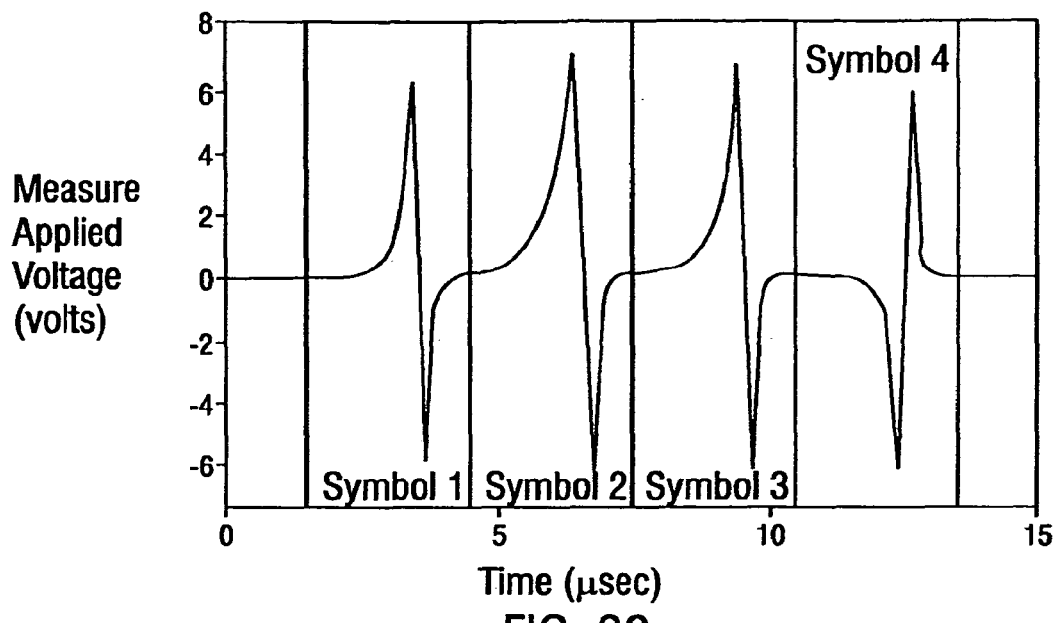
FIG. 38 is a graph of a series of four symbols measured at input to a 2004 ft twisted wire pair transmission line, representing an embodiment of the invention.

FIG. 38 shows a series of four symbols applied to the twisted wire pair input. Each symbol has a unique α, and a unique D. The α's are equally spaced $1.1 \times 10^6$ sec$^{-1}$ apart at $2.2\times10^6$ sec$^{-1}$, $3.3\times10^6$ sec$^{-1}$, $4.4\times10^6$ sec$^{-1}$, and $5.5\times10^6$ sec$^{-1}$. The order $\alpha$'s used for this illustration of four successive symbols in FIG. 9.3 is $4.4\times10^6$ sec$^{-1}$, $2.2\times10^6$ sec$^{-1}$, $3.3\times10^6$ sec$^{-1}$, and $5.5\times10^6$ sec$^{-1}$. The D's were chosen to maintain an approximately equal maximum and minimum symbol voltage. For this demonstration, the fourth waveform is inverted. The signal measured at the 100-ohm termination at a distance of 2004-ft is shown in FIG. 39.

Figure 39:
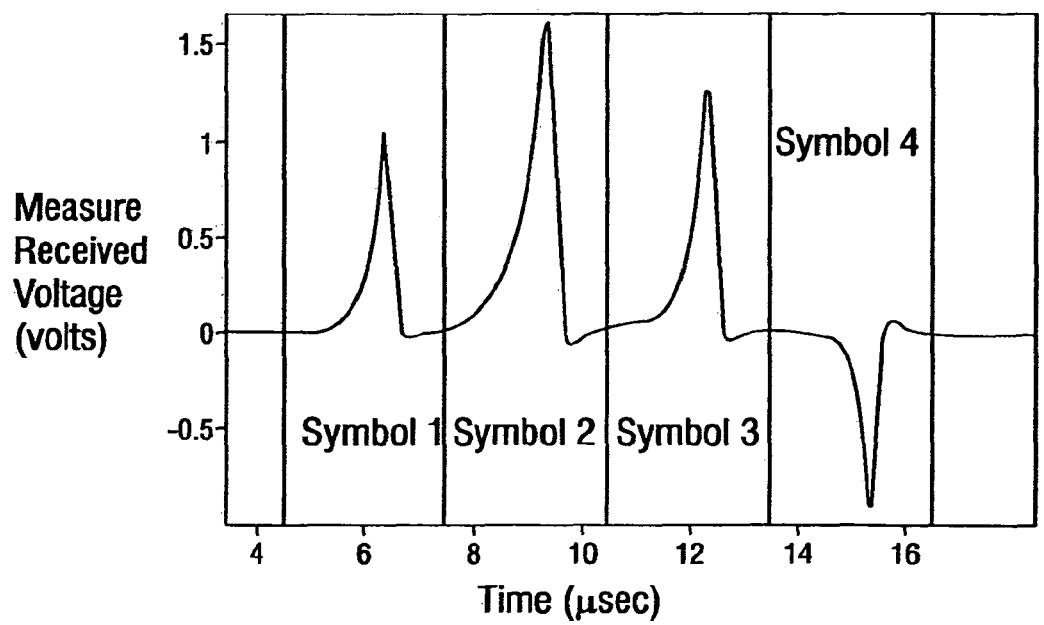
FIG. 39 is a graph of a series of four symbols measured at 100 Ohm termination at 2004-ft on twisted wire pair transmission line, representing an embodiment of the invention.
Figure 40:
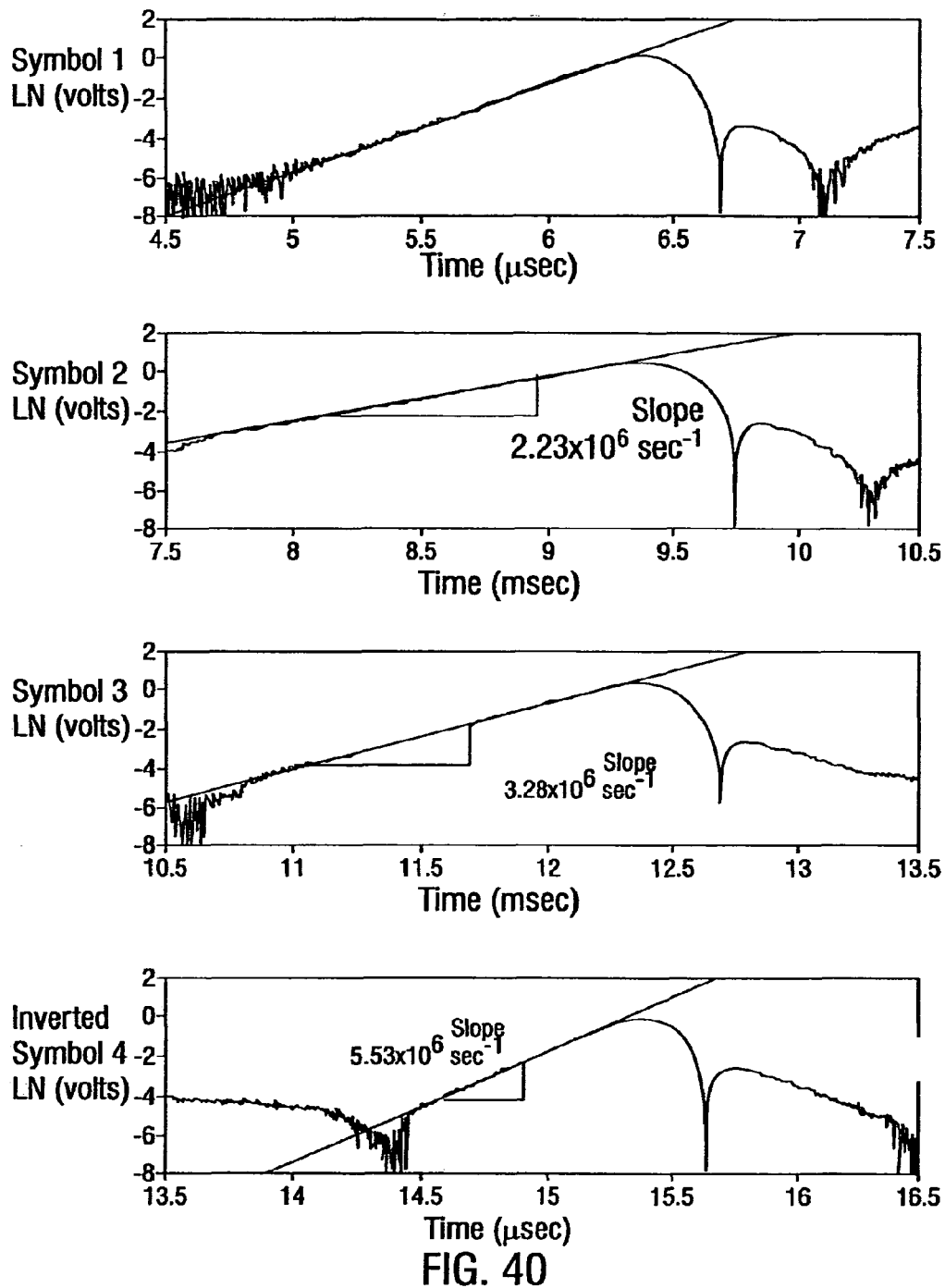
FIG. 40 is a natural logarithmic graph of voltages measured at 100 ohm termination at 2004-ft for each symbol period showing a least mean square fit of linear region, representing an embodiment of the invention.

FIG. 40 shows the natural log of the signal within each symbol period for the signal of FIG. 39. A set of matched filters could be used to detect the individual $\alpha$'s. The slopes of the least square linear fits of the linear regions of these waveforms are shown in Table II (set forth below). The decision level for this demonstration would be one half of the step size in a $(1.1\times10^6$ sec$^{-1})$ of $0.55\times10^6$ sec$^{-1}$. All errors are well below this threshold.

TABLE II

Encoded and decoded $\alpha$'s from Data Transmission Demonstration

| Symbol | Applied $\alpha$ ($\times10^6$ sec$^{-1}$) | Detected $\alpha$ ($\times10^6$ sec$^{-1}$) | Error ($\times10^6$ sec$^{-1}$) |
|---|---|---|---|
| 1 | 4.4 | 4.38 | −0.02 |
| 2 | 2.2 | 2.23 | +0.03 |
| 3 | 3.3 | 3.28 | −0.02 |
| 4 | 5.5 | 5.53 | +0.03 |

Example 7

Communication by High Speed Data Transmission Using Orthogonal Linear Combinations of Speedy Delivery Waveforms This example discusses using the fourth SD waveform property, that SD waveforms with different $\alpha$'s are linearly independent. This property can be utilized to generate an orthogonal set of pulses. Data can be encoded on these pulses by varying their amplitude. These amplitude-modulated orthogonal pulses are transmitted simultaneously on the transmission line. At the receiver, the individual pulse amplitudes are computed by taking advantage of their orthogonality. The basic pulses derived from the SD waveforms must be orthogonal at the receiver for this scheme to work.

The repetitive transmission of data may require closed pulses. As shown in example 6, that the SD portion of the leading edge of a closed propagating pulse maintains its shape, while the shape used to close the pulse will disperse as it propagates. The attenuation and propagation speed of the truncated SD leading region of the pulse is a function of the SD parameter $\alpha$. Therefore, the orthogonality of a set of these pulses with a variety of $\alpha$ values will be reduced as the pulses propagate. Fortunately, the pulses only have to be orthogonal at the receiver. Techniques can be used to generate a set of orthogonal pulses from linearly independent component pulses. The effect of the transmission line on these component pulses can be determined empirically. These transmitted component waveforms, measured at the receiver, will be linearly independent. Linear combinations of these measured, linearly independent component pulses are used to generate a set of pulses that are orthogonal at the receiver. The constants determined by the orthogonalization process are supplied to the transmitter and used to generate transmitted pulses that will be orthogonal at the receiver. An example of this procedure follows. The process of generating and transmitting the orthogonal pulses is simulated for an 8 kft, 26 AWG twisted wire pair transmission line terminated with 100 Ohms resistance.

Figure 41:
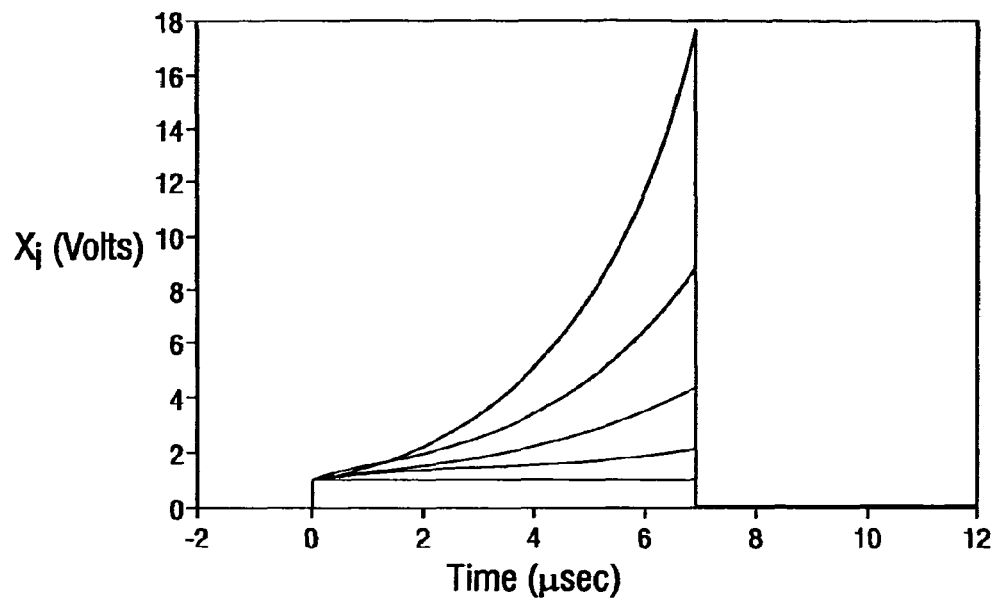
FIG. 41 is a graph of $X_i = e^{(\alpha_o + (i-1) \cdot \Delta\alpha) \cdot t}$, representing an embodiment of the invention.
Figure 42:
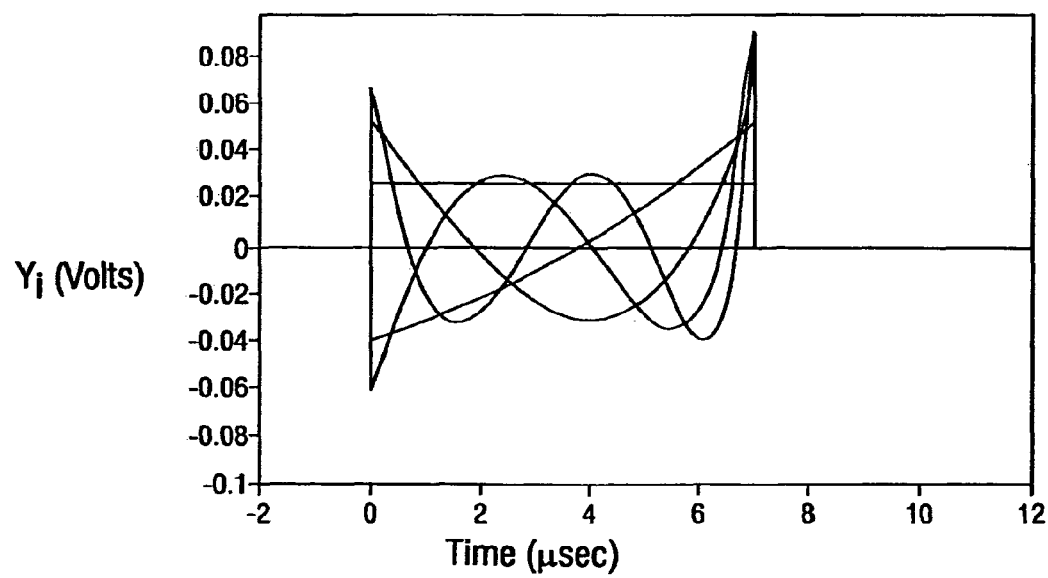
FIG. 42 is a graph of an orthonormal vector set $Y = [Y_1, Y_2, Y_3, Y_4, Y_5]$, representing an embodiment of the invention.

The example orthogonalization process can begin by using a set of SD waveforms $X_m(t)=e^{(\alpha_o+(m-1)\cdot\Delta\alpha)\cdot t}$ for m=1 ... 5, $$\alpha_o = 1\times10^4 \frac{1}{\sec},$$

$$\Delta\alpha = 1\times10^5 \frac{1}{\sec},$$

and t=0 ... $7\times10^{-6}$ sec. The five waveforms are shown for a seven-microsecond interval in FIG. 41. The waveforms are linearly independent on this time interval. Additionally, these SD waveforms have a polynomial structure, i.e. each waveform is equal to $e^{(\Delta\alpha)\cdot t}$ times the previous waveform. This allows the use of a simple recursive algorithm for polynomials [4] to create orthonormal linear combinations of these linearly independent waveforms. The set of five orthonormal Y's resulting from this procedure is shown in FIG. 42. In this case, X and Y are related by:

$$Y = \overline{A}\cdot X$$

$$\begin{bmatrix} Y_1 \\ Y_2 \\ Y_3 \\ Y_4 \\ Y_5 \end{bmatrix} = \begin{bmatrix} 0.026 & 0 & 0 & 0 & 0 \\ -0.129 & 0.088 & 0 & 0 & 0 \\ 0.717 & -1.003 & 0.337 & 0 & 0 \\ -4.074 & 8.578 & -5.874 & 1.310 & 0 \\ 23.304 & -65.519 & 67.862 & -30.704 & 5.124 \end{bmatrix} \cdot \begin{bmatrix} X_1 \\ X_2 \\ X_3 \\ X_4 \\ X_5 \end{bmatrix}.$$

The set, Y, is orthonormal in that the inner product $$\langle Y_i, Y_j\rangle \equiv \int_0^{T=12\mu\ sec} Y_i(t)\cdot Y_j(t)dt = \begin{cases} 0 & i\neq j \\ 1 & i=j. \end{cases}$$

The sharp waveform transitions at zero and seven microseconds have high frequency content that would disperse during transmission and contribute to inter-symbol interference. This effect is reduced by multiplying this orthonormal set by $\sin(\omega\cdot t)$, with $$\omega = \frac{\pi}{7\times10^{-6}}.$$

This has the effect of changing the SD waveform to X', where $$X'_m(t) = e^{(\alpha_o+(m-1)\Delta\alpha)\cdot t}\cdot\sin(\omega t) = \frac{1}{2j}\begin{bmatrix} e^{[(\alpha_o+(m-1)\Delta\alpha)+j\omega]} - \\ e^{[(\alpha_o+(m-1)\Delta\alpha)-j\omega]} \end{bmatrix}$$

for m=1 ... 5.

Figure 43:
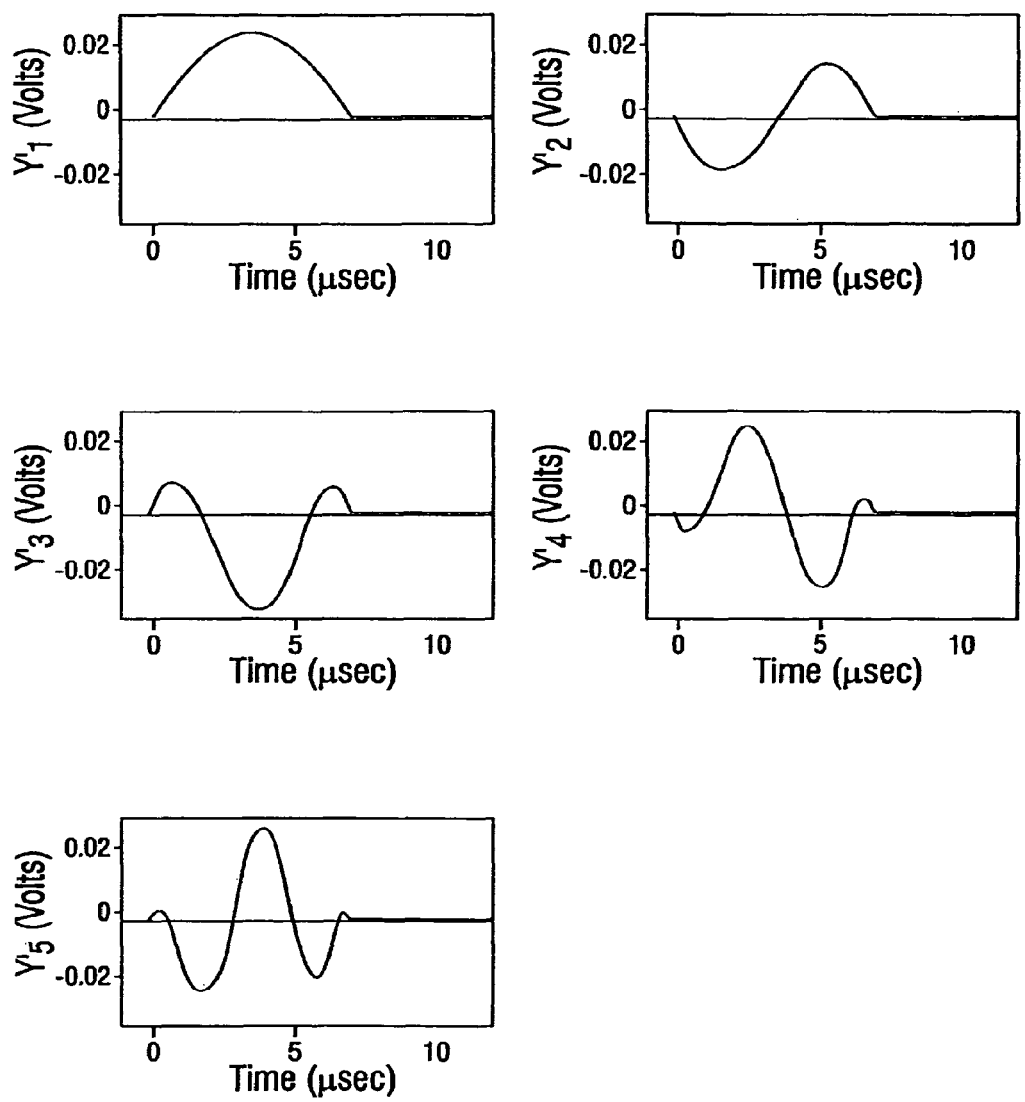
FIG. 43 is a graph of non-orthogonal waveforms $$Y' = [Y_1, \ Y_2, \ Y_3, \ Y_4, \ Y_5] \cdot \sin\left(\frac{\pi}{7 \times 10^{-6}} \cdot t\right),$$

Although the SD waveforms, X', are still linearly independent, the previous linear combination of these waveforms, Y'= $\overline{A}\cdot$X', is no longer orthogonal. The waveforms, Y', are shown in FIG. 43. These waveforms may be transmitted through the channel to the receiver. At the receiver, the waveforms show the trailing effects of dispersion beyond the 12 μsec symbol period, see FIG. 44. If the spread of the pulses into the following symbol periods is not removed, this inter-symbol interference at the receiver will render data encoded at the transmitter unreadable. A simple method of eliminating this interference is by adding a pulse with a compensating tail, $Z=Y'+b\cdot C$. In this example, the compensation pulse, $C(t)$, is one cycle of $$1 - \cos\left(\frac{\pi}{2.9 \times 10^{-6}} \cdot t\right)$$

delayed one microsecond after the start of the symbol period, see FIG. 45. FIGS. 46, 47 show the waveforms at the input and at 8 kft with appropriately sized compensating pulses added to each signal. The duration of these compensated component pulses at the receiver are now shorter than the desired 12 μsec symbol period (see FIG. 47), so any linear combination of these pulses will not interfere with the next symbol.

The multiplication by the sine pulse, the adding of the compensating pulse, and the transmission in the channel, have all reduced the orthogonality of the initial five pulses. Initially the angles between the pulses in FIG. 42 were all 90°. Now the angles between the pulses in FIG. 47 range from 11° to 74°. These five linearly independent waveforms are now combined into set, S, of four orthonormal waveforms using principle component decomposition (PCD) [5]. The Gram-Schmidt (G-S) orthogonalization method [6] may also be used for this step in the procedure, however the PCD method is preferable. The G-S method expands an orthonormal vector set one vector at a time. This can lead to a poorly conditioned transformation matrix if the components are close to being linearly dependent. The PCD method is preferable because it takes into account the entire inner-product space spanned by all of the components. The process makes use of the eigenvectors of the entire inner-product space to generate the transformation matrix. Additionally, the transformation matrix can be easily manipulated to order the eigenvalues. In this example the four largest eigenvalues were selected by truncating the transformation matrix. This process yields a transformation matrix, $\overline{B}$, that generates four waveforms that are orthonormal at 8-kft by linearly combining the five component signals. These waveforms are shown in FIG. 48 (the transmitted signals) and FIG. 49 (the received orthogonal signals).

$$S = \overline{B} \cdot Z$$

$$S = \overline{B} \cdot (Y' + b \cdot C)$$

$$\begin{bmatrix} S1 \\ S2 \\ S3 \\ S4 \end{bmatrix} = \begin{bmatrix} 4.69 & 5.75 & -21.05 & -41.44 & 46.26 \\ 3.55 & 0.41 & 32.53 & -33.72 & 6.00 \\ -2.74 & 9.11 & 0.48 & -63.36 & -91.60 \\ -3.35 & -3.35 & 2.06 & -56.60 & 123.38 \end{bmatrix} \cdot$$

$$\left( \begin{bmatrix} Y'_1 \\ Y'_2 \\ Y'_3 \\ Y'_4 \\ Y'_5 \end{bmatrix} + \begin{bmatrix} -0.04034 \\ -0.00283 \\ 0.01971 \\ -0.00007 \\ -0.00110 \end{bmatrix} \cdot C \right)$$

$$\begin{bmatrix} S1 \\ S2 \\ S3 \\ S4 \end{bmatrix} = \begin{bmatrix} 1{,}231.1 & -3{,}365.0 & 3{,}375.8 & -1{,}474.7 & 237.0 \\ 300.5 & -714.9 & 616.1 & -228.4 & 30.7 \\ -1{,}877.3 & 5{,}458.0 & -5{,}843.5 & 2{,}729.4 & -469.3 \\ 3{,}107.7 & -8{,}571.5 & 8{,}705.9 & -3{,}862.4 & 632.2 \end{bmatrix} \cdot$$

-continued $$\begin{bmatrix} e^{1 \times 10^4 t} \\ e^{1.1 \times 10^5 t} \\ e^{2.1 \times 10^5 t} \\ e^{3.1 \times 10^5 t} \\ e^{4.1 \times 10^5 t} \end{bmatrix} \cdot \sin(\omega t) + \begin{bmatrix} -0.668 \\ 0.493 \\ 0.199 \\ 0.054 \end{bmatrix} \cdot C$$

The orthonormal set S is orthogonal and normalized at the receiver. The process accounts for the effects of the channel and allows the transmitter input waveforms to be easily constructed as a linear combination of defined components prior to transmission. This set S can be used as the basis functions for an orthogonal pulse amplitude modulation data transmission scheme. This process is depicted in FIG. 50.

The data can be encoded by amplitude modulation with five bits on each of the four orthonormal pulses, S. Five bits requires thirty-two states. Each state corresponds to one amplitude level, $a_i$, on each orthogonal pulse, $S_i$. For this example the amplitude levels were ±0.5, ±1.5, . . . ±15.5. These four modulated orthogonal pulses are summed to generate a symbol, $Q = a_1 S_1 + a_2 S_2 + a_3 S_3 + a_4 S_4$.

The symbol is transmitted and decoded at the receiver by using the orthogonality of the pulses. For example, the applied signal on orthogonal pulse one can be found by taking the inner product of the symbol, Q, with the pulse one signal, $S_1$. This is done by multiplying the received symbol by the known orthogonal pulse, integrating over the symbol period, and normalizing the result.

$$\frac{\langle Q, S_1 \rangle}{\langle S_1, S_1 \rangle} = \frac{\langle a_1 S_1 + a_2 S_2 + a_3 S_3 + a_4 S_4, S_1 \rangle}{\langle S_1, S_1 \rangle}$$

$$= \frac{\langle a_1 S_1, S_1 \rangle + \langle a_2 S_2, S_1 \rangle + \langle a_3 S_3, S_1 \rangle + \langle a_4 S_4, S_1 \rangle}{\langle S_1, S_1 \rangle}$$

$$= \frac{a_1 \langle S_1, S_1 \rangle + 0 + 0 + 0}{\langle S_1, S_1 \rangle}$$

$$= a_1$$

FIG. 51 shows three successive symbols at the output of the transmitter and FIG. 52 shows the same three symbols at the input of the receiver. The symbols were encoded with a random selection of five bits per orthogonal pulse for a data rate of $$\frac{4 \frac{\text{Pulses}}{\text{Symbol}} \times 5 \frac{\text{Bits}}{\text{Pulse}}}{12 \times 10^{-6} \frac{\text{sec}}{\text{Symbol}}} = 1.67 \; Mbps.$$

FIG. 53 is a histogram of the error in detected level, $a_{expected} - a_{detected}$, for one second, or $1.67 \times 10^6$ bits, of data transmitted with −140 dBm additive white Gaussian noise (AWGN) present [7]. The standard deviations of the error distributions are 0.016, 0.018, 0.020, and 0.018 with maximum detected errors of 0.074, 0.071, 0.083, and 0.078. The decoding amplitude decision level is ±0.5

Example 8

On-Chip Clock Circuits

This example teaches the use of SD waveforms in digital circuits, specifically, in on-chip clock circuits. On-chip clock circuits may behave like transmission lines with the increased clock rates.

A major design advantage of the SD waveforms when used as clock signals is that the delay in an RC line ($\sqrt{RC/\alpha}\cdot 1$) is linear with length, l, instead of quadratic with length as it is with the commonly assumed step signal. Linear delay with length $$\left( \sqrt{LC} \sqrt{1 + \frac{R}{L\alpha}} \cdot l \right)$$

is also true for the SD signal in an RLC line. In contrast, the delay in RLC transmission lines excited by a conventional signal exhibit an exponentially growing increase in delay with length [8].

The fact that the SD signal delay increases as a linear function of length for all types of clock lines can simplify the clock line layout design process. This linear relationship holds for the entire range of clock line behaviors, from the very lossy clock lines that behave like RC transmission lines to low loss clock lines that behave like RLC transmission lines. This simple linear relationship between line length and SD clock signal delay provides a basis for implementing software CAD tools that may enhance accuracy while reducing design computational requirements.

Time Skew Clock control is a major issue limiting system performance. A solution to this problem includes equalizing conductor lengths to the various locations on the chip where the clock signal is needed. Several geometrical patterns are commonly used (H, etc.) to equalize the signal path lengths, thereby equalizing signal delays. This requires equalizing the path lengths along the traces delivering the clock signal to pin locations that are physically close to the master chip clock driver with those clock signal path lengths to pin locations at the longest distances from the master driver. Small adjustments to equalize the delays may be accomplished by adjusting the line widths to modify the line parameters and thereby the delay per unit length and alternatively by active means such as varying the delay of delayed-locked loops embedded in the clock lines.

The invention provides a method and/or apparatus for utilizing truncated SD clock waveforms to reduce the clock skew. An advantage of the invention is that the delay per unit length can be adjusted with the exponential coefficient, $\alpha$, chosen in the clock line driver design. This controllable delay per unit length has been demonstrated for a 100-ft coaxial cable in the initial patent application. The minimum coaxial cable delay measured was increased by a factor of 1.8.

The large increases in the clock signal delay per unit length achieved by varying the exponential coefficient $\alpha$ allows lines to the pins close to the clock driver to be shortened to more closely approximate the minimum physical distance between the driver and pin while maintaining a path delay equal to the delay of the longest clock lines on the chip. The shorter clock distribution lines may utilize less physical space on the chip and reduce the total clock line capacitance. This reduction in clock line capacitance reduces the total power consumption required by the chip for a given clock frequency. In one embodiment, an SD waveform driver may also be made to create an SD clock signal with adjustable delay by including a mechanism for adjusting the exponential coefficient $\alpha$ in the clock generator. This adjustable delay of the SD clock signal may provide a larger delay adjustment range than the delayed-locked loops utilized in the current technology.

Example 9

Signal Propagation without Distortion in a Dispersive Lossy Media

The propagation of signals in a no-loss non-dispersive media is ideal because there is no distortion.[9] However, pulse shapes that propagate along lossy, dispersive transmission lines are commonly dispersive, i.e., change shape[10]. This property can lead to inaccuracy of measurements and mischaracterizations of propagation behaviors.

As noted in Example 4 and Example 5 and illustrated in FIG. 17, the propagated waveform (e.g., a speedy delivery waveform) maintains an essentially constant shape during transmission in a dispersive lossy media. In particular, a speedy delivery (SD) waveform can be shown to be an exact closed form solution in the time domain of the four-parameter Telegrapher's equation that can be expressed as F(vt−x). The telegrapher's equation for the voltage on a transmission line is[11]

$$LC\frac{\partial^2 v}{\partial t^2} + (LG + RC)\frac{\partial v}{\partial t} + RGv = \frac{\partial^2 v}{\partial x^2} \qquad \text{Eq. 1}$$

where L, C, R, and G are the transmission line parameters[12].

The SD solution of Eq. 1 in the time domain with boundary conditions $v(x=0, t)=De^{\alpha t}$ and $v(x \to \infty, t)=0$ is $$v_{SD}(x,t) = De^{\alpha t} e^{-x\gamma(\alpha)} \qquad \text{Eq. 2}$$

which, when rewritten in the form F(vt−x) yields, $$v_{SD}(x, t) = De^{\gamma(\alpha)[(v_{SD}(\alpha))t - x]} \qquad \text{Eq. 3}$$

where $$\gamma^2(s) = LCs^2 + (LG + RC)s + RG$$

and $$v_{SD}(\alpha) = \frac{\alpha}{\sqrt{LC\alpha^2 + (GL + RC)\alpha + RG}}.$$

Thus, the SD wave does not change shape as it propagates with constant velocity on this dispersive lossy transmission line. The SD solution's propagation velocity depends on the SD boundary condition waveform parameter $\alpha$ and the principal line parameters L, C, R, and G (the dependence on $\alpha$ is removed if R=0 and G=0, in which case $v=1\sqrt{LC}$, the standard result for the ideal transmission line).

If the principal transmission line parameters are frequency dependent, the SD steady state solution is still valid, where the signal propagation velocity becomes $$v_{SD} = \frac{\alpha}{\sqrt{\overline{L}(\alpha)\overline{C}(\alpha)\alpha^2 + (\overline{G}(\alpha)\overline{L}(\alpha) + \overline{R}(\alpha)\overline{C}(\alpha)) + \overline{R}(\alpha)\overline{G}(\alpha)}} \qquad \text{Eq. 4}$$

where $\overline{L}(s)$, $\overline{C}(s)$, $\overline{R}(s)$, and $\overline{G}(s)$ are the Laplace transforms of the principal line parameters. As such, the SD wave represented by Eq. 2 does not change shape as it propagates with constant velocity on this dispersive lossy transmission line with frequency dependent parameters.

Any application of the SD signal in a circuit can require that the exponential signal be truncated at some maximum amplitude. The result of truncating the amplitude of the SD signal at the line input is that the responses measured at different locations along the transmission line are also truncated SD signals having the same shape, but whose peak amplitudes decline with distance. Formulas for this attenuation in the truncated SD signal amplitude and the propagation velocity of the truncated SD signal are contained in references for various types of transmission lines and other DLM. It is also noted that using a truncated SD signal as the forward edge of a closed pulse and closing the pulse with a non-SD waveform results in dispersion of the pulse wave form as a whole, with only the leading SD edge retaining the shape of the waveform as it propagates in DLM.

Example 10

Propagation of a Truncated Exponential Waveform Modulated with a Sinusoidal Carrier In this example, an electrical signal which includes a truncated SD signal envelope modulated with a sinusoidal carrier signal can propagate on a lossy dispersive RLC transmission line without distortion is demonstrated. Similarly, electromagnetic plane waves which can include a truncated SD signal envelope modulated by a sinusoidal electromagnetic plane wave propagating through a dispersive plasma media (e.g., an ionosphere) is also demonstrated. Furthermore, the example illustrates that the propagation speed and attenuation of the envelope can be controlled.

1. Steady State Response of a Lossy Dispersive Resistance-Capacitance-Inductance Transmission Line to a Truncated SD Signal Envelope Modulated by a Sinusoidal Carrier.

The propagation transfer function for a resistance-capacitance-inductance (RLC) transmission line is[12]

$$V(z,s) = B(s)e^{-z\gamma(s)} \text{ or } z > 0 \qquad \text{Eq. 5}$$

where[12] $\gamma^2(s) = LCs^2 + RCs$ and the SD boundary condition is $b(t) = V(t, z=0) = De^{\alpha t} \sin \omega_0 t$. Note that the boundary condition is a SD envelope modulated with a carrier of frequency $\omega_0$ that is understood to be truncated in time. As such, the steady state solution in time domain is $$V(t,z) = \frac{D}{2j}e^{\alpha t}e^{j\omega_0 t}e^{-z\gamma(\alpha+j\omega_0)} - \frac{D}{2j}e^{\alpha t}e^{j\omega_0 t}e^{-z\gamma(\alpha+j\omega_0)} \qquad \text{Eq. 6}$$

Defining $P(\alpha, \omega_0) = LC\alpha^2 - LC\omega_0^2 + RC\alpha > 0$ if $LC\alpha^2 + RC\alpha > LC\omega_0^2$ and $Q(\alpha, \omega_0) = 2LC\alpha\omega_0 + RC\omega_0 > 0$, then Eq. 6 becomes $$V(t,z) = De^{\alpha t - z(P^2+Q^2)^{\frac{1}{4}}\cos\left(\frac{\tan^{-1}(Q/P)}{2}\right)} \qquad \text{Eq. 7}$$

$$\sin\left[\omega_0 t - z(P^2+Q^2)^{\frac{1}{4}}\sin\left(\frac{\tan^{-1}(Q/P)}{2}\right)\right]$$

Thus, the envelope of the carrier is $$De^{\left[(P^2+Q^2)^{\frac{1}{4}}\cos\left(\frac{\tan^{-1}(Q/P)}{2}\right)\right]\times\left\{(\alpha t)/\left[(P^2+Q^2)^{\frac{1}{4}}\cos\left(\frac{\tan^{-1}(Q/P)}{2}\right)\right]-z\right\}} \qquad \text{Eq. 8}$$

which has the form of a function $F(vt-z)$ which propagates with a controllable velocity v and controllable attenuation of a truncated SD envelope without changing shape[12]. Therefore, the propagation velocity of the envelope is:

$$v = \frac{\alpha}{(P^2+Q^2)^{\frac{1}{4}}\cos\left(\frac{\tan^{-1}(Q/P)}{2}\right)} \qquad \text{Eq. 9}$$

2. One Dimensional Electromagnetic Plane Wave Propagation in a Dispersive Media[13]

Assuming the electromagnetic field components are only a function of z and assuming the E-field is polarized in the x-direction, the electromagnetic field components are as follows:

$$\overline{E} = \hat{x}E_x(z,t) \qquad \text{Eq. 10}$$

$$\overline{H} = \hat{y}H_y(z,t) \qquad \text{Eq. 11}$$

$$\overline{J} = \hat{x}J_x(z,t) \qquad \text{Eq. 12}$$

$$\omega_p^2 = \omega_p^2(z,t) \qquad \text{Eq. 13}$$

If $\omega_p^2(z,t) = \omega_p^2$ (i.e., assuming no variations in the plasma frequency in z direction or time), then $$\frac{\partial^2 E}{\partial z^2} - \frac{1}{c^2}\frac{\partial^2 E}{\partial t^2} - \frac{1}{c^2}\omega_p^2(z,t)E = 0^{[10]} \text{ and}$$

$$\frac{\partial^2 \dot{H}}{\partial z^2} - \frac{1}{c^2}\frac{\partial^2 \dot{H}}{\partial t^2} - \frac{1}{c^2}\omega_p^2(z,t)\dot{H} + \varepsilon_0\frac{\partial}{\partial z}\omega_p^2(z,t)E = 0^{[10]}$$

becomes $$\frac{\partial^2 E_x}{\partial z^2} - \frac{1}{c^2}\frac{\partial^2 E_x}{\partial t^2} - \frac{1}{c^2}\omega_p^2(z,t)E_x = 0 \qquad \text{Eq. 14}$$

$$\frac{\partial^2 \dot{H}_y}{\partial z^2} - \frac{1}{c^2}\frac{\partial^2 \dot{H}_y}{\partial t^2} - \frac{1}{c^2}\omega_p^2(z,t)\dot{H}_y = 0 \qquad \text{Eq. 15}$$

Taking the Laplace Transform of the Eq. 14 of the E-field yields:

$$\frac{1}{c^2}(s^2 + \omega_p^2)\overline{E}_x(s,z) = \frac{d^2\overline{E}_x(s,z)}{dz^2} \qquad \text{Eq. 16}$$

Then the propagation transfer function for the E-field, in terms of the electromagnetic boundary condition at the edge of the plasma, B(s), is $e^{+\gamma(s)z}$ where $$\gamma^2(s) = \frac{1}{c^2}(s^2 + \omega_p^2),$$

and the SD boundary condition $$b(t) = E(t, z=0) = De^{\alpha t}\sin\omega_0 t. \qquad \text{Eq. 17}$$

It is noted that the boundary condition is a SD envelope modulated with a carrier of frequency $\omega_0$ that is understood to be truncated in time.

As such, the steady state solution in the time domain is $$E_x(t, z) = \frac{D}{2j}e^{\alpha t}e^{j\omega_0 t}e^{-z\gamma(\alpha+j\omega_0)} - \frac{D}{2j}e^{\alpha t}e^{-j\omega_0 t}e^{-z\gamma(\alpha-j\omega_0)} \quad \text{Eq. 18}$$

Defining $P(\alpha, \omega_0) \equiv \alpha^2 + \omega_p^2 - \omega_0^2 > 0$ if $\alpha^2 + \omega_p^2 > \omega_0^2$ and $Q(\alpha, \omega_0) = 2\omega_0\alpha > 0$ if $\alpha > 0$ and $\omega_0 > 0$, then $$E_x(t,z) = De^{\alpha t - z(P^2+Q^2)^{\frac{1}{4}}\cos\left(\frac{\tan^{-1}(Q/P)}{2}\right)} \quad \text{Eq. 19}$$

$$\sin\left[\omega_0 t - z(P^2+Q^2)^{\frac{1}{4}}\sin\left(\frac{\tan^{-1}(Q/P)}{2}\right)\right]$$

Thus, the envelope of the carrier is $$De^{\left[(P^2+Q^2)^{\frac{1}{4}}\cos\left(\frac{\tan^{-1}(Q/P)}{2}\right)\right]\times\left\{(\alpha t)/\left[(P^2+Q^2)^{\frac{1}{4}}\cos\left(\frac{\tan^{-1}(Q/P)}{2}\right)\right]-z\right\}} \quad \text{Eq. 20}$$

which has the form of a function $F(v_z t - z)$ which propagates with a controllable velocity $v_z$ and controllable attenuation of a truncated SD envelope without changing shape[12]. The propagation velocity of the envelope is:

$$v_z = \frac{\alpha}{(P^2+Q^2)^{\frac{1}{4}}\cos\left(\frac{\tan^{-1}(Q/P)}{2}\right)} \quad \text{Eq. 21}$$

Note a similar results hold for $\dot{H}_y$ in Eq. 15.

It is noted that the types of media discussed above (e.g., RLC transmission lines and ionospheres) are merely examples. A waveform which may include a speedy delivery signal envelope modulated with a sinusoidal signal may travel on other types of media without distortion such as, but not limited to travel of any energy wave including a signal envelope traveling on a lossy dispersive media.

Example 11

Temperature Effects on SD Signal Delay in a Media

The temperature of a cable can influence the electrical SD signal delay in a media, especially metal wire line cables, such as RG-58/U coaxial cable. The effect can be predicted by the SD signal delay theory for wire line cable where the relation between the delay of a cable delay and a temperature of a cable can be useful in creating a new type of precision temperature measuring instrument.

1. Temperature Measurements

An RLC transmission line model can be used to model a metal line wire, e.g., a RG-58/U cable, at signal frequencies where the dielectric loss in the cable is small. The SD signal delay per unit length, ($\delta_{SD}$=1/velocity) of an RLC transmission line is $$\delta_{SD} = \sqrt{L(T)C(T)}\sqrt{1+\tau/(L)(T)/R(T))} \quad \text{Eq. 22}$$

where the SD signal input voltage applied to the cable is $De^{\alpha t}$ and $$\tau = \frac{1}{\alpha}.$$

The coaxial cable transmission line parameter, R(T), in Eq. 22 is the combined resistance per unit length of the center conductor and the shield of the metal line wire. As such, the resistance of the coaxial center conductor and shield decreases with increasing temperature. The inductance and capacitance can also change with temperature due to the changes in the cross sectional dimensions of the cable due to the temperature coefficient of expansion of the insulation (PE-Polyethylene). Therefore, the length of the conductor can also increase slightly with increasing temperature (17 ppm/C.°) resulting in a small increase in the two way travel time of the TDR SD test pulse.

2. Calibration Mode

If the cable temperature can be controlled from one isothermal temperature to another and delay measurements performed on the cable at each temperature, then the calibrated relation between temperature and cable delay can be used to monitor the unknown cable temperature by periodically measuring the cable delay. In one example, time domain reflectometer delay measurements of the two way travel of SD pulses were performed on an un-terminated 300 ft. RG-58/U cable while the cable was held at a series of measured constant temperatures. Un-terminated, as defined herein, is a media terminated by any impedance other than the characteristics impedance of the media. Referring to FIG. 54, the results of different temperatures versus cable delay calibration measurements are shown. These measurements were made over a period of six days at various isothermal temperatures from room temperature, approximately 22°, to freezing, approximately 0° C. Referring to FIG. 55, a graph showing the average daily temperature plotted verses the average delay for each day. As seen from the results, the measurement of SD signal delay is correlated with the cable temperature.

The inductance per unit length of coaxial cable is $$L = \frac{\mu}{2\pi}\ln\left(\frac{b(T)}{a}\right)$$

and the capacitance per unit length is $$C = \frac{2\pi\varepsilon}{\ln\left(\frac{b(T)}{a}\right)}.$$

Thus, $\sqrt{LC(T)} = \sqrt{\mu\varepsilon(T)}$. The resulting SD signal delay (e.g., the time of flight, TOF) during propagation from cable input to un-terminated cable end and reflection back to the cable input is $$2 \cdot l(T) \cdot \sqrt{\mu\varepsilon(T)}\sqrt{1+\tau/(L(T)/R(T))}. \quad \text{Eq. 23}$$

The two measurements in FIG. 55 at room temperature with an 21.5° C. average together with two measurements near freezing with an −2.6° C. average will be used to estimate the change in the cable dielectric constant over these range of temperatures.

Assuming the length of the cable is 600 ft, the increase in delay due to the thermal expansion (17 ppm/° C.) is 382 μsec for a 24° C. increase in temperature.

The RG 58/U cable parameters are R(20° C.)=15.5 mΩ/ft, L(20° C.)=0.0801 μH/ft, C(20° C.)=28.5 pF/ft. The coefficient of thermal expansion of the polyethylene dielectric is 1,500-3,000×10$^{-7}$/° C. Follow from Eq. 23 and the above parameters, $$\frac{\sqrt{\mu\varepsilon(-2.6° \ C.)} \times l(-2.6° \ C.) \times \sqrt{1 + \tau\left(\frac{R(-2.6° \ C.)}{L(-2.6° \ C.)}\right)}}{\sqrt{\mu\varepsilon(21.5° \ C.)} \times l(21.5° \ C.) \times \sqrt{1 + \tau\left(\frac{L(21.5° \ C.)}{R(21.5° \ C.)}\right)}} = \quad \text{Eq. 24}$$

$$\frac{\sqrt{\mu\varepsilon(-2.6° \ C.)}}{\sqrt{\mu\varepsilon(21.5° \ C.)}} \times 0.9995920 \times 1.000498$$

The measurement signal delay ratio is $$\frac{\text{Signal\_Delay@} -2.6° \ C.}{\text{Signal\_Delay@} -21.5° \ C.} = \frac{946.214}{945.842}$$

Thus, $$\frac{\sqrt{\mu\varepsilon(-2.6° \ C.)}}{\sqrt{\mu\varepsilon(21.5° \ C.)}} \times 1.000090 = \frac{946.214(n\text{sec})}{945.842(n\text{sec})}$$

which equates to $$\frac{\varepsilon(-2.6° \ C.)}{\varepsilon(21.5° \ C.)} = \left(\frac{1}{1.000090} \times \frac{946.214(n\text{sec})}{945.842(n\text{sec})}\right)^2 = 1.0006 \quad \text{Eq. 25}$$

indicating the increasing the dielectric constant when the cable is cooled.

As the above equations show, if the cable length is accurately known at a given temperature (e.g. room temperature), and the nominal dimensions of the cable as well as the metal and dielectric coefficients of expansion are also known, then the relation between SD signal cable delay and cable temperature may be used to estimate the cable dielectric constant at various temperatures.

3. Non-Negligible Dielectric Loss

In general cases, signals with higher signal frequency and dielectric loss in the cable are non-negligible. As such, when all four of the principal transmission line parameters are dependant on frequency as well as temperature, T, then the SD signal propagation velocity becomes $$v_{SD} = \frac{\alpha}{\sqrt{\overline{L}(\alpha, T)\overline{C}(\alpha, T)\alpha^2 + (\overline{G}(\alpha, T)\overline{L}(\alpha, T) + \overline{R}(\alpha, T)\overline{C}(\alpha, T))\alpha + \overline{R}(\alpha, T)\overline{G}(\alpha, T)}} \quad \text{Eq. 26}$$

where $\overline{L}(s,T)$, $\overline{C}(s,T)$, $\overline{R}(s,T)$, and $\overline{G}(s,T)$ are the Laplace transforms of the four line parameters. The cable delay per unit length, $\delta_{SD}$ is equal to $1/v_{SD}$, indicating the SD signal delay dependence on temperature is $$\delta_{SD} = \left(\frac{1}{\alpha}\right) \cdot \sqrt{\overline{L}(\alpha, T)\overline{C}(\alpha, T)\alpha^2 + (\overline{G}(\alpha, T)\overline{L}(\alpha, T) + \overline{R}(\alpha, T)\overline{C}(\alpha, T))\alpha + \overline{R}(\alpha, T)\overline{G}(\alpha, T)} \quad \text{Eq. 27}$$

Metal cable temperature measuring instruments that analyze reflected electrical signal delay in a cable to estimate the temperature profile along the length of the cable are feasible.

4. Thermometer

In one embodiment, an apparatus may be used to measure the temperature of the media. Referring to FIG. 54, a time domain reflectometer (TDR) 1000 includes a signal generator 1001 and a processor 1002 coupled to the signal generator 1001. It is noted that signal generator 1001 and processor 1002 may be separate and distinct components. Alternatively, signal generator 1001 and processor 1002 may be an integral unit. The signal generator may generate a exponential waveform, such as a SD signal, and may transmit the signal on a media (e.g., an interconnect, metal wire cable, etc.). The processor 1002 may determine the delay as described in Eq. 22 of the generated waveform over a length of the media. Based on the delay of the signal, the processor may be configure to determine the temperature of the media.

It is noted in the above examples that the delay is inversely proportional to the temperature. However, it will be apparent to those skilled in the art that depending on the characteristics of the media, for example the dielectric constants, the delay may be proportional to the temperature.

Example 12

Designing on Chip Interconnects with Reduced Delay

The delay of interconnects on high performance chips have been estimated from lossy transmission line theory using an approximation which is based on a distributed RC model of the transmission line which, until recently, have neglected inductive effects. New methods[14] now employ an RLC transmission line approximation for interconnects because inductive affects can no longer be neglected in integrated circuits designed to operate with high speed clocks (e.g., gigahertz clocks). Using the SD signal in these interconnects permits the employment of either the RC or RLC line models within the same theoretical framework for accurately analyzing circuit delay. For example, the RLC transmission model using the telegrapher's equation as described in Eq. 1 of Example 9 can be obtained by setting G to 0 which yields:

$$LC\frac{\partial^2 v}{\partial t^2} + RC\frac{\partial v}{\partial t} = \frac{\partial^2 v}{\partial x^2} \quad \text{Eq. 28}$$

The SD signal delay per unit interconnect length, ($\delta_{SD}$=1/velocity, $\tau$=1/$\alpha$), is $$\delta_{SD} = \sqrt{LC}\sqrt{1+\tau/(L/R)} \quad \text{Eq. 29.}$$

Note that if the SD signal waveform parameter $\tau$ equals (L/R), then the signal delay/unit distance traveled is $\sqrt{2}$ larger than $\sqrt{LC}$ (the minimum delay/unit length of the ideal no loss line). And if $\tau$ is reduced to approximately (0.1)(L/R), then the SD signal delay/unit length is also reduced becoming only about 5% smaller than $\sqrt{LC}$.

Reducing $\tau$ to obtain smaller line delay with the SD signal, is also accompanied by an increase in the propagation attenuation vs. travel length of the truncated SD signal. However, the attenuation of this truncated signal on an RLC line at length l is bounded, being no worse than a limiting maximum value of $$e^{-(\frac{R}{2}\sqrt{C/L})l}$$

as $\tau \to 0$.

1. SD Repeater Insertion

Repeater insertion is generally required in long lossy on chip interconnect lines[15] because of signal attenuation. As such, SD repeater insertion methods can be employed in long lines to reduce interconnect delay while maintaining signal amplitude constraints for adequate input signal integrity at the repeaters. In one embodiment, repeaters having a SD waveform output can be implemented in CMOS where the high speed latched comparator circuits in CMOS contain a middle stage (unstable feedback loop) that can produce the positive exponential waveform[16][17].

A repeater insertion design for a 1 cm line using line parameters R=40.74 Ohm/mm, L=1.52 nH/mm, and C=228.5 fF/mm, and considering a target clock frequency of 10 GHz for a 0.07 μm CMOS technology is demonstrated. First, a cadence simulation of a 0.18 μm CMOS process technology of a re-settable latch with inverters as output buffers was performed and yielded a SD signal output with $\tau$=60 ps. For the 0.07 μm CMOS technology, the estimated SD signal is scaled such that $\tau$ is approximately 23 ps. For a 10 GHz clock, $\tau$ can be assumed to be reduced by a factor 10 ($\tau$ is approximately 3 ps). FIG. 57 shows the line delay versus $\tau$. For $\tau$=3 ps, the results in a line delay/unit length is approximately 19.4 ps/mm. FIG. 58 illustrates the truncated SD signal attenuation as a function of line length.

Choosing a maximum allowed attenuation of approximately 0.7 for each line segment length allows a maximum of 1.46 mm per segment. Assuming six segments over the total 10 mm length (the total 10 mm wire delay, excluding the repeater delays is 10×19.4 ps/mm=194 ps/mm), and a repeater delay, $T_R$, of 3$\tau$ to 6$\tau$. In this example, the repeater delay is approximately 10 ps which yields a total delay of the segmented line equal to 264 ps ((7×10 ps)+194 ps). This is approximately three clock periods for a 10 GHz clock. The minimum delay of an un-segmented (no repeaters) ideal no loss line of 10 mm length (10 mm×18.6 ps/mm) is 186 ps or approximately two clock periods at 10 GHz. The ratio (%) of the no loss 10 mm line delay (186 ps) to the total delay of SD repeater solution for the lossy 10 mm line (264 ps) is 70%.

By using the SD repeater insertion, any performance limiting interconnect delay larger than $l\sqrt{LC}$ over long paths of length l can be reduced by making the repeater delay and parameter $\tau$ of the SD repeater output signal smaller.

Example 13

Encoding Propagation Properties into the Signal Waveforms

As noted above, the SD waveform and accompanying propagation properties can be incorporated into the signal waveforms of digital and communication systems. In communication systems, the coding modalities unique to the SD waveform can be utilized that complement current communication waveform coding techniques. For example, since the SD waveform does not change shape during propagation in dispersive and lossy media, the SD shape parameter α (exponential coefficient) maybe varied from one transmitted SD pulse to another with the pattern of change in α detected at the receiver. In this manner, the value of α may be coded to convey information transmission in the channel.

Additionally, the process of encoding also allows multiple distinct values of α to be simultaneously incorporated into SD portions of the leading edge of a pulse. An example is illustrated in the figures that follow. FIG. 59 shows a graphical user interface that demonstrates an input pulse with two distinct shapes of SD signals comprising the leading edge of the pulse. The lower voltage range consists of an SD signal with a shape parameter $\alpha_1$ which has a value of 2×10$^7$ (1/sec) and the higher voltage range of the leading edge consists of a second SD waveform shape with $\alpha_2$ which has a value of 3×10$^7$ (1/sec). These distinct values are incorporated in the leading edge of the pulse and are preserved during the propagation in a 600 ft in a RG 58/U coaxial cable. FIG. 60 illustrates the preservation of the first SD signal section of the pulse with shape parameter $\alpha_1$ with the input pulse on the left of the figure and the reflected pulse after traveling 600 ft on the right. FIG. 61 illustrates the natural log of the voltage amplitudes of these input and reflected signals with slopes of both consistent with $\alpha_1$. FIG. 62 illustrates the output of ratio of filters used on the signal of FIG. 60. and FIG. 63A illustrate the shape preservation of the second SD signal portion of the leading edge with $\alpha_2$, where FIG. 63B illustrate natural log of the voltage amplitudes of these input and reflected signals with slopes of both consistent with $\alpha_2$. FIG. 63C illustrates the output of ratio of filters used on the signal of FIG. 63A. FIG. 64 shows a graphical user interface that demonstrates a pulse with these two sections of SD signals interchanged with $\alpha_1$ for the first section and $\alpha_2$ for the second section. FIG. 65 shows the preservation of the shapes for the $\alpha_1$ with the input pulse on the left of the figure and the reflected pulse after traveling 600 ft on the right. FIG. 66 illustrates the natural log of the voltage amplitudes of these input and reflected signals with slopes of both consistent with α1. FIG. 67 illustrates the output of ratio of filters used on the signal of FIG. 65. Similarly, FIGS. 68A, 68B, and 68C show the preservation of the shapes for the $\alpha_2$ with the input pulse on the left of the figure and the reflected pulse after traveling 600 ft on the right.

These two pulses with composite SD shapes in their leading edge, together with two pulses with distinct single SD shapes corresponding to either $\alpha_1$ or $\alpha_2$ in their leading edge, together provide a modulation scheme capable of conveying two bits information in the channel. The standard pulse amplitude modulation process may be combined with this modulation of SD shapes creating a composite modulation technique to enhance data rate by two bits per symbol period with essentially no increase in bandwidth of the transmitted symbols. The values of α in the SD sections of these pulses may be detected (e.g., decoded) as discussed in Example 7.

Example 14

Bias Adjustments to Decrease the Standard Deviation of Signal Delay Measurement

The leading edge of a SD signal, in particular, a truncated SD signal, that is transmitted on a media has an exponential shape. However, the transmission of this signal may have a slow transient condition. The transient condition may be a bias resulting from a long, slow, decaying tail. This bias may be added to the exponential waveform, and thus may skew the waveform. This example demonstrates an algorithm for removing the bias.

1. Algorithm A: Compensation Algorithm for a Known or an Unknown α Value of Applied Signal Referring to FIG. 69, a measured waveform before any bias is shown. The received 10,000 discrete data, from 0 nsec to 2,00 nsec will first be separated into two categories: applied signal including the first 3,500 discrete data from 0 nsec to 700 nsec and reflected signal including the remaining data from 700 nsec to 2,000 nsec, as shown in FIG. 69. The SD threshold overlap region is defined as the signal voltage threshold range between 25% and 75% of the peak voltage of the reflected signal. The slope of the natural log of the applied signal and the reflected signal in the overlap region needs to be adjusted to match the α value for the applied signal, which is $2 \times 10^7$ 1/sec, as shown in FIG. 70.

A. Compensation Algorithm for a Known α Value of Applied Signal

Referring to FIG. 71A, the signal shown in the solid line represents a measured exponential waveform with an added unknown positive bias, +B. For this example, +B is approximately +0.05 V. It is noted that the bias voltage may be higher. Alternatively, the bias voltage may be lower. The signal shown in the dotted line is the measured exponential waveform with bias B removed. In FIG. 71B, the natural log of the measured exponential waveform with bias is shown in the solid line and the natural log of the exponential waveform without bias +B is shown with the dotted line. As seen in FIG. 71B, the estimated slope of the natural log plot of the measured signal with positive bias +B in the overlap region (solid line) will be smaller than α. On the other hand, the estimated slope of the natural log plot, in the overlap region of the measured signal with the bias +B removed (dotted line) will have a slope substantially equal to α ($2 \times 10^7$(1/sec)).

Referring to FIG. 72A, the signal shown in the solid line is a measured exponential waveform with an added unknown negative bias, −B. For this example, −B is approximately −0.05 V. It is noted that the bias voltage may be higher. Alternatively, the bias voltage may be lower. The signal shown with a dotted line is the exponential signal without negative bias −B. In FIG. 72B, the natural log of the exponential waveform with negative bias −B is shown in the solid line and the natural log of the exponential waveform without bias −B is shown with the dotted line. It represents that the slope of the natural log plot of the measured signal with negative bias −B in the overlap region (solid line) will be greater than α. Therefore, after removing the negative bias −B, the natural log plot in the overlap region, of the measured signal will have a slope substantially equal to α.

As stated above, the unknown bias must be removed in order to obtain accurate threshold time of flight, TOF, values. In one embodiment, the unknown bias B can reflected in the slope of the natural log plot of the exponential waveform plus bias in the SD threshold overlap region. As such, the unknown bias can be estimated and removed. In this bias removal, the error tolerance of residual bias of both the applied and reflected signals is chosen to be 1 μV.

i. Applied Signal

In this experiment, the applied signal is be a pulled-down signal with a voltage value such that the measured signal graph becomes that of an exponential waveform with an unknown negative bias. In one embodiment, the voltage of the applied signal may be approximately 0.01 V. First, the graph is lifted gradually with an added incremental voltage value which is initially chosen to be +0.001 volts at the beginning (0.01/10 volts) and is incremented until the slope of natural log of the signal versus the time is lower than the known α value of the applied signal. Next, the process is continued by adding one incremental negative bias voltage level (−0.001V). Then the previous process of incrementally adding positive voltage level (+0.001/10 volts) +0.0001 V is performed until the natural log plot has a positive bias again as indicated by the slope of the log plot of the SD threshold region being less than α. At this point, the waveform becomes an exponential with a positive additive voltage bias. The previous process is again repeated by subtracting +0.0001 V from the waveform resulting a negative bias again. The positive incremental bias level 0.00001 V is added to the signal repeating the process describe above. Then the whole process repeated one more time with a new incremental voltage level, e.g., 1 μV (+0.00001/10 volts). At this point the bias adjustment process is concluded. This process is separately used to reduce the residual bias to less than 1 μV for both the applied and reflected signals. The natural log of both signals with the bias less than 1 μV versus time plot is shown in FIG. 70. The total shifted voltage of applied and reflected signal is named as $Bias_1$ and $Bias_2$, respectively and is illustrated in FIG. 73.

Once the biases of both signals have been reduced, the final results obtained in this manner will be used to calculate the constant threshold TOF values in each of a series of incremental threshold voltages.

B. Compensation for Unknown α Value of Applied Signal

Referring to FIGS. 74A and 74B and FIGS. 75A and 75B, the SD threshold overlap region of a measured applied signal or a signal is separated into a SD threshold lower overlap region and a SD threshold higher overlap region, in which the average threshold voltage level determining the border between higher and lower overlap region. In FIG. 74A, the signal represented by the solid line is an exponential waveform with an added positive bias +B. In this example, the positive bias +B is 0.05 V. The signal represented by the dotted line is an exponential waveform without any bias. The natural log of the exponential waveform with bias (solid line) and the natural log of the exponential waveform without bias (dotted line) are shown in FIG. 74B. The slope in the SD threshold lower region is approximately $1.62 \times 10^7$ (1/sec) where the slope in the SD threshold higher region is approximately $1.77 \times 10^7$ (1/sec). These values show that the slope of natural log plot is increased from the SD threshold lower region to the SD threshold higher region when the unknown bias is positive. Similarly, referring to FIG. 75A, the signal shown in solid line is the exponential waveform with an added negative bias −B. In this example, −B is a −0.05 volts. The signal shown in dotted line is the exponential waveform without bias. As shown in FIG. 75B, the natural log of the exponential waveform without the bias −B is shown in a dotted line and the natural log of the exponential waveform without the bias −B is shown in solid line. The slope of the SD threshold lower region and the slope of the SD threshold higher region are estimated as $2.61 \times 10^7$ (1/sec) and $2.32 \times 10^7$ (1/sec), respectively. As a result, decreasing the slope of natural log plot from the lower region to higher region implies the bias is negative. Therefore, from the correlation of bias and the difference of slope in two regions (i.e., the SD threshold higher region and SD threshold lower region), the bias can be estimated and removed.

2. Algorithm B: Compensating Algorithm Using the Difference Between the Adjusted Applied Signal and the Reflected Signal For the algorithm described above (e.g., algorithm for a known or an unknown α value of applied signal), adjusts both the applied and the reflected signals, which are termed as Bias1 and Bias2, respectively. A calibration program can be applied to a series of measured constant threshold TOF values for both Bias1 and Bias2 on the same length of the media, as shown in FIG. 73. The variation patterns of Bias1 and Bias2 are observed to be similar. Interestingly enough, further comparison of Bias1 and Bias2 reveals that another similarity exists between measured constant threshold TDR TOF measurements and the difference between $Bias_1$ and $Bias_2$, which is shown in FIG. 74A. This phenomenon implies that the difference of bias ($\Delta Bias=Bias1-Bias2$), illustrated in FIG. 74B correlates with the measured constant threshold TDR TOF measurements in FIG. 74A.

In this example, the standard deviation of measured constant threshold TDR TOF values can be drastically reduced. For example, let $\overline{\Delta B}$ ($\overline{\Delta B}=\overline{Bias1}-\overline{Bias2}$) denote the difference of the means of Bias1 and Bias2, where Bias1 and Bias2 can be determined from the measured applied wave and the reflected wave, respectively using the algorithm for a known or an unknown $\alpha$ value of applied signal described above. $\overline{\Delta B}$ can be generated from calibration program used to partially adjust the bias for the reflected signal. For this example, $\overline{\Delta B}$ is found to be approximately 0.00591 V. This algorithm described herein as the "B algorithm", uses the bias of applied signal, Pbias1, calculated by using the algorithm described above, described herein as the "A algorithm" (i.e., algorithm for a known or an unknown $\alpha$ value of applied signal). The bias of reflected signal, PBias2, is $\overline{\Delta B}$ subtracted from PBias1 (PBias2=Pbias1-$\overline{\Delta B}$). Next, PBias1 and PBias2 will be added to the applied and reflected signal waveform respectively to yield the bias compensated waveforms. Accordingly, the time values corresponding to 100 individual voltages threshold voltage crossing times in the threshold overlap region are calculated and averaged. The mean value of these 100 threshold crossing TOF in reaching 100 threshold voltages is regarded as the TOF value in this measurement. By so doing, the new results of 60 measured constant threshold TDR TOF measurements are shown in FIG. 75, and associated histogram is shown in FIG. 76. As seen in FIG. 75, the range of new measured constant threshold TDR TOF measurements is approximately 45 nsec, and the standard deviation of measured constant threshold TDR TOF is approximately 9.7 psec.

Comparison of the measured constant threshold TDR TOF values and histograms of employing the A algorithm and the B algorithm (FIGS. 75 and 76) shows that the range of measured constant threshold TDR TOF in 60 measurements is obviously reduced from 131 psec to 45 psec. Also the standard deviation of measured constant threshold TDR TOF is reduced from 22.7 psec to 9.7 psec. Moreover, all measured constant threshold TDR TOF measurements obtained from the B algorithm bias adjustment are lying within the range obtained from A algorithm. As such, the B algorithm has more accurate measured constant threshold TDR TOF estimates with less than approximately half of the standard deviations compare with the A algorithm.

* * *

All of the methods and apparatuses disclosed and claimed can be made and executed without undue experimentation in light of the present disclosure. While the apparatus and methods of this invention have been described in terms of embodiments, it will be apparent to those of skill in the art that variations may be applied to the methods and in the steps or in the sequence of steps of the method described without departing from the concept, spirit and scope of the invention. In addition, modifications may be made to the disclosed apparatus and components may be eliminated or substituted for the components described where the same or similar results would be achieved. All such similar substitutes and modifications apparent to those skilled in the art are deemed to be within the spirit, scope and concept of the invention as defined by the appended claims.

The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically. The term approximately, as used herein, is defined as at least close to a given value (e.g., preferably within 10% of, more preferably within 1% of, and most preferably within 0.1% of). The term substantially, as used herein, is defined as at least approaching a given state (e.g., preferably within 10% of, more preferably within 1% of, and most preferably within 0.1% of). The term means, as used herein, is defined as hardware, firmware and/or software for achieving a result. The term program or phrase computer program, as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

The appended claims are not to be interpreted as including means-plus-function limitations, unless such a limitation is explicitly recited in a given claim using the phrase(s) "means for" and/or "step for". Subgeneric embodiments of the invention are delineated by the appended independent claims and their equivalents. Specific embodiments of the invention are differentiated by the appended dependent claims and their equivalents.

REFERENCES

[1] Gruodis and Chang, *IBM J. Res. Develop.*, 25:25-41, 1981.
[2] Sauter, In: *Nonlinear Optics*, John Wiley & Sons Inc., NY, 127, 1996.
[3] Agrawal, In: *Nonlinear Fiber Optics*, Academic Press, Sand Diego, $3^{rd}$ Ed., 127, 2001.
[4] Jackson, In: *Fourier Series and Orthogonal Polynomials*, George Banta Co., Inc., Menasha, 156-157, 1957.
[5] Szabo and Ostlund, In: *Modern Quantum Chemistry*, Dover Pub. Inc., Mineola, 142-145, 1989.
[6] Proakis, In: *Digital Communications*, WCB McGraw-Hill, $3^{rd}$ Ed., Boston, 167-173, 1995.
[7] T1.417-2001 American National Standard-Spectrum Management for Loop Transmission Systems, Annex B: Loop Information, p. 84.
[8] Deutsch et. al., *IBM J. Res. Develop.*, 34(4), 605, 1990.
[9] Wheeler and Crummett, *Am. J. Phys.*, 55(1):33-37, 1987.
[10] Sommerfeld, In: *Mechanics of Deformable Bodies Lectures on Theoretical Physics*, Academic Press, Inc., NY, Vol. II: 96-98, 1950.
[11] Weber, In: *Linear Transcient Analysis*, Wiley, NY, Vol. II: 273, 1954.
[12] Flake and Bishop, In: *Signal Propagation without Distortion in Dispersive Lossy Media*, $11^{th}$ IEEE Intl. Conf. Electronics, Circuits and System Proceed., Israel, 2004.
[13] Kalluri, In: *Electromagnetics of Complex Media*, CRC Press, 1998.
[14] Ismail and Friedman, *IEEE Trans. Circuits Syst. II*, 48:471-481, 2001.

[15] Davidson et al., *IEEE Trans. Comp. Packag. Manufact. Technol.*, 20(4), 1997.
[16] Razavi and Wooley, *IEEE J. Solid-state Circuits*, 27:1916-1992, 1992.
[17] Johns and Martin, In: *Analog Integrated Circuit Design*, Wiley & Sons, Inc., NY, 317-326, 1997.

What is claimed is:

1. A method comprising:
transmitting an input waveform into a lossy transmission medium;
capturing the input waveform that is transmitted into the lossy transmission medium;
capturing an output waveform from the lossy transmission medium, wherein the output waveform is produced from the lossy transmission medium in response to said transmitting the input waveform into the lossy transmission medium;
determining a transfer function for the lossy transmission medium based on the captured input waveform and the captured output waveform, wherein the transfer function characterizes a linear-system model for an input-output relationship between the captured input waveform and the captured output waveform;
computing a simulated response signal from the linear-system model using the transfer function and a simulated input signal, wherein the simulated input signal includes a positive exponential waveform in its leading edge, wherein the positive exponential waveform conforms to the expression A+D*exp($\alpha$t), where A is a real constant, where D is a real constant, where $\alpha$ is a positive real constant, where t is time, wherein at least a portion of the same positive exponential waveform occurs within a leading edge of the simulated response signal, wherein the frequency bandwidth of the input waveform is larger than the frequency bandwidth of the simulated input signal;
determining a time delay between the simulated input signal and the simulated response signal.

2. The method of claim 1, further comprising:
computing a distance value using the time delay and a propagation velocity v.

3. The method of claim 2, wherein the propagation velocity v is related to $\alpha$ and one or more parameters of the lossy transmission medium in accordance with any one of the following equations:

a) $v = \sqrt{\dfrac{\alpha}{\overline{R}(\alpha)\overline{C}(\alpha)}}$, b) $v = \sqrt{\alpha k}$, c) $v = \sqrt{\dfrac{\alpha}{\overline{R}(\alpha)C(\alpha) + (\overline{L}(\alpha)\overline{C}(\alpha))\alpha}}$, d) $v = \dfrac{1}{\sqrt{(\overline{L}(\alpha)\overline{C}(\alpha)) + (\overline{L}(\alpha)\overline{G}(\alpha))\left(\dfrac{1}{\alpha}\right)}}$, e) $v = \dfrac{1}{\sqrt{(\mu\varepsilon) + (\mu\sigma)\left(\dfrac{1}{\alpha}\right)}}$, f) $v = \dfrac{\alpha}{\sqrt{LC\alpha^2 + (RC + LG)\alpha + RG}}$, g) $v = \dfrac{1}{\sqrt{(\overline{L}(\alpha)\overline{C}(\alpha)) + (\overline{L}(\alpha)\overline{G}(\alpha) + \overline{R}(\alpha)\overline{C}(\alpha))\left(\dfrac{1}{\alpha}\right) + \overline{R}(\alpha)\overline{G}(\alpha)\left(\dfrac{1}{\alpha}\right)^2}}$, h) $v = \sqrt{c^2 + (R_{EV}/\rho_0)\alpha}$, i) $v = \sqrt{\dfrac{\tau c_\infty^2 \alpha + c_0^2}{\tau\alpha + 1}}$, j) $v = \dfrac{\alpha}{\sqrt{\dfrac{\alpha}{\kappa} + \dfrac{G(\alpha)}{KA}}}$;

where
c represents velocity of propagation without viscosity,
k represents diffusivity,
A represents cross-sectional area,
C represents capacitance per unit length of the lossy transmission medium,
$\overline{C}(s)$ represents frequency-dependent capacitance per unit length, s is a complex variable;
G represents conductance per unit length of the lossy transmission medium,
$\overline{G}(s)$ represents frequency-dependent conductance per unit length of the lossy transmission medium,
G(s) represents a Laplace transform of an approximate Green's function of thermal conduction,
K represents thermal conductivity,
L represents inductance per unit length,
$\overline{L}(s)$ represents frequency-dependent inductance per unit length,
R represents resistance per unit length,
$\overline{R}(s)$ represents frequency-dependent resistance per unit length,
$R_{EV}$ represents effective viscosity,
$\mu$ represents electrical permeability,
$\epsilon$ represents electrical permittivity,
$\kappa$ represents thermal diffusivity,
$\sigma$ represents electrical conductivity,
$\rho_0$ represents equilibrium density,
$c_\infty$ and $c_0$ represent speeds of sound at infinite frequency and zero frequency, respectively, and
$\tau$ represents a relaxation time.

4. The method of claim 1, wherein said determining the time delay includes:
computing a time $t_1$ when the leading edge of the simulated input signal crosses a threshold signal level;
computing a time $t_2$ when the leading edge of the simulated response signal crosses the same threshold signal level; and
computing the time delay by computing a difference between $t_2$ and $t_1$.

5. The method of claim 1, wherein said determining the time delay includes:
a) computing a time $t_1$ when the leading edge of the simulated input signal crosses a threshold signal level;
b) computing a time $t_2$ when the leading edge of the simulated response signal crosses the same threshold signal level; and
c) computing a time difference between $t_2$ and $t_1$;
d) repeating a), b) and c) a plurality of times to obtain a corresponding plurality of time differences, wherein each of said repetitions uses a different value of the signal threshold level; and
e) computing the time delay by averaging a subset of the plurality of time differences.

6. The method of claim 5, further comprising:
determining a range of the signal threshold level over which the time differences are relatively constant, wherein said subset of the plurality of times differences are the time differences corresponding to signal threshold level values within said range.

7. The method of claim 1, wherein the input waveform is captured from a first location of the lossy transmission medium, wherein the output waveform is also captured from the first location of the lossy transmission medium, wherein the output waveform is a reflected waveform due to an impedance discontinuity in the lossy transmission medium.

8. The method of claim 7, further comprising:
determining a distance within the lossy transmission medium between the first location and the impedance discontinuity based on the time delay and a constant propagation velocity.

9. The method of claim 8, wherein the lossy transmission medium is a cable, wherein the first location is at an end of the cable.

10. The method of claim 1, wherein the input waveform is captured from a first location of the lossy transmission medium, wherein the output waveform is captured from a second location of the lossy transmission medium.

11. The method of claim 10, further comprising:
determining a distance within the lossy transmission medium between the first location and the second location based on the time delay and a constant propagation velocity.

12. The method of claim 11, wherein the lossy transmission medium is a cable, wherein the first location is at a first end of the cable, wherein the second location is at a second end of the cable, wherein the first and second ends are opposite ends of the cable.

13. The method of claim 1, wherein the lossy transmission medium is an electrical cable or a fiber optic cable.

14. The method of claim 1, further comprising:
determining a temperature of the lossy transmission medium based on the time delay.

15. The method of claim 14, wherein the lossy transmission medium is an electrical cable.

16. The method of claim 1, further comprising:
prior to said determining the transfer function, removing bias from the captured input waveform and/or removing a bias from the captured output waveform.

17. The method of claim 1, wherein the real constant A equals zero.

18. A system comprising:
a signal generator configured to generate an input waveform for stimulating a lossy transmission medium; and
a receiver configured to:
capture the input waveform that stimulates the lossy transmission medium;
capture an output waveform from the lossy transmission medium, wherein the output waveform is produced from the lossy transmission medium in response to stimulating the lossy transmission medium with the input waveform;
determine a transfer function for the lossy transmission medium based on the captured input waveform and the captured output waveform, wherein the transfer function characterizes a linear-system model for an input-output relationship between the captured input waveform and the captured output waveform;
compute a simulated response signal from the linear-system model using the transfer function and a simulated input signal, wherein the simulated input signal includes a positive exponential waveform in its leading edge, wherein the positive exponential waveform conforms to the expression $A+D*\exp(\alpha t)$, where A is a real constant, where D is a real constant, where $\alpha$ is a positive real constant, where t is time, wherein at least a portion of the same positive exponential waveform occurs within a leading edge of the simulated response signal, wherein the frequency bandwidth of the input waveform is larger than the frequency bandwidth of the simulated input signal; and
determine a time delay between the simulated input signal and the simulated response signal.

19. The system of claim 18, wherein the receiver is further configured to:
compute a distance value using the time delay and a propagation velocity v.

20. The system of claim 19, wherein the propagation velocity v is related to $\alpha$ and one or more parameters of the lossy transmission medium in accordance with any one of the following equations:

a) $v = \sqrt{\dfrac{\alpha}{\overline{R}(\alpha)\overline{C}(\alpha)}}$, b) $v = \sqrt{\alpha k}$, c) $v = \sqrt{\dfrac{\alpha}{\overline{R}(\alpha)C(\alpha) + (\overline{L}(\alpha)\overline{C}(\alpha))\alpha}}$, d) $v = \dfrac{1}{\sqrt{(\overline{L}(\alpha)\overline{C}(\alpha)) + (\overline{L}(\alpha)\overline{G}(\alpha))\left(\dfrac{1}{\alpha}\right)}}$, e) $v = \dfrac{1}{\sqrt{(\mu\varepsilon) + (\mu\sigma)\left(\dfrac{1}{\alpha}\right)}}$, f) $v = \dfrac{\alpha}{\sqrt{LC\alpha^2 + (RC+LG)\alpha + RG}}$, g) $v = \dfrac{1}{\sqrt{(\overline{L}(\alpha)\overline{C}(\alpha)) + (\overline{L}(\alpha)\overline{G}(\alpha) + \overline{R}(\alpha)\overline{C}(\alpha))\left(\dfrac{1}{\alpha}\right) + \overline{R}(\alpha)\overline{G}(\alpha)\left(\dfrac{1}{\alpha}\right)^2}}$, h) $v = \sqrt{c^2 + (R_{EV}/\rho_0)\alpha}$, i) $v = \sqrt{\dfrac{\tau c_\infty^2 \alpha + c_0^2}{\tau\alpha + 1}}$, j) $v = \dfrac{\alpha}{\sqrt{\dfrac{\alpha}{\kappa} + \dfrac{G(\alpha)}{KA}}}$;

where
c represents velocity of propagation without viscosity,
k represents diffusivity,
A represents cross-sectional area,
C represents capacitance per unit length of the lossy transmission medium,
$\overline{C}(s)$ represents frequency-dependent capacitance per unit length,
s is a complex variable;
G represents conductance per unit length of the lossy transmission medium,
$\overline{G}(s)$ represents frequency-dependent conductance per unit length of the lossy transmission medium,
G(s) represents a Laplace transform of an approximate Green's function of thermal conduction,
K represents thermal conductivity, L represents inductance per unit length,
L̄(s) represents frequency-dependent inductance per unit length,
R represents resistance per unit length,
R̄(s) represents frequency-dependent resistance per unit length,
$R_{EV}$ represents effective viscosity,
μ represents electrical permeability,
ε represents electrical permittivity,
κ represents thermal diffusivity,
σ represents electrical conductivity,
$\rho_0$ represents equilibrium density,
$c_\infty$ and $c_0$ represent speeds of sound at infinite frequency and zero frequency,
respectively, and
τ represents a relaxation time.

21. The system of claim 18, wherein said determining the time delay includes:
computing a time $t_1$ when the leading edge of the simulated input signal crosses a threshold signal level;
computing a time $t_2$ when the leading edge of the simulated response signal crosses the same threshold signal level; and
computing the time delay by computing a difference between $t_2$ and $t_1$.

22. The system of claim 18, wherein said determining the time delay includes:
a) computing a time $t_1$ when the leading edge of the simulated input signal crosses a threshold signal level;
b) computing a time $t_2$ when the leading edge of the simulated response signal crosses the same threshold signal level; and
c) computing a time difference between $t_2$ and $t_1$;
d) repeating a), b) and c) a plurality of times to obtain a corresponding plurality of time differences, wherein each of said repetitions uses a different value of the signal threshold level; and
e) computing the time delay by averaging a subset of the plurality of time differences.

23. The system of claim 18, wherein the input waveform is captured from a first location of the lossy transmission medium, wherein the output waveform is also captured from the first location of the lossy transmission medium, wherein the output waveform is a reflected waveform due to an impedance discontinuity in the lossy transmission medium.

24. The system of claim 23, wherein the receiver is also configured to:
determine a distance within the lossy transmission medium between the first location and the impedance discontinuity based on the time delay and a constant propagation velocity.

25. The system of claim 24, wherein the lossy transmission medium is a cable, wherein first location is at a first end of the cable.

26. The system of claim 18, wherein the input waveform is captured from a first location of the lossy transmission medium, wherein the output waveform is captured from a second location of the lossy transmission medium.

27. The system of claim 26, wherein the receiver is also configured to:
determine a distance within the lossy transmission medium between the first location and the second location based on the time delay and a constant propagation velocity.

28. The system of claim 27, wherein the lossy transmission medium is a cable, wherein the first location is at a first end of the cable, wherein the second location is at a second end of the cable, wherein the first and second ends are opposite ends of the cable.

29. A non-transitory computer-readable storage medium storing program instructions, wherein the program instructions, when executed by a computer system, cause the computer system to:
transmit an input waveform into a lossy transmission medium;
capture the input waveform that is transmitted into the lossy transmission medium;
capture an output waveform from the lossy transmission medium, wherein the output waveform is produced from the lossy transmission medium in response to said transmitting the input waveform into the lossy transmission medium;
determine a transfer function for the lossy transmission medium based on the captured input waveform and the captured output waveform, wherein the transfer function characterizes a linear-system model for an input-output relationship between the captured input waveform and the captured output waveform;
compute a simulated response signal from the linear-system model using the transfer function and a simulated input signal, wherein the simulated input signal includes a positive exponential waveform in its leading edge, wherein the positive exponential waveform conforms to the expression A+D*exp(αt), where A is a real constant, where D is a real constant, where α is a positive real constant, where t is time, wherein at least a portion of the same positive exponential waveform occurs within a leading edge of the simulated response signal, wherein the frequency bandwidth of the input waveform is larger than the frequency bandwidth of the simulated input signal;
determine a time delay between the simulated input signal and the simulated response signal.

30. The storage medium of claim 29, wherein the program instructions, when executed by the computer system, further cause the computer system to:
compute a distance value using the time delay and a propagation velocity v.

31. The storage medium of claim 30, wherein the propagation velocity v is related to α and one or more parameters of the lossy transmission medium in accordance with any one of the following equations:

a) $v = \sqrt{\dfrac{\alpha}{\overline{R}(\alpha)\overline{C}(\alpha)}}$, b) $v = \sqrt{\alpha k}$, c) $v = \sqrt{\dfrac{\alpha}{\overline{R}(\alpha)C(\alpha) + (\overline{L}(\alpha)\overline{C}(\alpha))\alpha}}$, d) $v = \dfrac{1}{\sqrt{(\overline{L}(\alpha)\overline{C}(\alpha)) + (\overline{L}(\alpha)\overline{G}(\alpha))\left(\dfrac{1}{\alpha}\right)}}$, e) $v = \dfrac{1}{\sqrt{(\mu\varepsilon) + (\mu\sigma)\left(\dfrac{1}{\alpha}\right)}}$, f) $v = \dfrac{\alpha}{\sqrt{LC\alpha^2 + (RC + LG)\alpha + RG}}$, -continued g) $v = \dfrac{1}{\sqrt{(\overline{L}(\alpha)\overline{C}(\alpha)) + (\overline{L}(\alpha)\overline{G}(\alpha) + \overline{R}(\alpha)\overline{C}(\alpha))\left(\dfrac{1}{\alpha}\right) + \overline{R}(\alpha)\overline{G}(\alpha)\left(\dfrac{1}{\alpha}\right)^2}}$, h) $v = \sqrt{c^2 + (R_{EV}/\rho_0)\alpha}$, i) $v = \sqrt{\dfrac{\tau c_\infty^2 \alpha + c_0^2}{\tau\alpha + 1}}$, j) $v = \dfrac{\alpha}{\sqrt{\dfrac{\alpha}{\kappa} + \dfrac{G(\alpha)}{KA}}}$;

where
- c represents velocity of propagation without viscosity,
- k represents diffusivity,
- A represents cross-sectional area,
- C represents capacitance per unit length of the lossy transmission medium,
- $\overline{C}(s)$ represents frequency-dependent capacitance per unit length,
- s is a complex variable;
- G represents conductance per unit length of the lossy transmission medium,
- $\overline{G}(s)$ represents frequency-dependent conductance per unit length of the lossy transmission medium,
- G(s) represents a Laplace transform of an approximate Green's function of thermal conduction,
- K represents thermal conductivity,
- L represents inductance per unit length,
- $\overline{L}(s)$ represents frequency-dependent inductance per unit length,
- R represents resistance per unit length,
- $\overline{R}(s)$ represents frequency-dependent resistance per unit length,
- $R_{EV}$ represents effective viscosity,
- µ represents electrical permeability,
- ε represents electrical permittivity,
- κ represents thermal diffusivity,
- σ represents electrical conductivity,
- $\rho_0$ represents equilibrium density,
- $c_\infty$ and $c_0$ represent speeds of sound at infinite frequency and zero frequency, respectively, and
- τ represents a relaxation time.

32. The storage medium of claim 29, wherein said determining the time delay includes:
computing a time $t_1$ when the leading edge of the simulated input signal crosses a threshold signal level;
computing a time $t_2$ when the leading edge of the simulated response signal crosses the same threshold signal level; and
computing the time delay by computing a difference between $t_2$ and $t_1$.

33. The storage medium of claim 29, wherein said determining the time delay includes:
a) computing a time $t_1$ when the leading edge of the simulated input signal crosses a threshold signal level;
b) computing a time $t_2$ when the leading edge of the simulated response signal crosses the same threshold signal level; and
c) computing a time difference between $t_2$ and $t_1$;
d) repeating a), b) and c) a plurality of times to obtain a corresponding plurality of time differences, wherein each of said repetitions uses a different value of the signal threshold level; and
e) computing the time delay by averaging a subset of the plurality of time differences.

34. The storage medium of claim 29, wherein the input waveform is captured from a first location of the lossy transmission medium, wherein the output waveform is also captured from the first location of the lossy transmission medium, wherein the output waveform is a reflected waveform due to an impedance discontinuity in the lossy transmission medium.

35. The storage medium of claim 34, wherein the program instructions, when executed by the computer system, cause the computer system to:
determine a distance within the lossy transmission medium between the first location and the impedance discontinuity based on the time delay and a constant propagation velocity.

36. The storage medium of claim 35, wherein the lossy transmission medium is a cable, wherein first location is at a first end of the cable.

37. The storage medium of claim 29, wherein the input waveform is captured from a first location of the lossy transmission medium, wherein the output waveform is captured from a second location of the lossy transmission medium.

38. The storage medium of claim 37, wherein the program instructions, when executed by the computer system, cause the computer system to:
determine a distance within the lossy transmission medium between the first location and the second location based on the time delay and a constant propagation velocity.

39. The storage medium of claim 38, wherein the lossy transmission medium is a cable, wherein the first location is at a first end of the cable, wherein the second location is at a second end of the cable, wherein the first and second ends are opposite ends of the cable.

* * * * *

UNITED STATES PATENT AND TRADEMARK OFFICE
CERTIFICATE OF CORRECTION

PATENT NO. : 8,093,911 B2  
APPLICATION NO. : 12/912392  
DATED : January 10, 2012  
INVENTOR(S) : Flake et al.

Page 1 of 1

It is certified that error appears in the above-identified patent and that said Letters Patent is hereby corrected as shown below:

In the Claims:

Claim 3, Column 45, Line 55, please delete " $c) \ V = \sqrt{\dfrac{\alpha}{\overline{R(\alpha)C(\alpha)} + \overline{(L(\alpha)\overline{C}(\alpha))\alpha}}}$ "

and substitute " $c) \ V = \sqrt{\dfrac{\alpha}{\overline{R(\alpha)\overline{C}(\alpha)} + \overline{(L(\alpha)\overline{C}(\alpha))\alpha}}}$ ".

Claim 80, Column 50, Line 55, please delete " $c) \ V = \sqrt{\dfrac{\alpha}{\overline{R(\alpha)C(\alpha)} + \overline{(L(\alpha)\overline{C}(\alpha))\alpha}}}$ "

and substitute " $c) \ V = \sqrt{\dfrac{\alpha}{\overline{R(\alpha)\overline{C}(\alpha)} + \overline{(L(\alpha)\overline{C}(\alpha))\alpha}}}$ ".

Signed and Sealed this  
Sixth Day of March, 2012

David J. Kappos  
*Director of the United States Patent and Trademark Office*